United States Patent
Hwang et al.

(10) Patent No.: US 12,300,873 B2
(45) Date of Patent: May 13, 2025

(54) ANTENNA MODULES EMPLOYING A PACKAGE SUBSTRATE WITH A VERTICALLY-INTEGRATED PATCH ANTENNA(S), AND RELATED FABRICATION METHODS

(71) Applicant: QUALCOMM Incorporated, San Diego, CA (US)

(72) Inventors: Suhyung Hwang, Rancho Mission Viejo, CA (US); Kun Fang, San Diego, CA (US); Jaehyun Yeon, San Diego, CA (US); Chin-Kwan Kim, San Diego, CA (US); Taesik Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 370 days.

(21) Appl. No.: 17/651,324

(22) Filed: Feb. 16, 2022

(65) Prior Publication Data
US 2023/0307817 A1    Sep. 28, 2023

(51) Int. Cl.
*H01Q 1/22* (2006.01)
*H01Q 9/04* (2006.01)
*H01Q 21/06* (2006.01)

(52) U.S. Cl.
CPC .......... *H01Q 1/2283* (2013.01); *H01Q 9/045* (2013.01); *H01Q 21/065* (2013.01)

(58) Field of Classification Search
CPC .... H01Q 1/2283; H01Q 9/045; H01Q 21/065; H01L 23/552; H01L 23/66
See application file for complete search history.

(56) References Cited

U.S. PATENT DOCUMENTS

| 10,347,990 B2 | 7/2019 | Zhang et al. |
| 10,424,633 B2 | 9/2019 | Pagani et al. |
| 2007/0080864 A1 | 4/2007 | Channabasappa |
| 2016/0043470 A1 | 2/2016 | Ko et al. |
| 2016/0211586 A1 | 7/2016 | Hong et al. |
| 2019/0288377 A1 | 9/2019 | Ying et al. |

(Continued)

OTHER PUBLICATIONS

International Search Report and Written Opinion for International Patent Application No. PCT/US2023/061800, mailed May 3, 2023, 17 pages.

*Primary Examiner* — Dieu Hien T Duong
(74) *Attorney, Agent, or Firm* — Withrow & Terranova, PLLC

(57) ABSTRACT

Antenna modules employing a package substrate with a vertically-integrated patch antenna(s), and related fabrication methods. The antenna module includes a radio-frequency (RF) IC (RFIC) package that includes one or more RFICs for supporting RF communications and a package substrate that includes one or more metallization layers with formed metal interconnects for routing of signals between the RFICs and an antenna(s) in the package substrate. The package substrate includes one or more patch antennas that are planar-shaped and vertically integrated in a plurality of metallization layers in the package substrate, behaving electromagnetically as a patch antenna. In this manner, the patch antenna(s) can be formed as a vertically-integrated structure in the package substrate with fabrication methods used for fabricating metal interconnects and vias (e.g., a micro via fabrication process) in package substrates.

33 Claims, 28 Drawing Sheets

(56) References Cited

U.S. PATENT DOCUMENTS

| | | |
|---|---|---|
| 2021/0036433 A1 | 2/2021 | Kim |
| 2021/0184335 A1 | 6/2021 | Wang et al. |
| 2021/0184340 A1 | 6/2021 | Stav et al. |
| 2021/0313695 A1 | 10/2021 | Zhao et al. |
| 2021/0376473 A1 | 12/2021 | Lee et al. |
| 2023/0139460 A1* | 5/2023 | Woo .................... H01Q 21/062 343/702 |

* cited by examiner

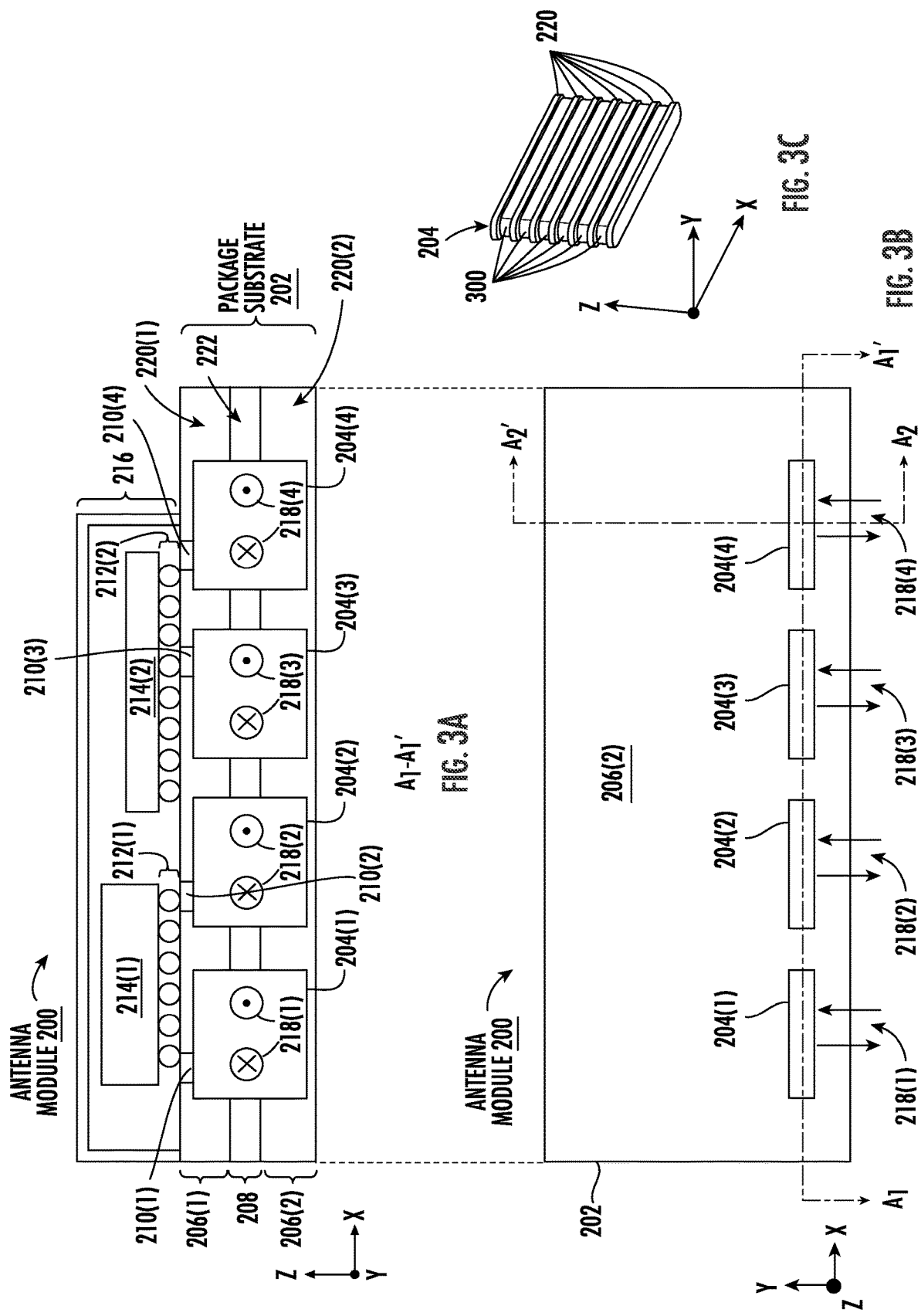

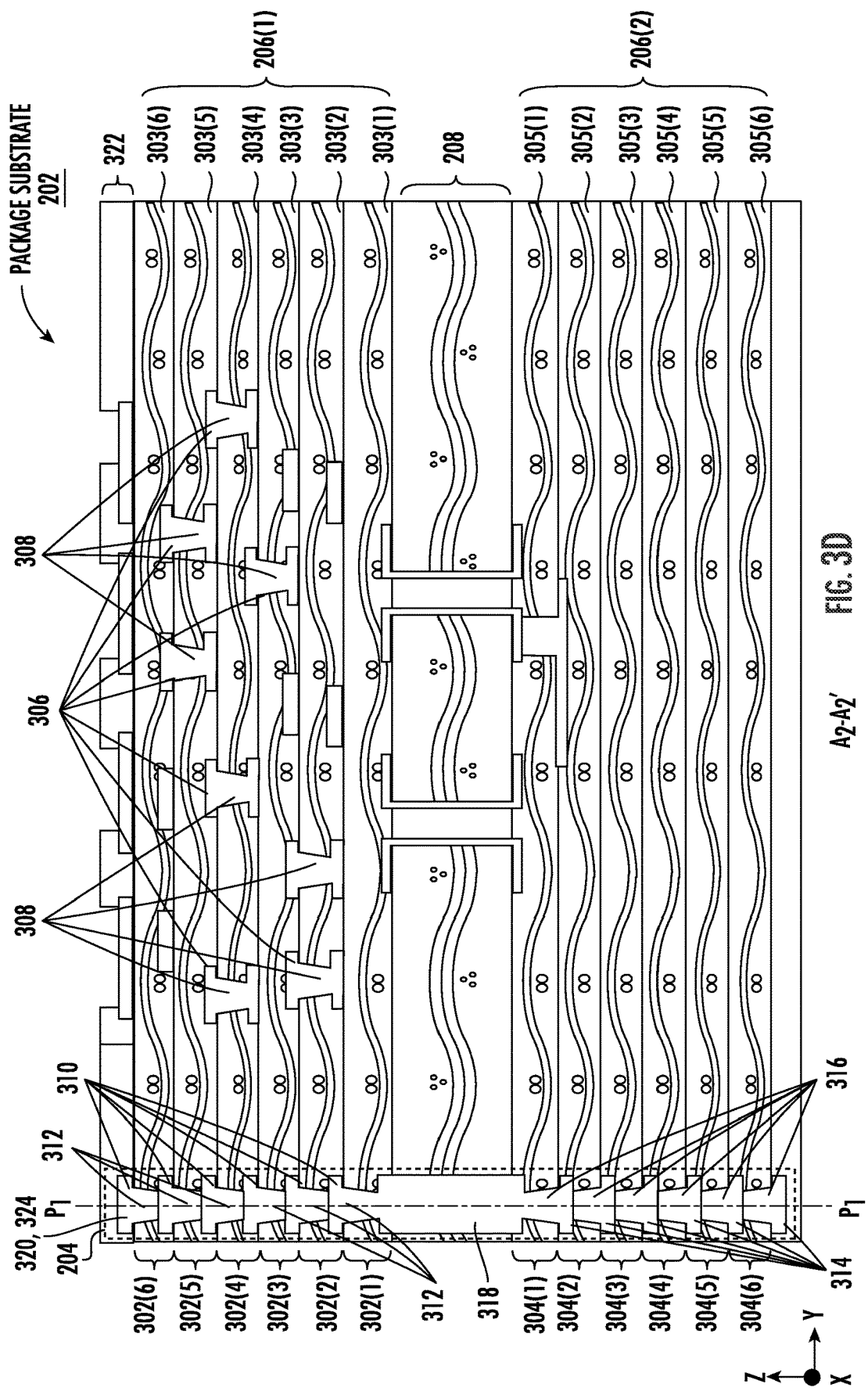

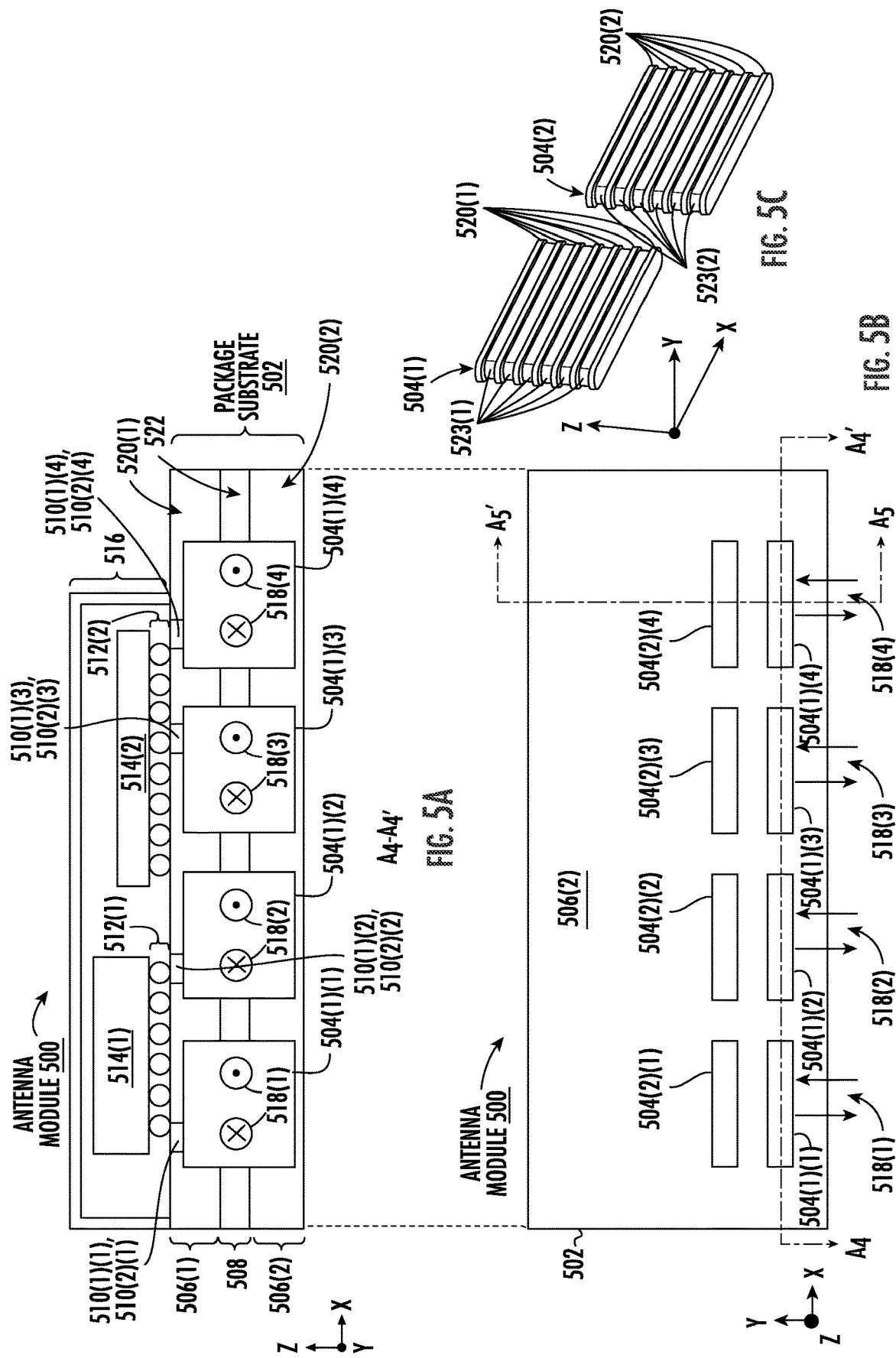

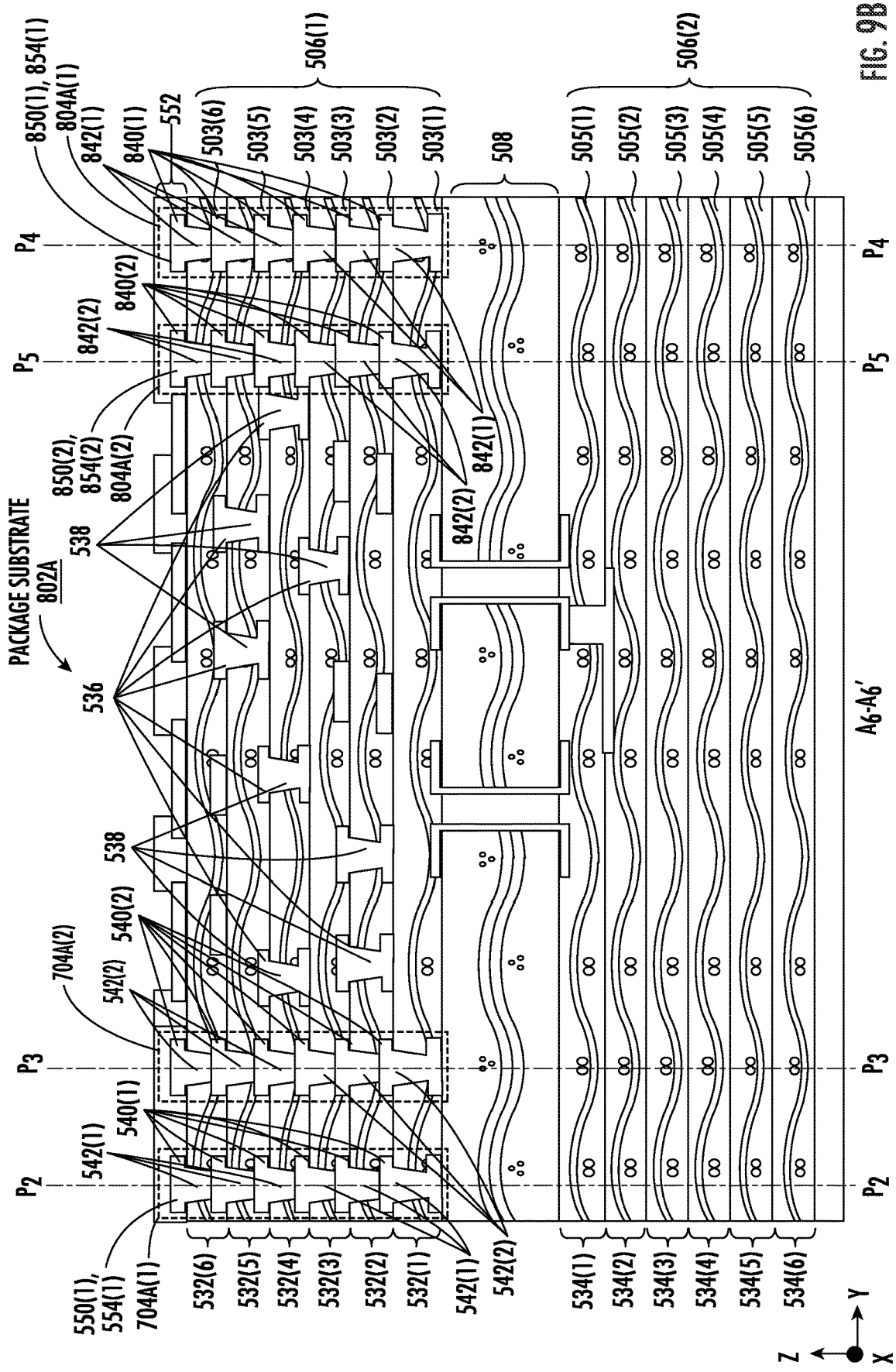

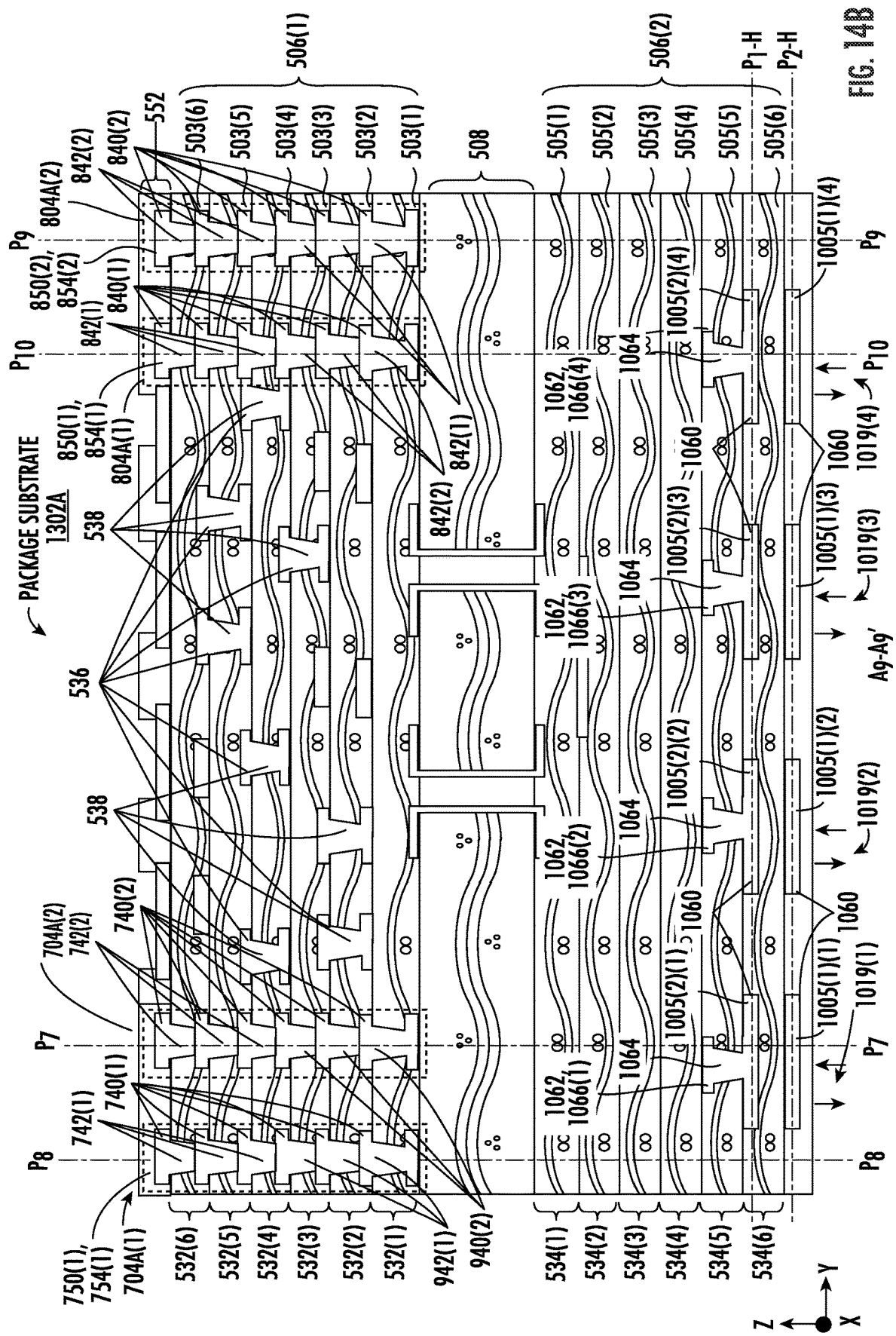

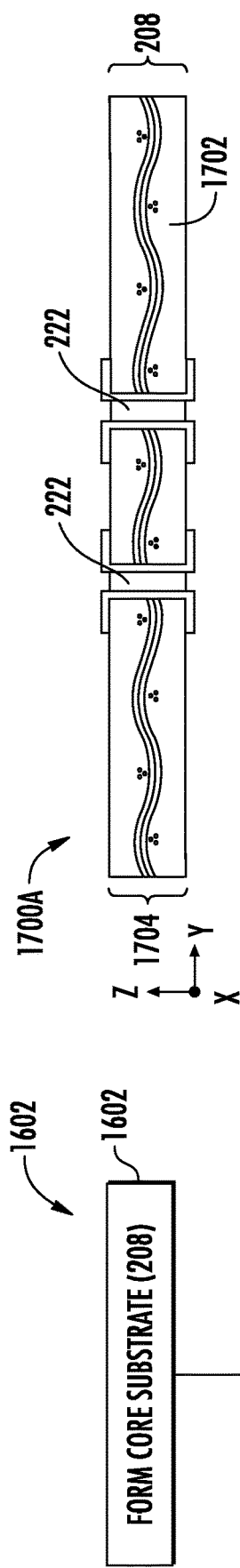
FIG. 17A
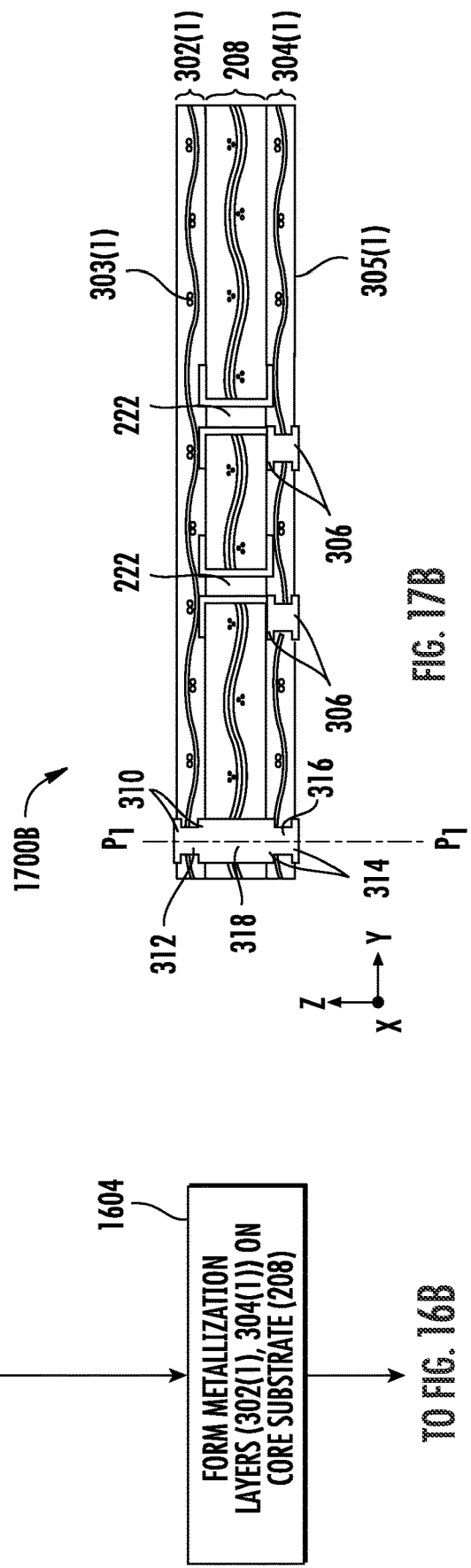
FIG. 17B
FIG. 16A

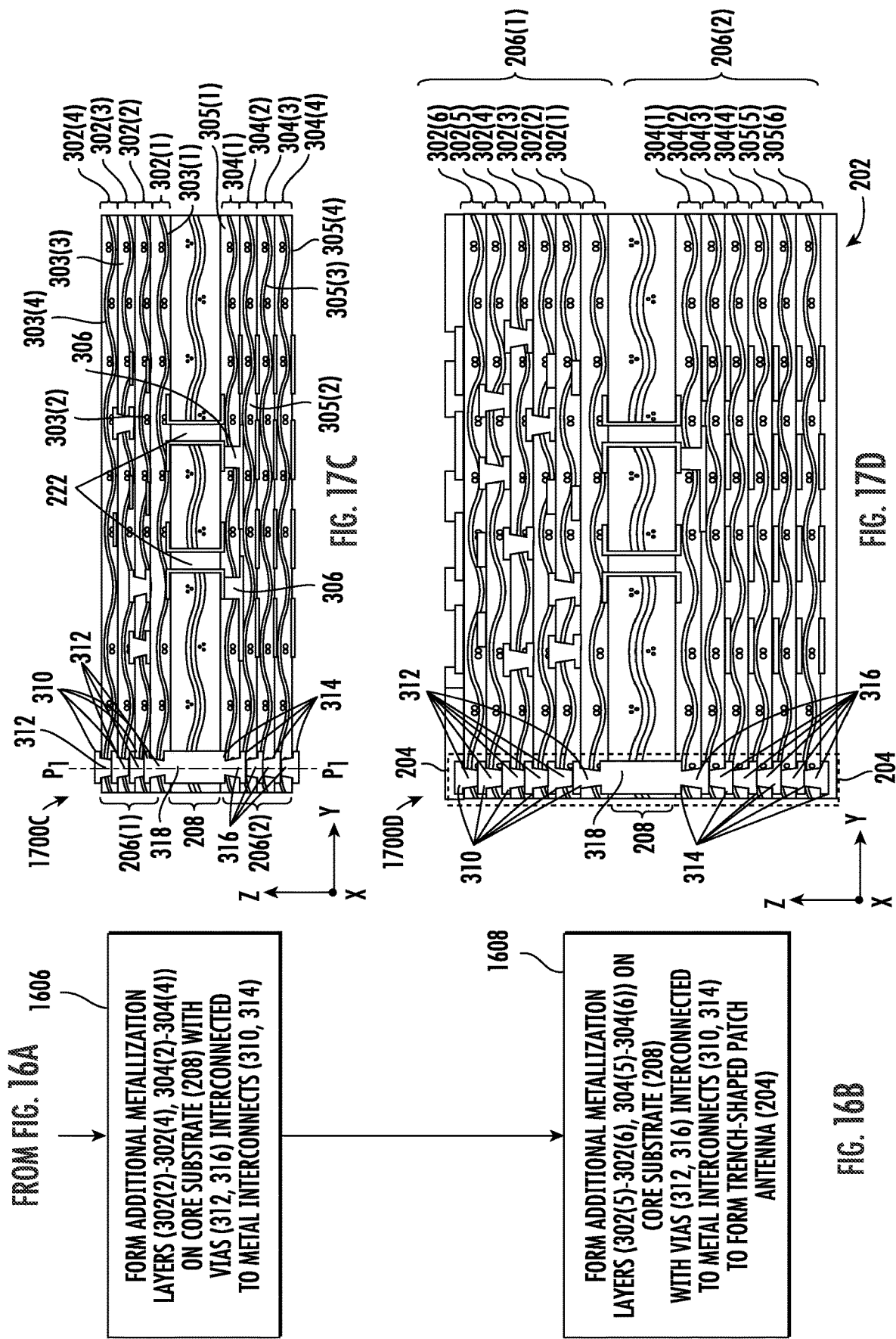

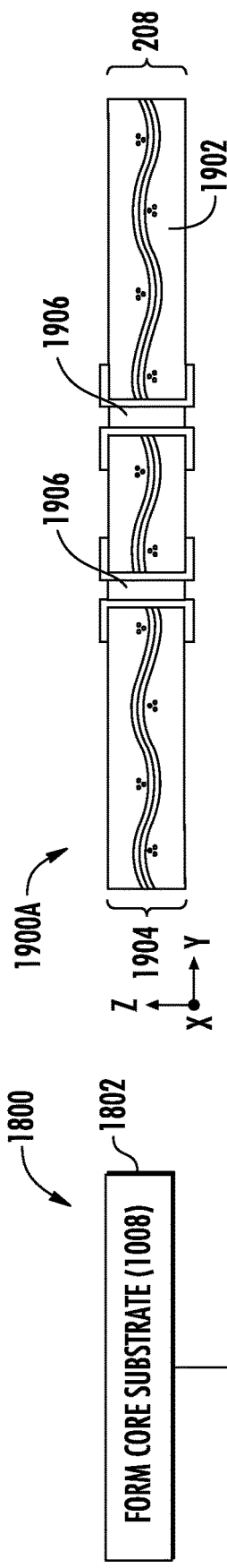
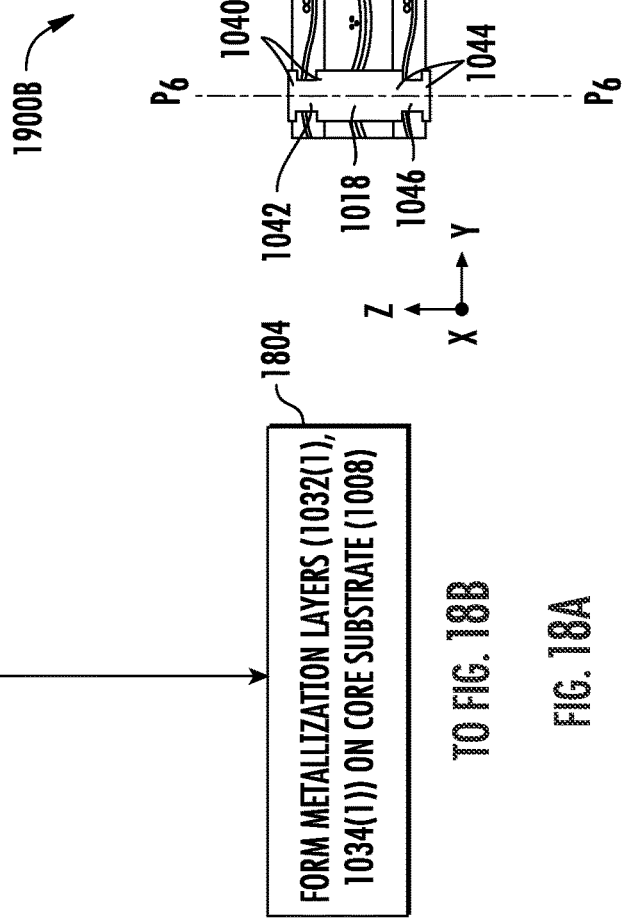

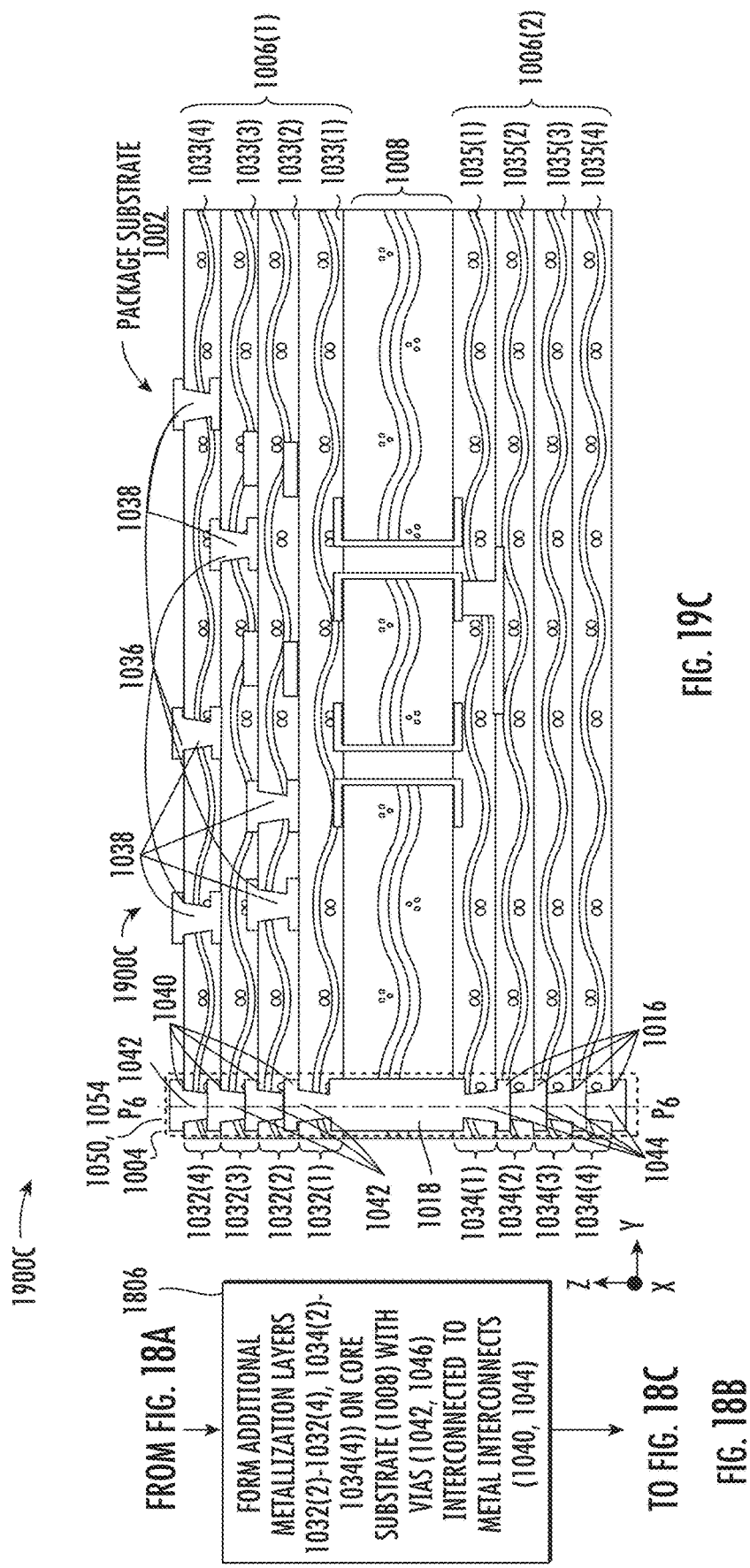

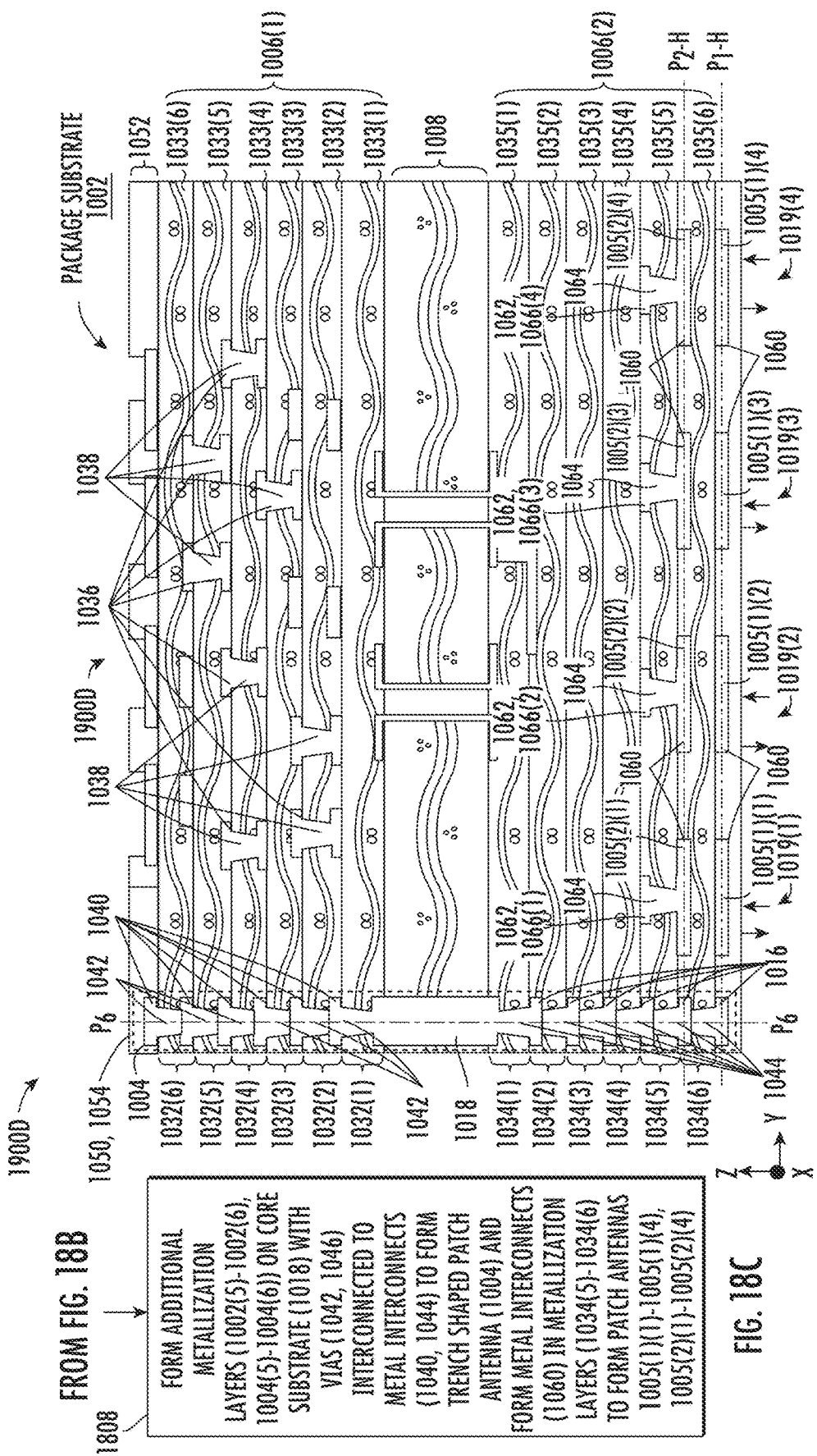

ANTENNA MODULES EMPLOYING A PACKAGE SUBSTRATE WITH A VERTICALLY-INTEGRATED PATCH ANTENNA(S), AND RELATED FABRICATION METHODS

BACKGROUND

I. Field of the Disclosure

The field of the disclosure relates to an antenna module (also referred to as an "antenna-in-package" (AiP)) that includes a radio-frequency (RF) integrated circuit (IC) (RFIC) coupled to a package substrate that includes an integrated antenna(s).

II. BACKGROUND

Modern smart phones and other portable devices have extended the use of different wireless links with a variety of technologies in different radio frequency bands. For example, fifth generation (5G) cellular networks, commonly referred to as 5G new radio (NR), include frequencies in the range of 24.25 to 86 Gigahertz (GHz), with the lower 19.25 GHz (24.25-43.5 GHZ) more likely to be used for mobile devices. This frequency spectrum of 5G communications is in the range of millimeter wave (mmWave) or millimeter band. mmWave enables higher data rates than at lower frequencies, such as those used for Wi-Fi and current cellular networks.

Radio-frequency (RF) transceivers that support mmWave spectrum are incorporated into mobile and other portable devices that are designed to support mmWave communications signals. To support the integration of a RF transceiver in a device, the RF transceiver can be integrated in an RF integrated circuit (IC) (RFIC) that is provided as part of an antenna module. The RFIC is realized in a RFIC semiconductor die ("die"). An antenna module may also be referred to as an "antenna-in-package" (AiP). A conventional antenna module includes a RFIC package that includes one or more RFICs, a power management IC (PMIC), and passive electrical components (e.g., inductors, capacitors, etc.) mounted to one side of a package substrate as a support structure. The package substrate supports metallization structures to provide chip-to-chip and external signal interfaces to the RFIC package. The package substrate also includes one or more antennas that are electrically coupled to the RFIC package through the metallization structures to be capable of receiving and radiating electrical RF signals as electromagnetic (EM) signals. The package substrate may include a plurality of antennas, also referred to an antenna array, to provide a signal coverage in a desired, larger area around the antenna module.

SUMMARY OF THE DISCLOSURE

Aspects disclosed include antenna modules employing a package substrate with a vertically-integrated patch antenna(s). Related fabrication methods are also disclosed. The antenna module includes a radio-frequency (RF) IC (RFIC) package that includes one or more RFICs for supporting RF communications. The antenna module also includes a package substrate that includes one or more metallization layers with formed metal interconnects for routing of signals between the RFIC(s) and an antenna(s) in the package substrate. The package substrate includes one or more patch antennas vertically integrated in a plurality of metallization layers in the package substrate, behaving electromagnetically as a patch antenna. In one example, the patch antenna(s) is comprised of metal vias (e.g., elongated via bars) formed in a via trench across a plurality of adjacent horizontally-disposed metallization layers in the package substrate. The vias are interconnected through metal interconnects (e.g., metal lines, metal traces) formed in the adjacent horizontally-disposed metallization layers. In this manner, the patch antenna(s) is formed as a vertically-integrated structure in a vertical plane in the package substrate that is planar-shaped with fabrication methods used for fabricating metal interconnects and vias (e.g., a micro via fabrication process) in package substrates. The patch antenna(s) can be flexibly disposed in the package substrate, and in existing horizontally-disposed metallization layers of the package substrate, without necessarily having to provide additional metallization layers in the package substrate to support additional antennas. The performance of the patch antenna(s) can be controlled by controlling the length and height of adjacent vias that form part of the patch antenna(s) in adjacent horizontal metallization layers of the package substrate and the spacing of such adjacent vias. A feed line(s) is formed in the metallization layer(s) of the package substrate and electrically coupled to the RFIC package and the patch antenna(s).

In another exemplary aspect, the vertically-integrated patch antenna is formed as a generally planar-shaped structure. The patch antenna is formed by connecting multiple metal interconnects each disposed in a separate metallization layer of the package substrate. The multiple metal interconnects are connected together by vias that are generally elongated in shape in a first, horizontal direction such that when connected to respective metal interconnects, a generally planar-shaped structure is formed in a vertical plane in a second, vertical direction orthogonal to the first direction in the package substrate that can behave as a patch antenna, and thus is considered a patch antenna. For example, a patch antenna formed by vias that are generally elongated in shape in the first horizontal direction and plane of the package substrate can be referred to as "via bars." These via bars are bars in the sense that they are longer in one horizontal direction and narrower in another horizontal direction in a given metallization layer. Each via bar is formed in a via trench in a respective metallization layer that has a depth in a second, vertical direction and is electrically coupled, by an intervening connected metal interconnect, to an adjacent via bar in an adjacent metallization layer thereby forming a single, vertical, trench-like structure in the package substrate. Thus, the resulting vertically-integrated patch antenna may be considered a "trench-shaped" patch antenna in the sense that it is a planar-shaped patch antenna, but integrated in the second, vertical direction of the package substrate in relation to horizontal metallization layers of the package substrate. The precise shape and the vertical plane of the patch antenna will depend on the length of the vias in the horizontal direction. The patch antenna can be formed as a generally rectangular planar-shaped structure.

In other exemplary aspects, the vertically-integrated patch antenna(s) is formed in the package substrate extending in a first, vertical plane in the package substrate such that its antenna radiation pattern extends out from the side of the package substrate in a second, horizontal direction orthogonal to the vertical direction. In other exemplary aspects, multiple patch antennas can be formed vertically in the package substrate and adjacent to each other in the package substrate to provide an antenna. One of the vertically-integrated patch antennas can be electrically coupled through a coupled feed line to the RFIC package. An adjacent vertically-integrated patch antenna is configured to be electromagnetically (EM) coupled to the other vertically-integrated patch antenna connected by a feed line to radiate RF signals transmitted by a RFIC in the RFIC package.

In another exemplary aspect, the package substrate can include other patch antennas that are horizontally integrated in the package substrate by being disposed horizontally in a metallization layer(s) of the package substrate. The antenna radiation pattern of such other patch antennas extends out from the bottom of the package substrate in the vertical direction orthogonal to the antenna radiation pattern of the trench-shaped patch antenna(s). In this manner, the vertically-integrated patch antenna(s) and horizontally-integrated patch antenna(s) in the package substrate provide multiple directions of antenna radiation coverage in the antenna module. For example, it may be important to provide additional antennas in the antenna module to the support multi-directionality RF reception and/or multiple input, multiple output (MIMO) communications, such as millimeter wave (mmWave) applications in the fifth generation (5G) new radio (NR) spectrum.

In this regard, in one exemplary aspect, a package substrate is provided. The package substrate comprises a plurality of first metallization layers parallel to each other (e.g., stacked on each other) in a first direction. The package substrate also comprises a first patch antenna. The first patch antenna comprises a plurality of first metal interconnects each disposed in a separate first metallization layer among the plurality of first metallization layers, wherein each of the plurality of first metal interconnects shares a first common plane in a second direction orthogonal to the first direction. The first patch antenna also comprises a plurality of first vias each disposed in the separate first metallization layer among the plurality of first metallization layers, and each coupling adjacent first metal interconnects among the plurality of first metal interconnects in adjacent first metallization layers among the plurality of first metallization layers. The package substrate also comprises a first antenna feed line coupled to the first patch antenna.

In another exemplary aspect, a method of fabricating a package substrate is provided. The method comprises forming a plurality of first metallization layers, wherein forming each first metallization layer among the plurality of first metallization layers comprises forming a first dielectric layer, forming a first metal interconnect in the first dielectric layer, and forming a first via coupled to the first metal interconnect in the first dielectric layer. The method also comprises forming a first antenna feed line. The method also comprises coupling the plurality of first metallization layers to each other in parallel in a first direction, such that each first metal interconnect in the plurality of first metallization layers shares a first common plane in a second direction orthogonal to the first direction and each first via in the plurality of first metallization layers couples adjacent first metal interconnects in adjacent first metallization layers among the plurality of first metallization layers, wherein the first metal interconnects in each of the plurality of first metallization layers coupled by the first vias in the plurality of first metallization layers form a first patch antenna. The method also comprises coupling the first antenna feed line to the first patch antenna.

In another exemplary aspect, an IC package is provided. The IC package comprises a package substrate. The package substrate comprises a plurality of metallization layers parallel to each other in a first direction. The package substrate also comprises a patch antenna. The patch antenna comprises a plurality of metal interconnects each disposed in a separate metallization layer among the plurality of metallization layers, wherein each of the plurality of metal interconnects shares a first common plane in a second direction orthogonal to the first direction. The patch antenna also comprises a plurality of vias each disposed in the separate metallization layer among the plurality of metallization layers, and each coupling adjacent metal interconnects among the plurality of metal interconnects in adjacent metallization layers among the plurality of metallization layers. The package substrate also comprises an antenna feed line coupled to the patch antenna. The IC package also comprises an IC die layer coupled to the package substrate, the IC die layer comprising an IC die comprising a plurality of die interconnects. The IC package also comprises at least one die interconnect among the plurality of die interconnects coupled to the antenna feed line of the patch antenna.

BRIEF DESCRIPTION OF THE FIGURES

FIGS. 3A and 3B are respective side and bottom views of an exemplary antenna module that includes a package substrate with multiple vertically-integrated patch antenna(s) integrated in adjacent metallization layers in a vertical direction in the package substrate;

FIG. 3C is a side perspective view showing a break-out of a patch antenna formed in the package substrate in FIGS. 3A and 3B;

FIG. 3D is a side view of a package substrate that can be provided in the antenna module in FIGS. 3A and 3B illustrating a vertically-integrated patch antenna extending fully in a vertical direction through the package substrate;

FIGS. 5A and 5B are respective side and bottom views of another exemplary antenna module that includes a package substrate with a patch antenna formed as two (2) vertically-integrated and adjacent planar-shaped structures formed in adjacent metallization layers in the package substrate;

FIG. 5C is a side perspective view showing a break-out of a patch antenna formed in the package substrate in FIGS. 5A and 5B;

FIG. 9B is a side view of a package substrate that can be provided in the antenna module in FIG. 8 illustrating two (2) vertically-integrated patch antennas extending partially in a vertical direction in the package substrate;

FIG. 14B is a side view of a package substrate that can be provided in the antenna module in FIG. 13 illustrating two (2) vertically-integrated patch antennas fully extending through the package substrate and horizontally-integrated patch antennas formed in the metallization layers of the package substrate;

FIGS. 16A and 16B is a flowchart illustrating another exemplary fabrication process for fabricating a package substrate that includes a vertically-integrated patch antenna extending fully in a vertical direction through the package substrate;

FIGS. 17A-17D illustrate exemplary fabrication stages during fabrication of the package substrate fabricated according to the fabrication process in FIGS. 16A and 16B;

FIGS. 18A-18C is a flowchart illustrating another exemplary fabrication process for fabricating a package substrate that includes a vertically-integrated patch antenna extending fully in a vertical direction through the package substrate and horizontally-integrated patch antennas formed in the metallization layers of the package substrate;

FIGS. 19A-19D illustrate exemplary fabrication stages during fabrication of the package substrate fabricated according to the fabrication process in FIGS. 18A-18C;

DETAILED DESCRIPTION

Figure 1A:
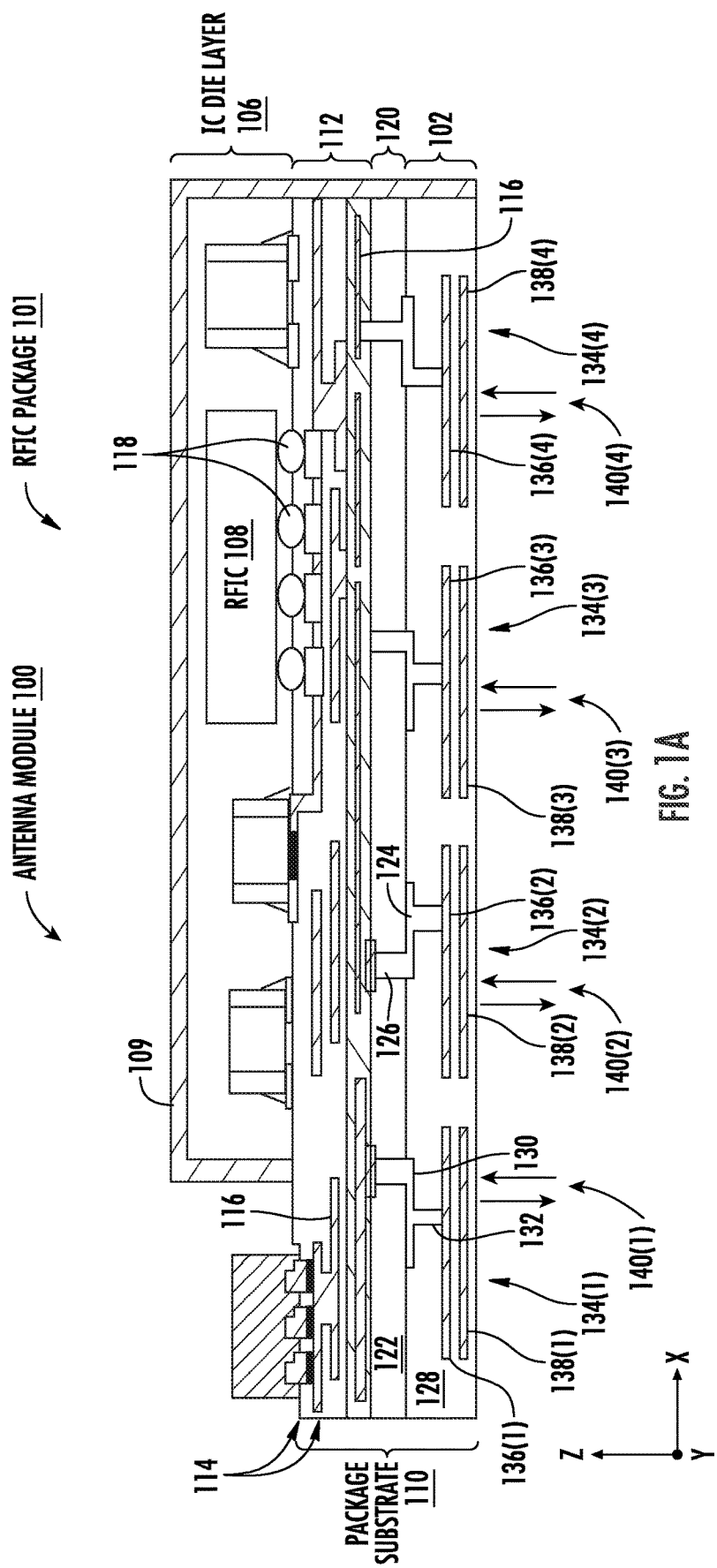
FIGS. 1A and 1B are respective side and bottom views of an antenna module in the form of a radio-frequency (RF) integrated circuit (IC) (RFIC) package that includes a package substrate supporting patch antennas horizontally formed in metallization layers of the package substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed include antenna modules employing a package substrate with a vertically-integrated patch antenna(s). Related fabrication methods are also disclosed. The antenna module includes a radio-frequency (RF) IC (RFIC) package that includes one or more RFICs for supporting RF communications. The antenna module also includes a package substrate that includes one or more metallization layers with formed metal interconnects for routing of signals between the RFIC(s) and an antenna(s) in the package substrate. The package substrate includes one or more patch antennas vertically integrated in a plurality of metallization layers in the package substrate, behaving electromagnetically as a patch antenna. In one example, the patch antenna(s) is comprised of metal vias ("vias") (e.g., elongated via bars) formed in a via trench across a plurality of adjacent horizontally-disposed metallization layers in the package substrate. The vias are interconnected through metal interconnects (e.g., metal lines, metal traces) formed in the adjacent horizontally-disposed metallization layers. In this manner, the patch antenna(s) is formed as a vertically-integrated structure in a vertical plane in the package substrate that is planar-shaped to form a planar-shaped structure with fabrication methods used for fabricating metal interconnects and vias (e.g., a micro via fabrication process) in package substrates. The patch antenna(s) can be flexibly disposed in the package substrate, and in existing horizontally-disposed metallization layers of the package substrate, without necessarily having to provide additional metallization layers in the package substrate to support additional antennas. The performance of the patch antenna(s) can be controlled by controlling the length and height of adjacent vias that form part of the patch antenna(s) in adjacent horizontal metallization layers of the package substrate and the spacing of such adjacent vias. A feed line(s) is formed in the metallization layer(s) of the package substrate and electrically coupled to the RFIC package and the patch antenna(s).

In another exemplary aspect, the vertically-integrated patch antenna is formed as a generally planar-shaped structure. The patch antenna is formed by connecting multiple metal interconnects each disposed in a separate metallization layer of the package substrate. The multiple metal interconnects are connected together by vias that are generally elongated in shape in a first, horizontal direction such that when connected to respective metal interconnects, a generally planar-shaped structure is formed in a vertical plane in a second, vertical direction orthogonal to the first direction in the package substrate that can behave as a patch antenna, and thus is considered a patch antenna. For example, a patch antenna formed by vias that are generally elongated in shape in the first horizontal direction and plane of the package substrate can be referred to as "via bars." These via bars are bars in the sense that they are longer in one horizontal direction and narrower in another horizontal direction in a given metallization layer. Each via bar is formed in a via trench in a respective metallization layer that has a depth in a second, vertical direction and is electrically coupled, by an intervening connected metal interconnect, to an adjacent via bar in an adjacent metallization layer thereby forming a single, vertical, trench-like structure in the package substrate. Thus, the resulting vertically-integrated patch antenna may be considered a "trench-shaped" patch antenna in the sense that it is a planar-shaped patch antenna, but integrated in the second, vertical direction of the package substrate in relation to horizontal metallization layers of the package substrate. The precise shape and the vertical plane of the patch antenna will depend on the length of the vias in the horizontal direction. The patch antenna can be formed as a generally rectangular planar-shaped structure.

Figure 1B:
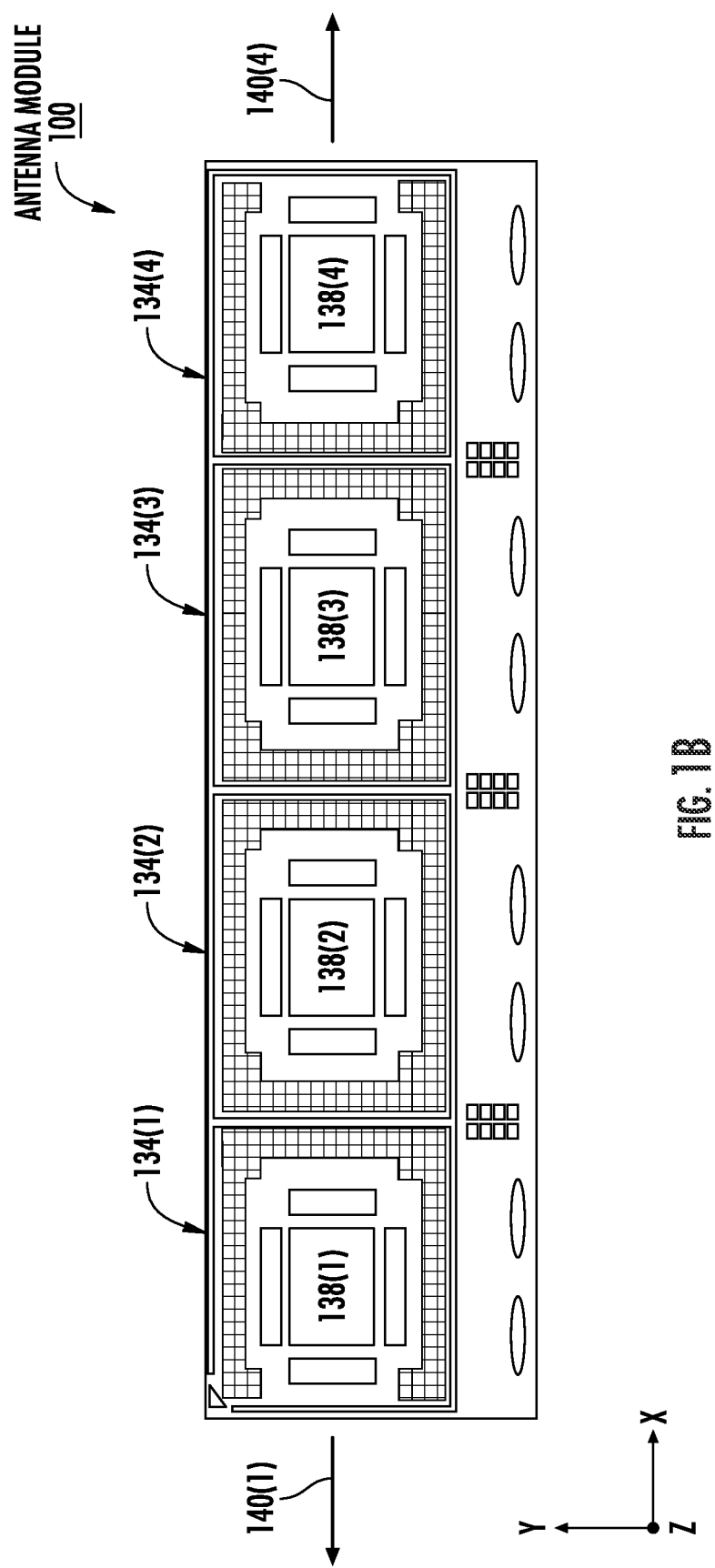

Before discussing IC packages that include a package substrate that includes one or more vertically-integrated patch antennas disposed in the package substrate to support RF communications, an IC package in the form of a RFIC package 101 that does not include vertically-integrated patch antennas in its package substrate is first described with regard to FIGS. 1A and 1B. An example of an IC package that includes a package substrate that includes one or more vertically-integrated patch antennas disposed in the package substrate to support RF communications is discussed below starting at FIG. 2.

FIGS. 1A and 1B are respective side and bottom views of an antenna module 100 that includes an antenna substrate 102 supporting patch and dipole antenna elements for supporting RF communications. The antenna module 100 is provided in the form of a RFIC package 101. As shown in FIG. 1A, the antenna module 100 includes an IC die layer 106 disposed in a horizontal direction in a horizontal plane (in X-axis and Y-axis directions) and that includes an RFIC 108 that includes an encapsulated RF transceiver IC(s). The RFIC 108 could also include a power management IC (PMIC). The IC die layer 106 is mounted to a package substrate 110 to provide a support structure for the IC die layer 106 and to also provide an interconnect structure for coupling the RFIC 108 to other components and circuits in the antenna module 100. An electromagnetic interference (EMI) shield 109 is disposed around the RFIC 108 and other components in the IC die layer 106. In this example, the package substrate 110 includes a metallization substrate 112 that is adjacent to the IC die layer 106. The metallization substrate 112 includes a plurality of substrate metallization layers 114 that each include metal interconnects 116 (e.g., pads, vertical interconnect accesses (vias), traces, lines) formed therein for providing interconnection structures to facilitate interconnections to provide an electrical interface between the RFIC 108 and other components and circuits in the antenna module 100. Die interconnects 118 couple the RFIC 108 to the metal interconnects 116 in the metallization substrate 112. The metallization substrate 112 may be a coreless substrate. The substrate metallization layers 114 could be formed as separate substrate layers that are laminated together to form the metallization substrate 112. One or more of the substrate metallization layers 114 could also be formed as redistribution layers (RDLs). In this example, the metallization substrate 112 is coupled to a core substrate 120 as part of the package substrate 110. A core substrate, such as the core substrate 120, is a substrate that is typically thicker and is made from a dielectric material that is stiff to prevent or reduce warpage in the antenna module 100. The core substrate 120 also includes one or more metallization layers 122 that include metal interconnects 124 coupled to metal vias 126 ("vias 126") (e.g., metal pillars) coupled to metal interconnects 116 in the adjacent metallization substrate 112 to provide electrical connectivity between the metallization substrate 112 and the core substrate 120.

With continuing reference to FIG. 1A, the package substrate 110 in the antenna module 100 also includes the antenna substrate 102. The antenna substrate 102 is coupled to the core substrate 120 such that the core substrate 120 is disposed between the antenna substrate 102 and the metallization substrate 112 in the first, vertical Z-axis direction in this example. The antenna substrate 102 also includes one or more metallization layers 128 that include metal interconnects 130 coupled to metal vias 132 ("vias 132") coupled to the metal interconnects 124 in the core substrate 120. The antenna substrate 102 includes four (4) patch antennas elements 134(1)-134(4) in this example that are electrically coupled to the RFIC 108 through interconnections between the patch antenna elements 134(1)-134(4) and the metal interconnects 116, 124, 130 in the respective metallization substrate 112, core substrate 120 and antenna substrate 102. In this example, each patch antenna element 134(1)-134(4) includes a first patch antenna element 136(1)-136(4) adjacent to the core substrate 120 and a second patch antenna element 138(1)-138(4) disposed adjacent to respective first patch antenna elements 136(1)-136(4). The second patch antenna elements 138(1)-138(4) are configured to be electromagnetically (EM) coupled to the first patch antenna elements 136(1)-136(4) to radiate RF signals distributed to the first patch antenna elements 136(1)-136(4).

As shown in FIGS. 1A and 1B, the second patch antenna elements 138(1)-138(4) are low profile structures that have respective radiation pattern directions 140(1)-140 (4) predominantly in the second, X-axis direction in the antenna module 100. However, the patch antenna elements 134(1)-134(4) do not provide a radiation pattern oriented in the Y-axis or Z-axis directions of the antenna module 100. Thus, this arrangement may require that additional antenna elements be disposed in other areas of the antenna module 100 not shown to provide the desired RF directional performance. However, this may come at a cost of increased antenna module 100 size and complexity, which may be undesirable or infeasible for certain applications. Also, if the antenna module 100 is used for multiple input, multiple output (MIMO) communication applications, further additional antennas must be provided in the antenna module 100 to support the multiple MIMO signal streams, thus further increasing package size of the antenna module 100 in an undesired manner.

Figure 2:
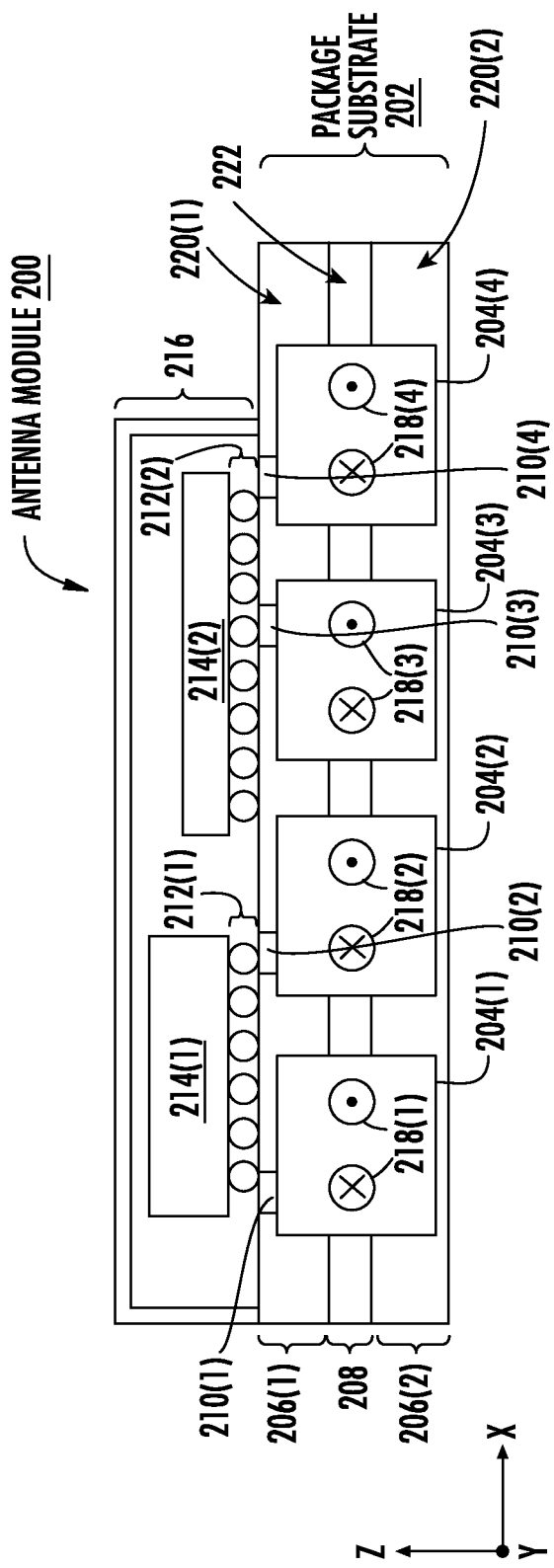
FIG. 2 is a respective side view of an exemplary antenna module that includes a package substrate with multiple vertically-integrated patch antenna(s) integrated in adjacent metallization layers in a vertical direction in the package substrate.

In this regard, FIG. 2 is a respective side view of an exemplary antenna module 200 that includes a package substrate 202 that includes multiple, vertically-integrated patch antennas 204(1)-204(4). The trench-shaped patch antennas 204(1)-204(4) are planar structures in a first, vertical plane in the X-axis and Z-axis directions in this example that are vertically integrated in the first, vertical direction (Z-axis direction) in adjacent metallization layers in the package substrate 202 for supporting RF communications. The patch antennas 204(1)-204(4) are planar structures behaving electromechanically as patch antennas. The patch antennas 204(1)-204(4) are configured to radiate RF signals. As an example, the patch antennas 204(1)-204(4) may be designed for RF signals in the fifth generation (5G) new radio (NR) (5G NR) spectrum. For example, these frequencies can include millimeter (mm) Wave (mmWave) frequencies. Examples of frequencies in 5G spectrum include, but are not limited to, frequency (ies) in the spectrum range of 410 MegaHertz (MHz) to 7.125 GigaHertz (GHz) and 24.25-86 GHz, with the lower 19.25 GHz (24.25-43.5 GHZ) likely to be employed in mobile devices.

In this example, the patch antennas 204(1)-204(4) are disposed vertically in the vertical direction (Z-axis direction) in and through first metallization layers 206(1) in the package substrate 202. The metallization layers 206(1) are disposed in a second, horizontal direction (X-axis and Y-axis directions) orthogonal to the first, vertical direction (Z-axis direction) in a horizontal plane in the X-axis and Y-axis directions in this example. In this example, the patch antennas 204(1)-204(4) are also disposed vertically in the vertical direction (Z-axis direction) in and through a core substrate 208 and second metallization layers 206(2) of the package substrate 202 that are both disposed in a horizontal direction in a horizontal plane in the X-axis and Y-axis directions as well. A core substrate, such as the core substrate 208, is a substrate that is typically thicker and is made from a dielectric material that is stiff to prevent or reduce warpage in the antenna module 200. The patch antennas 204(1)-204(4) are coupled through respective antenna feed lines 210(1)-210(4) to die interconnects 212(1), 212(2) of one or more RFICs 214(1), 214(2) in an IC die layer 216 that include RF transceiver circuitry to support RF communications. In this regard, the antenna module 200 can also be thought of as a RFIC package. The radiation patterns of the respective patch antennas 204(1)-204(4) are in first and second horizontal directions 218(1)-218(4) in the Y-axis direction by the nature of their vertical orientation in the vertical direction (Z-axis direction) and their planar structure in the X-axis and Z-axis directions. Thus, the patch antennas 204(1)-204(4) can be formed in the package substrate 202 to provide this antenna radiation pattern, with or without other antennas, to provide reception antenna coverage in the first and second horizontal directions 218(1)-218(4). Note that although four (4) patch antennas 204(1)-204(4) are included in the antenna module 200 in this example, such is not limiting.

As will be discussed in more detail below, the first and second metallization layers 206(1), 206(2) in the antenna module 200 in FIG. 2 each include metal interconnects 220(1), 220(2) that are formed therein for the routing of signals between the RFICs 214(1), 214(2) and the package substrate 202. As discussed in more detail below, in certain examples, the patch antennas 204(1)-204(4) are formed by adjacent interconnected vias and the metal interconnects 220(1), 220(2) each disposed in separate metallization layers of the first and second metallization layers 206(1), 206(2) connected together through metal posts 222 in the core substrate 208. The interconnected vias and the metal interconnects 220(1), 220(2) in the first and second metallization layers 206(1), 206(2), connected together through metal posts 222 in the core substrate 208, form respective planar-shaped structures as the patch antennas 204(1)-204(4). In this manner, the patch antennas 204(1)-204(4) can be formed as vertically-integrated structures in the package substrate 202 using fabrication methods used for fabricating metal interconnects and vias (e.g., a micro via fabrication process) in package substrates. The performance of the patch antennas 204(1)-204(4) can be controlled by controlling the length and height of the vias and adjacent coupled metal interconnects in the first and/or second metallization layers 206(1), 206(2). The patch antennas 204(1)-204(4) can be flexibly disposed in the package substrate 202, and in existing metallization layers in the first and/or second metallization layers 206(1), 206(2) of the package substrate 202 without necessarily having to provide additional metallization layers dedicated to support additional antennas, such as in the antenna module 100 in FIGS. 1A and 1B.

FIGS. 3A and 3B are respective side and bottom views of the antenna module 200 in FIG. 2 to illustrate additional detail. The patch antennas 204(1)-204(4) in the antenna module 200 in FIG. 3A are shown in the bottom view of the antenna module 200 in FIG. 3B. The radiation patterns of the patch antennas 204(1)-204(4) are shown in the bottom view of the package substrate 202 in FIG. 3B as the first and second horizontal directions 218(1)-218(4) in the Y-axis direction by the nature of vertical orientation of the patch antennas 204(1)-204(4) in the vertical direction (Z-axis direction) and their planar structures in the X-axis and Z-axis directions. The patch antennas 204(1)-204(4) are shown in the second metallization layers 206(2) of the package substrate 202 in FIG. 3B. FIG. 3A is a side view along the cross-section line $A_1$-$A_1'$ in FIG. 3B. FIG. 3C is a side perspective view showing a break-out of one (1) patch antenna 204 that is formed in package substrate 202 of in FIGS. 3A and 3B. As shown in FIG. 3C and described in more detail below, in this example, the patch antenna 204 is formed by a plurality of via bars 300 formed in respective adjacent metallization layers in the package substrate 202 and interconnected by metal interconnects 220 in the respective metallization layers. In this manner, the patch antennas 204(1)-204(2) can be formed as a vertically-integrated structure in the package substrate 202 with fabrication methods used for fabricating the metal interconnects and vias (e.g., a micro via fabrication process) in package substrates.

FIG. 3D is a side view of the package substrate 202 in the antenna module 200 in FIGS. 3A-3B to illustrate an example of the patch antennas 204(1)-204(4). The package substrate 202 in FIG. 3D is a cross-sectional side view along the $A_2$-$A_2'$ cross-section line in the antenna module 200 in FIG. 3B. Thus, only one (1) patch antenna 204 among the patch antennas 204(1)-204(4) is shown from the side in the side view of the package substrate 202 in FIG. 3D. As shown in FIG. 3D, the first metallization layers 206(1) include plurality of metallization layers 302(1)-302(6) that are parallel to each other in a horizontal direction (X-axis and Y-axis directions) in respective horizontal planes. The second metallization layers 206(2) also include plurality of metallization layers 304(1)-304(6) that are parallel to each other (e.g., stacked on each other) in a horizontal direction (X-axis and Y-axis directions) in respective horizontal planes. Metallization layers 302(6), 304(6) are outer metallization layers of the package substrate 202. The first metallization layers 206(1) are coupled to the core substrate 208, with the metallization layer 302(1) being directly coupled to the core substrate 208. The second metallization layers 206(2) are also coupled to the core substrate 208, with the metallization layer 304(1) being directly coupled to the core substrate 208. In this regard, the core substrate 208 is disposed between the first and second metallization layers 206(1), 206(2).

The metallization layers 302(1)-302(6) in the first metallization layers 206(1) each include a dielectric layer 303(1)-303(6) made from a dielectric material and one or more metal interconnects 306 (e.g., metal lines, metal traces, metal posts) formed therein. The metal interconnects 306 can be coupled to each other in adjacent metallization layers 302(1)-302(6) by metal vias 308 ("vias 308") to form signal routing paths in the first metallization layers 206(1) to the die interconnects 212(1), 212(2) of a RFIC 214(1), 214(2) in FIG. 3A. The patch antenna 204 is formed from a plurality of other metal interconnects 310 (e.g., metal lines, metal traces, metal posts) formed in the one or more dielectric layers 303(1)-303(6) of the respective separate metallization layers 302(1)-302(6) in the first metallization layers 206(1) that are aligned in the vertical direction (Z-axis direction) and share a common vertical plane $P_1$ (in the X-axis and Z-axis directions) in the vertical direction (Z-axis direction). The metal interconnects 310 in adjacent metallization layers 302(1)-302(6) are coupled to each other by metal vias 312 ("vias 312") disposed in the respective adjacent metallization layers 302(1)-302(6). The metal interconnects 310 are disposed in parallel to each other in the horizontal direction (X-axis and Y-axis directions). In this manner, the metal interconnects 310 connected by the vias 312 form a vertically integrated planar metal structure in the first metallization layers 206(1) that form part of the patch antenna 204.

Also in this example, the patch antenna 204 also includes a vertical planar-shaped structure that is formed from a plurality of metal interconnects 314 (e.g., metal lines, metal traces, metal posts) formed in one or more dielectric layers 305(1)-305(6) of respective separate metallization layers 304(1)-304(6) in the second metallization layers 206(2) that are aligned in the vertical direction (Z-axis direction) and share the common vertical plane $P_1$. The metallization layers 304(1)-304(6) in the second metallization layers 206(2) each include a dielectric layer 305(1)-305(6) made from a dielectric material and one or more metal interconnects 314 (e.g., metal lines, metal traces, metal posts) formed therein. The metal interconnects 314 in adjacent metallization layers 304(1)-304(6) are coupled to each other by metal vias ("vias 316") disposed in the respective adjacent metallization layers 304(1)-304(6). The metal interconnects 314 are disposed in parallel to each other in the horizontal direction (X-axis and Y-axis directions). In this manner, the metal interconnects 314 connected by the vias 316 form a vertically-integrated planar metal structure in the second metallization layers 206(2) that form part of the patch antenna 204. The core substrate 208 includes a metal post 318 that is coupled to the metal interconnect 310 in the metallization layer 302(1) in the first metallization layers 206(1) and to the metal interconnect 314 in the metallization layer 304(1) in the second metallization layers 206(2) to form part of the patch antenna 204.

In this manner, the metal interconnects 310 interconnected by the respective vias 312 in the first metallization layers 206(1), the metal interconnects 314 interconnected by the respective vias 316 in the second metallization layers 206(2), and the metal post 318 form the patch antenna 204 in this example. In this regard, because the patch antenna 204 is formed from interconnected metal interconnects 310, 314 and vias 312, 316 in the metallization layers 206(1), 206(2) and the metal post 318 in the core substrate 208, fabrication techniques used to fabricate the metal interconnects 306 and vias 308 in package substrate 202 can also be used to form the patch antenna 204 in the package substrate 202. In this example, the patch antenna 204 extends all the way through all layers of the package substrate 202 in this example in FIG. 3D. The patch antenna 204 extends in the vertical direction (Z-axis direction) through each of the metallization layers 302(1)-302(6) in the first metallization layers 206(1), through each of the metallization layers 304(1)-304(6) in the second metallization layers 206(2), and also through the core substrate 208 in this example. A metal interconnect 320 formed in a solder resist layer 322 (as another metallization layer) disposed on the metallization layer 302(6) of the first metallization layers 206(1) in this example serves as an antenna feed line 324 to the patch antenna 204. A die interconnect 212(1), 212(2) of an RFIC 214(1), 214(2) in the antenna module in FIG. 3A can be coupled to the metal interconnect 320 as an antenna feed line 324 to couple the RFIC 214(1), 214(2) to the patch antenna 204 to serve as an antenna for an RFIC 214(1), 214(2).

Also, as shown in FIGS. 3C and 3D, the vertically-integrated patch antenna 204 is formed as a generally planar-shaped structure, and in this example a rectangular-shaped structure, in the X-axis and Z-axis directions. As discussed above, the patch antenna 204 is formed by connecting multiple metal interconnects 310, 314 each disposed in separate metallization layers 302(1)-302(6), 304(1)-304(6) of the package substrate 202. In this example, the multiple metal interconnects 310, 314 are connected together by the respective vias 312, 316 that are generally elongated in shape in a horizontal direction (X-axis direction) forming the via bars 300 such that when connected to respective metal interconnects 310, 314, the patch antenna 204 is formed as a generally planar structure in a plane in the X-axis and Z-axis directions in the vertical plane $P_1$ in the package substrate 202 and can behave as a patch antenna, and thus is considered a patch antenna. These via bars 300 are bars in the sense that they are longer in one horizontal direction (X-axis direction) and narrower in another horizontal direction (Y-axis direction) in its metallization layer 302(1)-302(6), 304(1)-304(6). Each via bar 300 is formed in a via trench in a respective metallization layer 302(1)-302(6), 304(1)-304(6) that has a depth in the vertical direction (Z-axis direction) and electrically coupled, by an intervening connected metal interconnect 310, 314, to an adjacent via bar 300 in an adjacent metallization layer 302(1)-302(6), 304(1)-304(6) thereby forming a single, vertical, trench-like structure in the package substrate 202. Thus, the resulting vertically-integrated patch antenna 204 may be considered a "trench-shaped" patch antenna in the sense that it is a planar-shaped patch antenna, but integrated in a vertical direction (Z-axis direction) of the package substrate 202 in relation to horizontal metallization layers 302(1)-302(6), 304(1)-304(6) of the package substrate 202. The elongated vias 312, 316 each comprise a trench. The precise shape and the vertical plane $P_1$ of the patch antenna 204 will depend on the length of the vias 312, 316 in the horizontal direction (X-axis direction). The patch antenna 204 is formed as a generally rectangular planar-shaped structure in this example.

Note that in another exemplary aspect, the metal interconnects 310 interconnected by the respective vias 312 in the first metallization layers 206(1) as part of the patch antenna 204 does not have to extend into the core substrate 208 and/or the second metallization layers 206(2). A formed patch antenna does not have to include metal interconnects 314 interconnected by the respective vias 316 in the second metallization layers 206(2). In this manner, in this alternative aspect, the metal interconnects 310 interconnected by the respective vias 312 in the first metallization layers 206(1) would form a first patch antenna in the package substrate 202. The metal interconnects 314 interconnected by the respective vias 316 in the second metallization layers 206(2) would form a second, separate patch antenna in the package substrate 202. Thus, the metal post 318 that is shown in the core substrate 208 interconnecting the metal interconnects 310 interconnected by the respective vias 312 in the first metallization layers 206(1) would not have to be included to form a single patch antenna like the patch antenna 204 in FIG. 3D.

Figure 4:
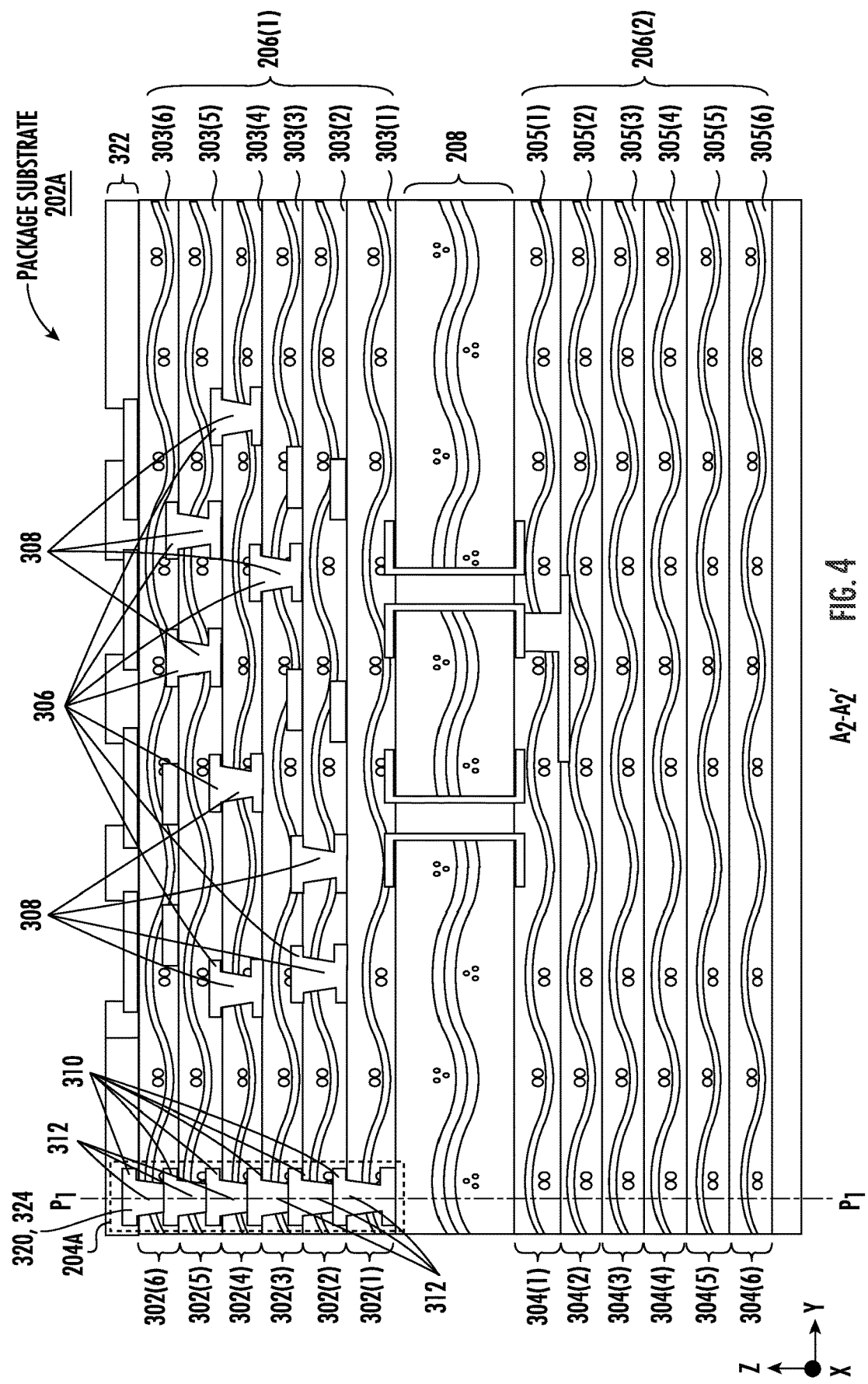
FIG. 4 is a side view of another package substrate that can be provided in the antenna module in FIGS. 3A and 3B illustrating the vertically-integrated patch antenna extending partially in a vertical direction in the package substrate.

In this regard, FIG. 4 is a side view of an alternative package substrate 202A that can be provided as the package substrate 202 in the antenna module 200 in FIGS. 3A-3B. The package substrate 202A includes an alternative patch antenna 204A vertically integrated in the vertical direction (Z-axis direction) and only disposed in the first metallization layers 206(1) of the package substrate 202A. Common elements between the package substrate 202 in FIG. 3D and the package substrate 202A in FIG. 4 are shown with common element numbers. Thus, the discussion of these common elements in FIG. 3D is also applicable to the package substrate 202A in FIG. 4. The package substrate 202A in FIG. 4 is a cross-sectional side view along the $A_2$-$A_2$' cross-section line in the antenna module 200 in FIG. 3B. Thus, only one (1) vertically-integrated patch antenna 204A is shown from the side in the side view of the package substrate 202A in FIG. 4.

As shown in FIG. 4, the first metallization layers 206(1) includes the plurality of metallization layers 302(1)-302(6) that are parallel to each other (e.g., stacked on each other) in the horizontal direction (X-axis and Y-axis directions) in respective horizontal planes like the package substrate 202 in FIG. 3D. Like provided in the package substrate 202 in FIG. 3D, the dielectric layers 303(1)-303(6) of the metallization layers 302(1)-302(6) in the first metallization layers 206(1) of the package substrate 202A in FIG. 4 include the metal interconnects 306 (e.g., metal lines, metal traces, metal posts) that are coupled to each other in adjacent metallization layers 302(1)-302(6) by vias 308 to form signal routing paths in the first metallization layers 206(1) to the die interconnects 212(1), 212(2) of a RFIC 214(1), 214(2) in FIG. 3A. The patch antenna 204A is formed from a plurality of other metal interconnects 310 (e.g., metal lines, metal traces, metal posts) in the dielectric layers 303(1)-303(6) of one or more respective separate metallization layers 302(1)-302(6) in the first metallization layers 206(1) that are aligned in the vertical direction (Z-axis direction) and share a common vertical plane $P_1$. The metal interconnects 310 in adjacent metallization layers 302(1)-302(6) are coupled to each other by vias 312 disposed in the respective adjacent metallization layers 302(1)-302(6). The metal interconnects 310 are disposed in parallel to each other in the horizontal direction (X-axis and Y-axis directions). In this manner, the metal interconnects 410 connected by metal vias 412 ("vias 412") form a vertically-integrated planar-shaped metal structure in the first metallization layers 206(1) that form the patch antenna 204A in this example.

In this manner, the metal interconnects 310 interconnected by the respective vias 312 in the first metallization layers 206(1) form the patch antenna 204A in this example. Thus, the patch antenna 204A does not extend into the core substrate 208 or the second metallization layers 206(2) of the package substrate 202A in this example in FIG. 4. Like the package substrate 202 in FIG. 3D, the metal interconnect 320 formed as part of the solder resist layer 322 disposed on the metallization layer 302(6) of the first metallization layers 206(1) can serve as an antenna feed line 324 to the patch antenna 204. A die interconnect 212(1), 212(2) of an RFIC 214(1), 214(2) in the antenna module 200 in FIG. 3A can be coupled to the metal interconnect 320 as the antenna feed line 324 to couple the RFIC 214(1), 214(2) to the patch antenna 204.

Also, as shown in FIG. 4, the vertically-integrated patch antenna 204A is formed as a generally planar-shaped structure, and in this example a rectangular-shaped structure, in the X-axis and Z-axis directions. As discussed above, the patch antenna 204A is formed by connecting multiple metal interconnects 310 each disposed in separate metallization layers 302(1)-302(6) of the package substrate 202A. In this example, the multiple metal interconnects 310 are connected together by the respective vias 312 that are generally elongated in shape in a horizontal direction (X-axis direction) forming a via bar such that when connected to respective metal interconnects 310, the patch antenna 204A is formed as generally planar-shaped structure in a plane in the X-axis and Z-axis directions in the vertical plane $P_1$ in the package substrate 202 that can behave as a patch antenna, and thus is considered a patch antenna. The patch antenna 204A is a via bar in the sense that they are longer in one horizontal direction (X-axis direction) and narrower in another horizontal direction (Y-axis direction) in its metallization layer 302(1)-302(6). The via bar of the patch antenna 204A is formed in a via trench in a respective metallization layer 302(1)-302(6) that has a depth in the vertical direction (Z-axis direction) and electrically coupled, by an intervening connected metal interconnect 310, to an adjacent via 312 in an adjacent metallization layer 302(1)-302(6) thereby forming a single, vertical, trench-like structure in the package substrate 202A. Thus, the resulting vertically-integrated patch antenna 204A may be considered a "trench-shaped" patch antenna in the sense that it is a planar-shaped patch antenna, but integrated in a vertical direction (Z-axis direction) of the package substrate 202A in relation to horizontal metallization layers 302(1)-302(6) of the package substrate 202. The elongated vias 312 each comprise a trench. The precise shape and the vertical plane $P_1$ of the patch antenna 204A will depend on the length of the vias 312 in the horizontal direction (X-axis direction). The patch antenna 204A is formed as a generally rectangular planar-shaped structure in this example.

Note that alternatively, the package substrate 202A in FIG. 4 could be provided such that the patch antenna 204 is provided in the second metallization layers 206(2) and not in the first metallization layers 206(1). In this regard, like shown in the package substrate 202 in FIG. 3D, in this alternative aspect, the patch antenna 204 would be formed of the plurality of other metal interconnects 314 (e.g., metal lines, metal traces, metal posts) in dielectric layers 305(1)-305(6) of respective separate metallization layers 304(1)-

304(6) in the second metallization layers 206(2) that are aligned in the vertical direction (Z-axis direction) and share a common vertical plane P₁.

In other exemplary aspects, the vertically-integrated patch antenna(s) can be formed in the package substrate extending in a first, vertical plane in the package substrate such that its antenna radiation pattern is out from the side of the package substrate in a second, horizontal direction orthogonal to the vertical direction. In other exemplary aspects, multiple trench-shape patch antennas can be formed vertically adjacent to each other in the package substrate to provide an antenna. One of the trench-shape patch antennas can be electrically coupled through a coupled feed line to the RFIC package. An adjacent trench-shape patch antenna is configured to be electromagnetically (EM) coupled to the trench-shape patch antenna connected by a feed line to radiate RF signals transmitted by a RFIC in the RFIC package.

In an alternative aspect, a first and second vertically-integrated patch antennas could be vertically integrated and disposed vertically adjacent to each other in a package substrate, such as package substrate 202 in FIG. 2, such that first and second patch antennas are EM coupled to each other when receiving a RF signal to be radiated. In this manner, an antenna feed line can be coupled to only first patch antenna. The second patch antenna is located sufficiently close to the first patch antenna to EM couple a RF signal received by the first patch antenna from the antenna feed line to be radiated from the package substrate. This is shown in example antenna module 500 in FIGS. 5A-5D, which will now be described.

In this regard, FIG. 5A is a side view of an exemplary antenna module 500 that includes a package substrate 502 that includes multiple patch antennas 504(1)(1)-504(1)(4) and 504(2)(1)-504(2)(4). The patch antennas 504(1)(1)-504(1)(4) and 504(2)(1)-504(2)(4) being planar structures behave as patch antennas. As discussed in more detail below, respective patch antennas 504(2)(1)-504(2)(4) are configured to be EM coupled to respective, adjacent patch antennas 504(1)(1)-504(1)(4) when patch antennas 504(2)(1)-504(2)(4) are energized with a received RF signal. Patch antennas 504(1)(1)-504(1)(4) will then radiate the RF signal away from the package substrate 502. The patch antennas 504(1)(1)-504(1)(4) and 504(2)(1)-504(2)(4) are planar structures in the X- and Z-axis directions that are vertically integrated in the vertical direction (Z-axis direction) in adjacent metallization layers in the package substrate 502 for supporting RF communications. The radiation patterns of the patch antennas 504(1)(1)-504(1)(4) and 504(2)(1)-504(2)(4), are shown in first and second horizontal directions 518(1)-518(4) in the Y-axis direction by the nature of their vertical orientation in the vertical direction (Z-axis direction) and their planar structure in the X-axis and Z-axis directions. As an example, the patch antennas 504(1)(1)-504(1)(4) and 504(2)(1)-504(2)(4) may be designed for millimeter wave (mmWave) reception, including RF signals in the fifth generation (5G) new radio (NR) spectrum.

In this example, the patch antennas 504(1)(1)-504(1)(4), 504(2)(1)-504(2)(4) are disposed vertically in the vertical direction (Z-axis direction) in and through first metallization layers 506(1) in the package substrate 502. The metallization layers 506(1) are disposed in a horizontal direction in a horizontal plane in the X-axis and Y-axis directions in this example. In this example, the patch antennas 504(1)(1)-504(1)(4), 504(2)(1)-504(2)(4) are also disposed vertically in the vertical direction (Z-axis direction) in and through a core substrate 508 and second metallization layers 506(2) of the package substrate 502 that are both are disposed in a horizontal direction in a horizontal plane in the X-axis and Y-axis directions as well. The patch antennas 504(1)(1)-504(1)(4), 504(2)(1)-504(2)(4) are coupled through respective antenna feed lines 510(1)(1)-510(1)(4), 510(2)(1)-510(2)(4) to die interconnects 512(1), 512(2) of one or more RFICs 514(1), 514(2) in an IC die layer 516 that include RF transceiver circuitry to support RF communications. A core substrate, such as the core substrate 508, is a substrate that is typically thicker and is made from a dielectric material that is stiff to prevent or reduce warpage in the antenna module 500. In this regard, the antenna module 500 can also be thought of as a RFIC package. The radiation patterns of the patch antennas 504(1)(1)-504(1)(4) are shown in first and second horizontal directions 518(1)-518(4) in the Y-axis direction by the nature of their vertical orientation in the vertical direction (Z-axis direction) and their planar structure in the X-axis and Z-axis directions. The patch antennas 504(1)(1)-504(1)(4), 504(2)(1)-504(2)(4) may be formed in package substrate 502 to provide this antenna radiation pattern with or without other antennas to provide reception antenna coverage in the first and second horizontal directions 518(1)-518(4).

As will be discussed in more detail below, the first and second metallization layers 506(1), 506(2) in the antenna module 500 in FIG. 5A each include metal interconnects 520(1), 520(2) that are formed therein for the routing of signals between the RFICs 514(1), 514(2) and the package substrate 502. As discussed in more detail below, in certain examples, the patch antennas 504(1)(1)-504(1)(4), 504(2)(1)-504(2)(4) are formed by adjacent interconnected metal vias ("vias") and metal interconnects 520(1), 520(2) in the first and second metallization layers 506(1), 506(2) connected together through metal posts 522 in the core substrate 508. In this manner, the patch antennas 504(1)(1)-504(1)(4), 504(2)(1)-504(2)(4) can be formed as vertically-integrated structures in the package substrate 502 using fabrication methods used for fabricating metal interconnects and vias (e.g., a micro via fabrication process) in package substrates. The performance of the patch antennas 504(1)(1)-504(1)(4), 504(2)(1)-504(2)(4) can be controlled by controlling the length and height of the vias and adjacent coupled metal interconnects in the first and/or second metallization layers 506(1), 506(2). The patch antennas 504(1)(1)-504(1)(4), 504(2)(1)-504(2)(4) can be flexibly disposed in the package substrate 502, and in existing metallization layers in the first and/or second metallization layers 506(1), 506(2) of the package substrate 502 without necessarily having to provide additional metallization layers dedicated to support additional antennas, such as in the antenna module 100 in FIGS. 1A and 1B.

The patch antennas 504(1)(1)-504(1)(4), 504(2)(1)-504(2)(4) in the antenna module 500 in FIG. 5A are shown in the bottom view of the antenna module 500 in FIG. 5B. The patch antennas 504(1)(1)-504(1)(4), 504(2)(1)-504(2)(4) are shown in the second metallization layers 506(2) of the package substrate 502 in FIG. 5B. FIG. 5A is a side view along the cross-section line A₄-A₄' in FIG. 5B. The radiation pattern of the patch antennas 504(1)(1)-504(1)(4), 504(2)(1)-504(2)(4) are shown in the bottom view of the package substrate 502 in FIG. 5B as the first and second horizontal directions 518(1)-518(4) in the Y-axis direction by the nature of vertical orientation of the patch antennas 504(1)(1)-504(1)(4), 504(2)(1)-504(2)(4) in the vertical direction (Z-axis direction) and their planar structures in the X-axis and Z-axis directions. FIG. 5C is a side perspective view showing a break-out of two (2) adjacent patch antennas 504(1), 504(2) that are formed in the package substrate 502 in FIGS.

5A and 5B. As shown in FIG. 5C and described in more detail below, in this example, the patch antennas 504(1), 504(2) are each formed by a plurality of vias bars 523(1), 523(2) formed in respective adjacent metallization layers in the package substrate 502 and interconnected by respective metal interconnects 520(1), 520(2) in the respective metallization layers. In this manner, the patch antennas 504(1), 504(2) can be formed as a vertically integrated structure in the package substrate 502 with fabrication methods used for fabricating the metal interconnects and vias (e.g., a micro via fabrication process) in package substrates.

Figure 5D:
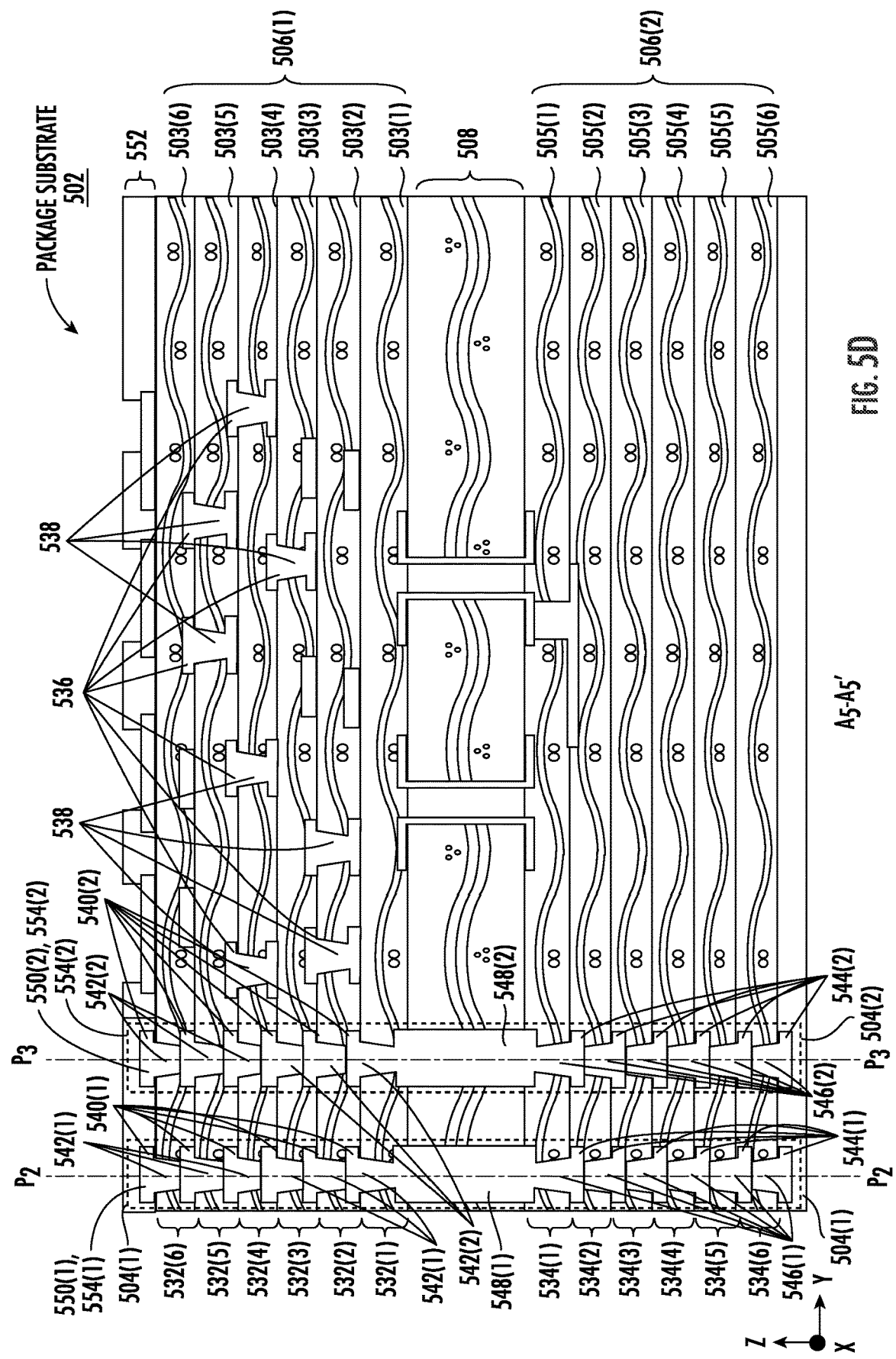
FIG. 5D is a side view of a package substrate that can be provided in the antenna module in FIGS. 5A and 5B illustrating the two (2) vertically-integrated planar-shaped structures extending fully in a vertical direction through the package substrate.

FIG. 5D is a side view of the package substrate 502 in the antenna module 200 in FIGS. 3A-3B to illustrate an example of the patch antennas 504(1)(1)-504(1)(4), 504(2)(1)-504(2)(4). The package substrate 502 in FIG. 5D is a cross-sectional side view along the $A_5$-$A_5'$ cross-section line in the antenna module 500 in FIG. 5B. Thus, only two (2) patch antennas 504(1), 504(2) are shown from the side in the side view of the package substrate 502 in FIG. 5D. In this example, the patch antennas 504(1), 504(2) can be any of the respective pairs of patch antennas 504(1)(1)-504(1)(4), 504(2)(1)-504(2)(4) in the package substrate 502 in FIG. 5B. As shown in FIG. 5D, the first metallization layers 506(1) include plurality of metallization layers 532(1)-532(6) that are parallel to each other (e.g., stacked on each other) in a horizontal direction (X-axis and Y-axis directions) in respective horizontal planes. The second metallization layers 506(2) also include plurality of metallization layers 534(1)-534(6) that are parallel to each other in a horizontal direction (X-axis and Y-axis directions) in respective horizontal planes. Metallization layers 532(6), 534(6) are outer metallization layers of the package substrate 502. The first metallization layers 506(1) are coupled to the core substrate 508, with the metallization layer 532(1) being directly coupled to the core substrate 508. The second metallization layers 506(2) are also coupled to the core substrate 508, with the metallization layer 534(1) being directly coupled to the core substrate 508. In this regard, the core substrate 508 is disposed between the first and second metallization layers 506(1), 506(2).

The metallization layers 532(1)-532(6) in the first metallization layers 506(1) include respective metal interconnects 536 (e.g., metal lines, metal traces, metal posts) formed in dielectric layers 503(1)-503(6). The metal interconnects 536 are coupled to each other in adjacent metallization layers 532(1)-532(6) by metal vias 538 ("vias 538") to form signal routing paths in the first metallization layers 506(1) to the die interconnects 512(1), 512(2) of a RFIC 514(1), 514(2) in FIG. 5A. The patch antennas 504(1), 504(2) are formed from a plurality of other metal interconnects 540(1), 540(2) (e.g., metal lines, metal traces, metal posts) in dielectric layers 503(1)-503(6) in respective separate metallization layers 532(1)-532(6) in the first metallization layers 506(1) that are aligned in the vertical direction (Z-axis direction) and share respective common vertical planes $P_2$, $P_3$ in the X-axis and Z-axis directions. The respective metal interconnects 540(1), 540(2) in adjacent metallization layers 532(1)-532(6) are coupled to each other by respective metal vias ("vias") 542(1), 542(2) disposed in the respective adjacent metallization layers 532(1)-532(6). The respective metal interconnects 540(1), 540(2) are disposed in parallel to each other in the horizontal direction (X-axis and Y-axis directions). In this manner, the metal interconnects 540(1), 540(2) connected by the respective vias 542(1), 542(2) form a vertically integrated planar-shaped metal structure in the first metallization layers 506(1) that forms part of the respective patch antennas 504(1), 504(2).

Also in this example, the patch antennas 504(1), 504(2) also include a respective vertical planar-shaped structure that is formed from plurality of metal interconnects 544(1), 544(2) (e.g., metal lines, metal traces, metal posts) in dielectric layers 505(1)-505(6) in respective separate metallization layers 534(1)-534(6) in the second metallization layers 506(2) that are aligned in the vertical direction (Z-axis direction) and share the respective common vertical planes $P_2$, $P_3$. The respective metal interconnects 544(1), 544(2) in adjacent metallization layers 534(1)-534(6) are coupled to each other by the respective metal vias ("vias") 546(1), 546(2) disposed in the respective adjacent metallization layers 534(1)-534(6). The respective metal interconnects 544(1), 544(2) are disposed in parallel to each other in the horizontal direction (X-axis and Y-axis directions). In this manner, the respective metal interconnects 544(1), 544(2) connected by the respective vias 546(1), 546(2) form respective vertically-integrated planar-shaped metal structures in the second metallization layers 506(2) that forms part of the patch antennas 504(1), 504(2). The core substrate 508 includes respective metal posts 548(1), 548(2) that are coupled to the respective metal interconnects 540(1), 540(2) in the metallization layer 532(1) in the first metallization layers 506(1) and to the respective metal interconnects 544(1), 544(2) in the metallization layer 534(1) in the second metallization layers 506(2).

In this manner, the respective metal interconnects 540(1), 540(2) interconnected by the respective vias 542(1), 542(2) in the first metallization layers 506(1), the respective metal interconnects 544(1), 544(2) interconnected by the respective vias 546(1), 546(2) in the second metallization layers 506(2), and the respective metal posts 548(1), 548(2) form the respective patch antennas 504(1), 504(2) in this example. The patch antennas 504(1), 504(2) each extend all the way through all layers of the package substrate 502 in this example in FIG. 5D. The patch antennas 504(1), 504(2) extend in the vertical direction (Z-axis direction) through each of the metallization layers 532(1)-532(6) in the first metallization layers 506(1), through each of the metallization layers 534(1)-534(6) in the second metallization layers 506(2), and also through the core substrate 508 in this example. Metal interconnects 550(1), 550(2) disposed in a solder resist layer 552 (as another metallization layer) disposed on the metallization layer 532(6) of the first metallization layers 506(1) can serve as respective antenna feed lines 554(1), 554(2) to the respective patch antennas 504(1), 504(2). A die interconnect 512(1), 512(2) of an RFIC 514(1), 514(2) in the antenna module 500 in FIG. 5A can be coupled to the respective metal interconnects 550(1), 550(2) to couple the RFIC 514(1), 514(2) to a respective patch antenna 504(1), 504(2).

Also, as shown in FIGS. 5C and 5D, the vertically-integrated patch antennas 504(1), 504(2) are formed as a generally planar-shaped structures, and in this example a rectangular-shaped structure, in the X-axis and Z-axis directions. As discussed above, the patch antennas 504(1), 504(2) are formed by connecting multiple metal interconnects 540(1), 540(2), 544(1), 544(2) each disposed in separate metallization layers 502(1)-502(6), 504(1)-504(6) of the package substrate 502. In this example, the multiple metal interconnects 540(1), 540(2), 544(1), 544(2) are connected together by the respective vias 542(1), 542(2), 546(1), 546(2) that are generally elongated in shape in a horizontal direction (X-axis direction) forming the via bars such that when connected to respective metal interconnects 540(1), 540(2), 544(1), 544(2), the patch antennas 504(1), 504(2) are formed as generally planar-shaped structures in a plane in the X-axis and Z-axis directions in the vertical plane $P_1$ in the package substrate 502 that can behave as a patch antenna, and thus is considered a patch antenna. These patch antennas 504(1), 504(2) are via bars in the sense that they are longer in one horizontal direction (X-axis direction) and narrower in another horizontal direction (Y-axis direction) in its metallization layer 532(1)-532(6), 534(1)-534(6). The via bars of each patch antenna 504(1), 504(2) are formed in a via trench in a respective metallization layer 532(1)-532(6), 534(1)-534(6) that has a depth in the vertical direction (Z-axis direction) and electrically coupled, by an intervening connected metal interconnect 540(1), 540(2), 544(1), 544 (2), to an adjacent via 542(1), 542(2), 546(1), 546(2) in an adjacent metallization layer 532(1)-532(6), 504(1)-504(6) thereby forming a single, vertical, trench-like structure in the package substrate 502. Thus, the resulting vertically-integrated patch antennas 504(1), 504(2) may be considered a "trench-shaped" patch antennas in the sense that it is a planar-shaped patch antenna, but integrated in a vertical direction (Z-axis direction) of the package substrate 502 in relation to horizontal metallization layers 502(1)-502(6), 504(1)-504(6) of the package substrate 502. The elongated vias 542(1), 542(2), 546(1), 546(2) each comprise a trench. The precise shape and the vertical planes $P_2$, $P_3$ of the patch antennas 504(1), 504(2) will depend on the length of the vias 542(1), 542(2), 546(1), 546(2) in the horizontal direction (Y-axis direction). The patch antennas 504(1), 504(2) are formed as generally rectangular planar-shaped structures in this example.

Note that in another exemplary aspect, the respective metal interconnects 540(1), 540(2) interconnected by the respective vias 542(1), 542(2) in the first metallization layers 506(1) do not have to be coupled to the respective metal interconnects 544(1), 544(2) interconnected by the respective vias 546(1), 546(2) in the second metallization layers 506(2). The metal posts 548(1), 548(2) that are shown in the core substrate 508 interconnecting the respective metal interconnects 540(1), 540(2) interconnected by the respective vias 542(1), 542(2) in the first metallization layers 506(1), to the respective metal interconnects 544(1), 544(2) interconnected by the respective vias 546(1), 546(2) in the second metallization layers 506(2) do not have to be included. In this manner, in this alternative aspect, the respective metal interconnects 540(1), 540(2) interconnected by the respective vias 542(1), 542(2) in the first metallization layers 506(1) would form a first patch antenna in the package substrate 502, and the respective metal interconnects 544(1), 544(2) interconnected by the respective vias 546(1), 546(2) in the second metallization layers 506(2) would each form four (4) separate patch antennas in the package substrate 502.

Figure 6:
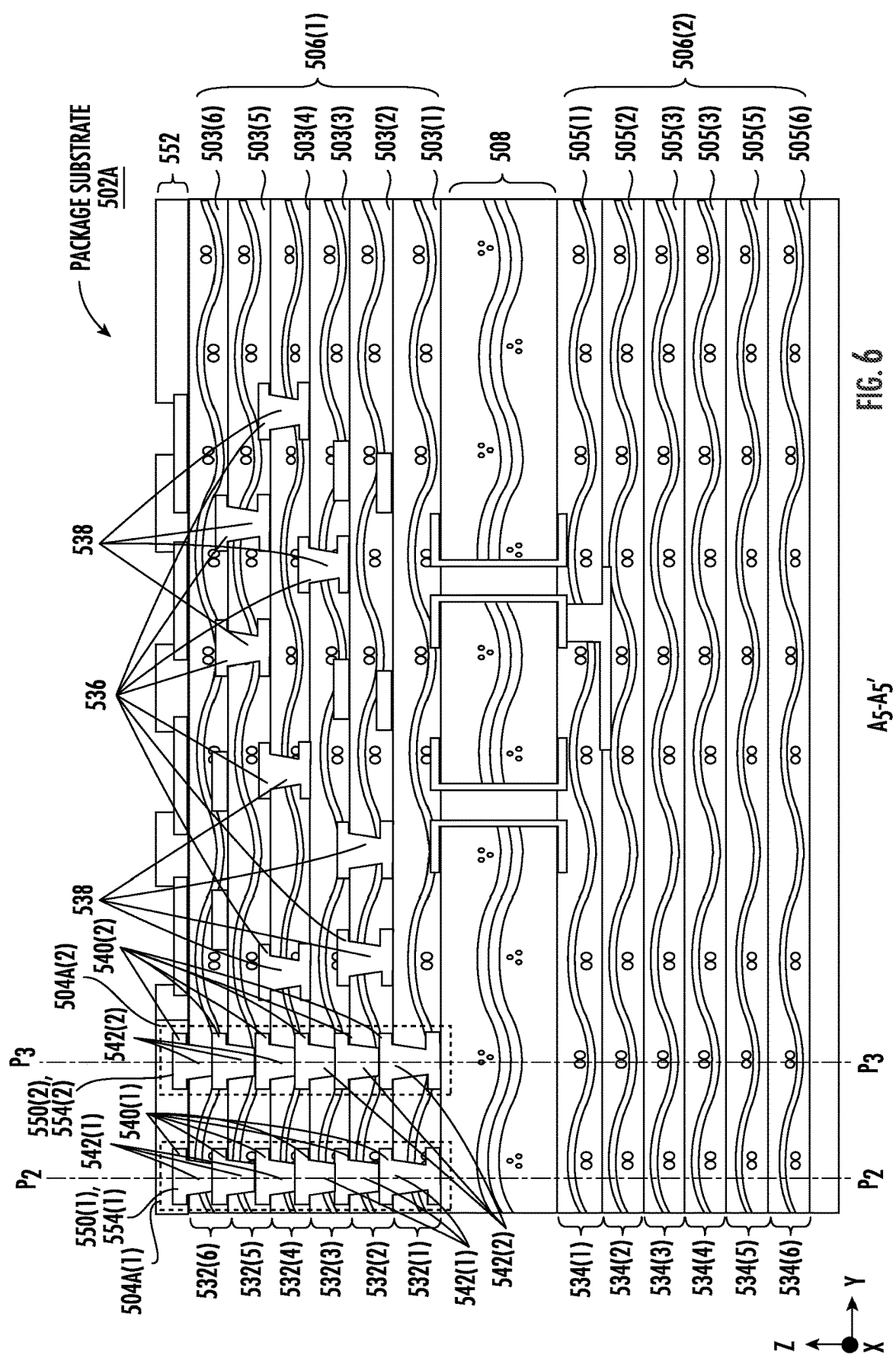
FIG. 6 is a side view of a package substrate that can be provided in the antenna module in FIGS. 5A and 5B illustrating the two (2) vertically-integrated, planar-shaped structures extending partially in a vertical direction in the package substrate.

FIG. 6 is a side view of an alternative package substrate 502A that can be provided as the package substrate 502 in the antenna module 500 in FIGS. 5A-5B where alternative vertically-integrated patch antennas 504A(1), 504A(2) are vertically integrated in the vertical direction (Z-axis direction) only in the first metallization layers 506(1). Common elements between the package substrate 502 in FIG. 5D and the package substrate 502A in FIG. 6 are shown with common element numbers. Thus, the discussion of these common elements in FIG. 5D is also applicable to the package substrate 502A in FIG. 6. The package substrate 502A in FIG. 6 is a cross-sectional side view along the $A_5$-$A_5$' cross-section line in the antenna module 500 in FIG. 5B. Thus, only two (2) patch antennas 504A(1), 504A(2) are shown from the side in the side view of the package substrate 502A in FIG. 6.

As shown in FIG. 6, the first metallization layers 506(1) include the plurality of metallization layers 532(1)-532(6) that are parallel to each other (e.g., stacked on each other) in the horizontal direction (X-axis and Y-axis directions) in respective horizontal planes like the package substrate 502 in FIG. 5D. Like provided in the package substrate 502 in FIG. 5D, the metallization layers 532(1)-532(6) in the first metallization layers 506(1) of the package substrate 502A in FIG. 6 include the respective metal interconnects 536 (e.g., metal lines, metal traces, metal posts) that are coupled to each other in adjacent metallization layers 532(1)-532(6) by vias 538 to form signal routing paths in the first metallization layers 506(1) to the die interconnects 512(1), 512(2) of a RFIC 514(1), 514(2) in FIG. 5A. The patch antennas 504A (1), 504A(2) are formed from a plurality of other respective metal interconnects 540(1), 540(2) (e.g., metal lines, metal traces, metal posts) in the respective separate metallization layers 532(1)-532(6) in the first metallization layers 506(1) that are aligned in the vertical direction (Z-axis direction) and share the respective common vertical planes $P_2$, $P_3$. The respective metal interconnects 540(1), 540(2) in adjacent metallization layers 532(1)-532(6) are coupled to each other by the respective vias 542(1), 542(2) disposed in the respective adjacent metallization layers 532(1)-532(6). The respective metal interconnects 540(1), 540(2) are disposed in parallel to each other in the horizontal direction (X-axis and Y-axis directions). In this manner, the respective metal interconnects 540(1), 540(2) connected by the respective vias 542(1), 542(2) form adjacent vertically-integrated planar metal structures in the first metallization layers 506(1) that form the patch antennas 504A(1), 504A(2) in this example.

In this manner, the respective metal interconnects 540(1), 540(2) interconnected by the respective vias 542(1), 542(2) in the first metallization layers 506(1) form the respective patch antennas 504A(1), 504A(2) in this example. Thus, the patch antennas 504A(1), 504A(2) do not extend into the core substrate 508 or the second metallization layers 506(2) of the package substrate 502A in this example in FIG. 6. Like the package substrate 502 in FIG. 5D, the metal interconnects 550(1), 550(2) formed in the solder resist layer 552 disposed on the metallization layer 532(6) of the first metallization layers 506(1) can serve as respective antenna feed lines 554(1), 554(2) to the patch antennas 504A(1), 504A(2). A die interconnect 512(1), 512(2) of an RFIC 514(1), 514(2) in the antenna module in FIG. 5A can be coupled to the metal interconnects 550(1), 550(2) to couple the RFIC 514(1), 514(2) to a respective patch antennas 504A(1), 504A(2).

Also, as shown in FIG. 6, the vertically-integrated patch antennas 504A(1), 504A(2) are formed as generally planar-shaped structures, and in this example a rectangular-shaped structure, in the X-axis and Z-axis directions. As discussed above, the patch antennas 504A(1), 504A(2) are formed by connecting multiple metal interconnects 540(1), 540(2) each disposed in separate metallization layers 502(1)-502(6) of the package substrate 502A. In this example, the multiple metal interconnects 540(1), 540(2), are connected together by the respective vias 542(1), 542(2) that are generally elongated in shape in a horizontal direction (X-axis direction) forming the via bars such that when connected to respective metal interconnects 540(1), 540(2), the patch antennas 504A(1), 504A(2) are formed as generally planar structures in a plane in the X-axis and Z-axis directions in the vertical plane $P_1$ in the package substrate 502A and can behave as a patch antenna, and thus is considered a patch antenna. These patch antennas 504A(1), 504A(2) are via bars in the sense that they are longer in one horizontal direction (X-axis direction) and narrower in another horizontal direction (Y-axis direction) in its metallization layer 532(1)-532(6). The via bars of each patch antenna 504A(1), 504A(2) are formed in a via trench in a respective metallization layer 532(1)-532(6) that has a depth in the vertical direction (Z-axis direction) and electrically coupled, by an intervening connected metal interconnect 540(1), 540(2), to an adjacent via 542(1), 542(2) in an adjacent metallization layer 532(1)-532(6) thereby forming a single, vertical, trench-like structure in the package substrate 502A. Thus, the resulting vertically-integrated patch antennas 504A(1), 504A(2) may be considered a "trench-shaped" patch antennas in the sense that it is a planar-shaped patch antenna, but integrated in a vertical direction (Z-axis direction) of the package substrate 502A in relation to horizontal metallization layers 502(1)-502(6) of the package substrate 502A. The elongated vias 542(1), 542(2) each comprise a trench. The precise shape and the vertical planes $P_2$, $P_3$ of the patch antennas 504A(1), 504A(2) will depend on the length of the vias 542(1), 542(2) in the horizontal direction (Y-axis direction). The patch antennas 504A(1), 504A(2) are formed as generally rectangular planar-shaped structures in this example.

Note that alternatively, the package substrate 502A in FIG. 6 could be provided such that the patch antennas are provided in the second metallization layers 506(2) and not in the first metallization layers 506(1). In this regard, like shown in the package substrate 502 in FIG. 5D, in this alternative aspect, the patch antennas would be formed of the plurality of other respective metal interconnects 544(1), 544(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_2$, $P_3$.

Figure 7:
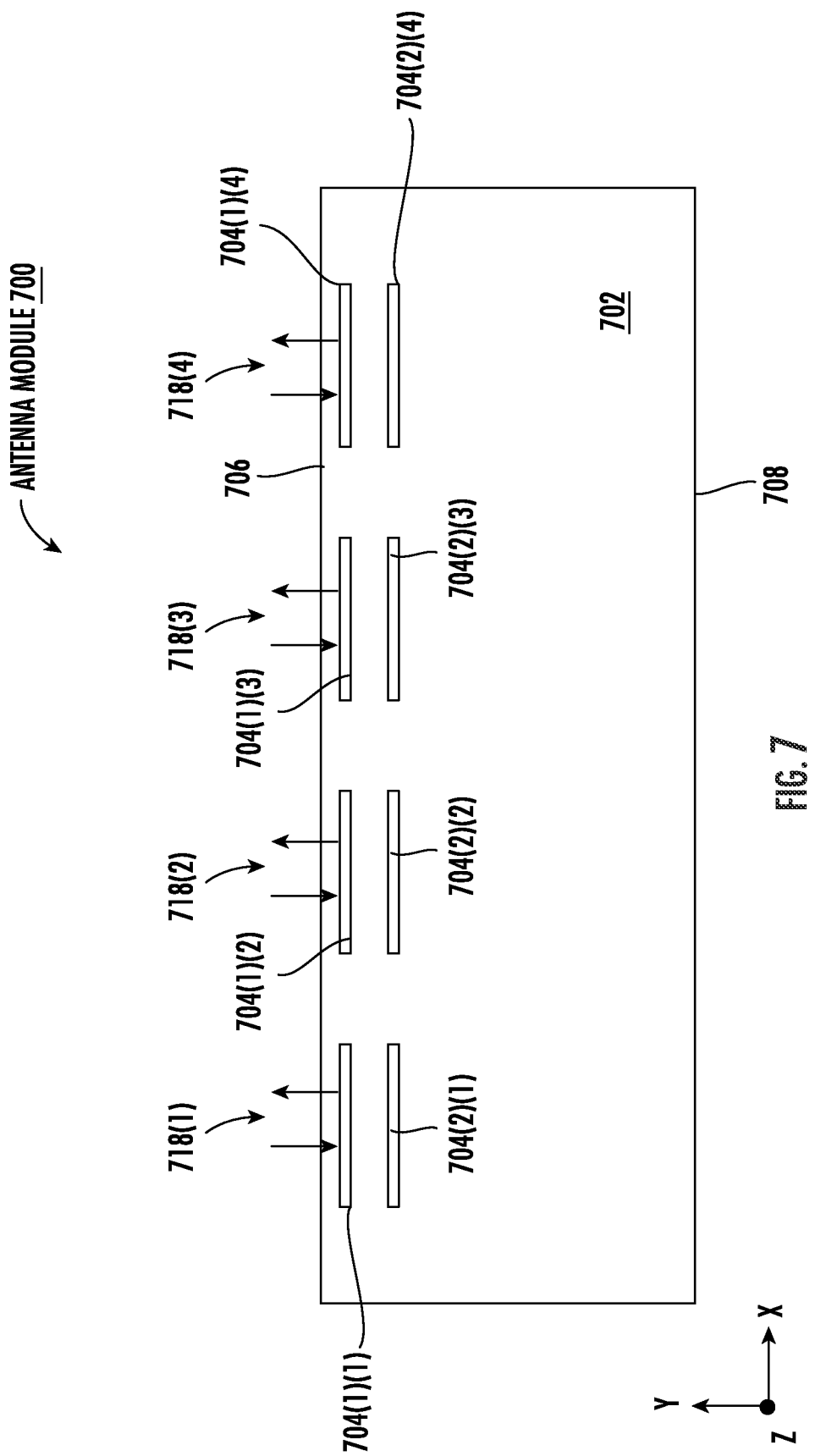
FIG. 7 is a bottom view of another package substrate that can be provided in an antenna module that includes vertically-integrated patch antennas disposed on an opposite elongated side of the package substrate opposite from the package substrate in FIG. 5B.

Other alternatives are also possible. For example, FIG. 7 is a bottom view of another package substrate 702 that can be provided in an antenna module 700 that can be similar to the antenna modules 200, 500 in FIGS. 2A and 5A. The package substrate 702 includes vertically-integrated patch antennas 704(1)(1)-704(1)(4), 704(2)(1)-704(2)(4) similar in shape to the patch antennas 504(1)(1)-504(1)(4), 504(2)(1)-504(2)(4) in the package substrate 502 in FIGS. 5A-5B. However, in the package substrate 702 in FIG. 7, the vertically-integrated patch antennas 704(1)(1)-704(1)(4), 704(2)(1)-704(2)(4) are disposed adjacent to a second side 706 of the package substrate 702 that is elongated in the X-axis direction, opposite from a first side 708 of the package substrate 702 that is elongated in the X-axis direction. Like the patch antennas 504(1)(1)-504(1)(4), 504(2)(1)-504(2)(4) in the package substrate 502 in FIGS. 5A-5B, the patch antennas 704(2)(1)-704(2)(4) are configured to be EM coupled to the respective patch antennas 704(1)(1)-704(1)(4), which radiate coupled RF signals received through an antenna feed line by the patch antennas 704(2)(1)-704(2)(4). The radiation patterns of the patch antennas 704(1)(1)-704(1)(4) are shown in respective first and second horizontal directions 718(1)-718(4) in the Y-axis direction by the nature of the vertical orientation of the patch antennas 704(1)(1)-704(1)(4) in the vertical direction (Z-axis direction) and their planar structure in the X-axis and Z-axis directions. The more detailed exemplary illustrations of structures of the patch antennas 504(1)(1)-504(1)(4) in FIGS. 5D and 6 can also be employed for the patch antennas 704(1)(1)-704(1)(4) in FIG. 7.

Figure 8:
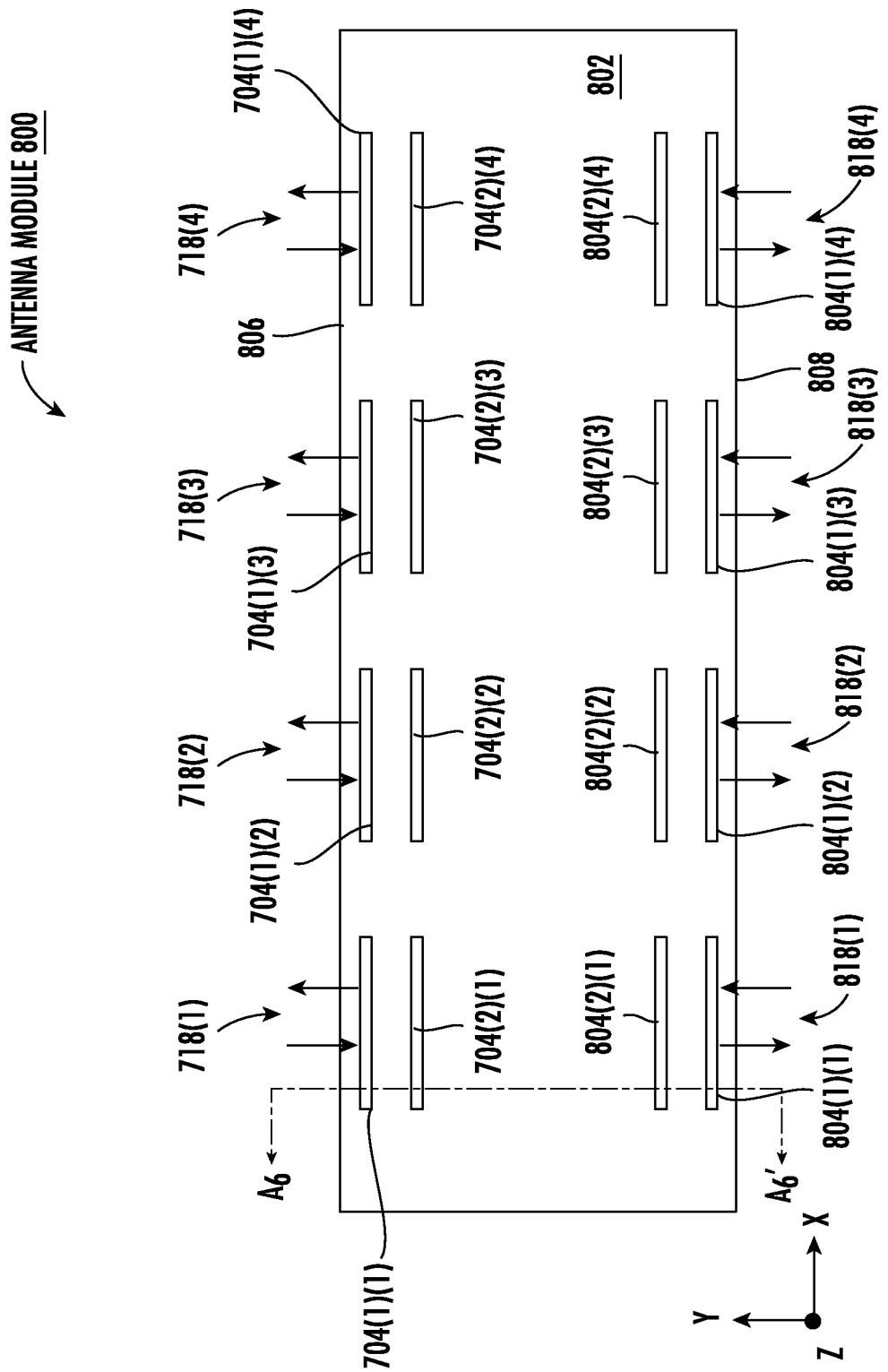
FIG. 8 is a bottom view of another package substrate that can be provided in an antenna module that includes vertically-integrated patch antennas disposed on both elongated sides of the package substrate.

FIG. 8 is a bottom view of another package substrate 802 that can be provided in an antenna module 800 that can be similar to the antenna modules 200, 500 in FIGS. 2A and 5A. The package substrate 802 that includes the vertically-integrated patch antennas 704(1)(1)-704(1)(4), 704(2)(1)-704(2)(4) is disposed adjacent to a second side 806 of the package substrate 802 that is elongated in the X-axis direction, opposite from a first side 808 of the package substrate 802 that is elongated in the X-axis direction. Common elements between the package substrate 702 in FIG. 7 and the package substrate 702 in FIG. 8 share common element numbers and the description of those common elements in FIG. 7 is also applicable for the package substrate 802 in FIG. 8. However, in the package substrate 802 in FIG. 8, additional vertically-integrated patch antennas 804(1)(1)-804(1)(4), 804(2)(1)-804(2)(4) are disposed adjacent to the first side 808 of the package substrate 802. Like the patch antennas 704(1)(1)-704(1)(4), 704(2)(1)-704(2)(4), the patch antennas 804(2)(1)-804(2)(4) are configured to be EM coupled to the respective patch antennas 804(1)(1)-804(1)(4), which radiate coupled RF signals received through an antenna feed line by the patch antennas 804(2)(1)-804(2)(4). The radiation patterns of the patch antennas 804(1)(1)-804(1)(4) are shown in respective first and second horizontal directions 818(1)-818(4) in the Y-axis direction by the nature of the vertical orientation of the patch antennas 804(1)(1)-804(1)(4) in the vertical direction (Z-axis direction) and their planar structure in the X-axis and Z-axis directions.

Figure 9A:
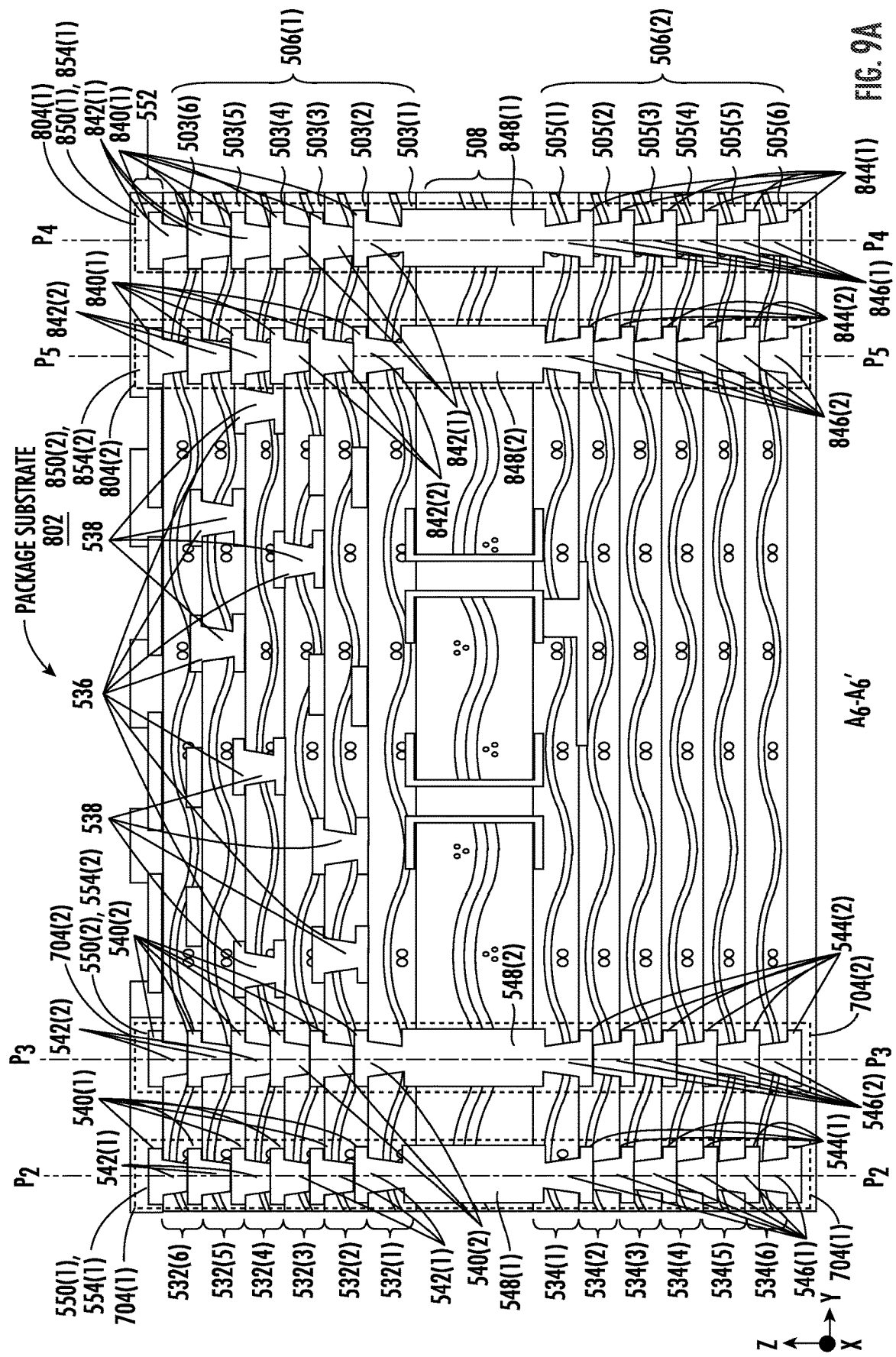
FIG. 9A is a side view of a package substrate that can be provided in the antenna module in FIG. 8 illustrating the two (2) vertically-integrated patch antennas extending fully in a vertical direction through the package substrate.

FIG. 9A is a side view of the package substrate 802 in the antenna module 800 in FIG. 8 to illustrate an example of the patch antennas 704(1)(1)-704(1)(4), 704(2)(1)-704(2)(4), 804(1)(1)-804(1)(4), 804(2)(1)-804(2)(4). The package substrate 802 in FIG. 9A is a cross-sectional side view along the $A_6$-$A_6'$ cross-section line in the antenna module 800 in FIG. 8. Thus, only four (4) patch antennas are shown from the side in the side view of the package substrate 802 in FIG. 9A. In this example, patch antennas 704(1), 704(2) are shown that can be any of the respective pairs of patch antennas 704(1)(1)-704(1)(4), 704(2)(1)-704(2)(4) in the package substrate 802 in FIG. 8. In this example, the patch antennas 704(1), 704(2) can be structured like the patch antennas 504(1), 504(2) in FIG. 5D, which is shown with common element numbers in FIG. 8. The description of the patch antennas 504(1), 504(2) in FIG. 5D is applicable to the patch antennas 704(1), 704(2) in the package substrate 802 in this example and thus will not be re-described.

As shown in FIG. 9A, the package substrate 802 includes the first metallization layers 506(1) that include the plurality of metallization layers 532(1)-532(6) that are parallel to each other (e.g., stacked on each other) in a horizontal direction (X-axis and Y-axis directions) in respective horizontal planes as provided in package substrate 502 in FIG. 5D. The second metallization layers 506(2) also include plurality of metallization layers 534(1)-534(6) that are parallel to each other in a horizontal direction (X-axis and Y-axis directions) in respective horizontal planes. The first metallization layers 506(1) are coupled to the core substrate 508, with the metallization layer 532(1) being directly coupled to the core substrate 508. The second metallization layers 506(2) are also coupled to the core substrate 508, with the metallization layer 534(1) being directly coupled to the core substrate 508. In this regard, the core substrate 508 is disposed between the first and second metallization layers 506(1), 506(2). The metallization layers 532(1)-532(6) in the first metallization layers 506(1) include respective metal interconnects 536 (e.g., metal lines, metal traces, metal posts) that are coupled to each other in adjacent metallization layers 532(1)-532(6) by vias 538 to form signal routing paths in the first metallization layers 506(1).

In this example, the package substrate 802 also includes the additional patch antennas 804(1), 804(2) that are shown that can be any of the respective pairs of patch antennas 804(1)(1)-804(1)(4), 804(2)(1)-804(2)(4) in the package substrate 802 in FIG. 8. The patch antennas 804(1), 804(2) are formed from a plurality of other metal interconnects 840(1), 840(2) (e.g., metal lines, metal traces, metal posts) in the respective separate metallization layers 532(1)-532(6) in the first metallization layers 506(1) that are aligned in the vertical direction (Z-axis direction) and share respective common vertical planes $P_4$, $P_5$ in the X-axis and Z-axis directions. The respective metal interconnects 840(1), 840(2) in adjacent metallization layers 532(1)-532(6) are coupled to each other by respective metal vias ("vias") 842(1), 842(2) disposed in the respective adjacent metallization layers 532(1)-532(6). The respective metal interconnects 840(1), 840(2) are disposed in parallel to each other in the horizontal direction (X-axis and Y-axis directions). In this manner, the metal interconnects 840(1), 840(2) connected by the respective vias 842(1), 842(2) form vertically integrated planar metal structures in the first metallization layers 506(1) that form part of the respective patch antennas 804(1), 804(2).

Also in this example, the patch antennas 804(1), 804(2) also include a respective vertical planar-shaped structure that is formed from a plurality of metal interconnects 844(1), 844(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_4$, $P_5$. The respective metal interconnects 844(1), 844(2) in adjacent metallization layers 534(1)-534(6) are coupled to each other by the respective metal vias ("vias") 846(1), 846(2) disposed in the respective adjacent metallization layers 534(1)-534(6). The respective metal interconnects 844(1), 844(2) are disposed in parallel to each other in the horizontal direction (X-axis and Y-axis directions). In this manner, the respective metal interconnects 844(1), 844(2) connected by the respective vias 846(1), 846(2) form respective vertically-integrated planar metal structures in the second metallization layers 506(2) that forms part of the patch antennas 804(1), 804(2). The core substrate 508 includes respective metal posts 848(1), 848(2) that are coupled to the respective metal interconnects 840(1), 840(2) in the metallization layer 532(1) in the first metallization layers 506(1) and to the respective metal interconnects 844(1), 844(2) in the metallization layer 534(1) in the second metallization layers 506(2).

In this manner, the respective metal interconnects 840(1), 840(2) interconnected by the respective vias 842(1), 842(2) in the first metallization layers 506(1), the respective metal interconnects 844(1), 844(2) interconnected by the respective vias 846(1), 846(2) in the second metallization layers 506(2), and the respective metal posts 848(1), 848(2) form the respective patch antennas 804(1), 804(2) in this example. The patch antennas 804(1), 804(2) each extend all the way through all layers of the package substrate 802 in this example in FIG. 8. The patch antennas 804(1), 804(2) extend in the vertical direction (Z-axis direction) through each of the metallization layers 532(1)-532(6) in the first metallization layers 506(1), through each of the metallization layers 534(1)-534(6) in the second metallization layers 506(2), and also through the core substrate 508 in this example. Metal interconnects 850(1), 850(2) formed in the solder resist layer 552 disposed on the metallization layer 532(6) of the first metallization layers 506(1) can serve as respective antenna feed lines 854(1), 854(2) to the respective patch antennas 804(1), 804(2).

Also, as shown in FIG. 9A, the vertically-integrated patch antennas 704(1), 704(2), 804(1), 804(2) are formed as a generally planar-shaped structures, and in this example a rectangular-shaped structure, in the X-axis and Z-axis directions. As discussed above, the patch antennas 704(1), 704(2), 804(1), 804(2) are formed by connecting multiple metal interconnects 540(1), 540(2), 544(1), 544(2), 840(1), 840(2), 844(1), 844(2) each disposed in separate metallization layers 502(1)-502(6), 504(1)-504(6) of the package substrate 802. In this example, the multiple metal interconnects 540(1), 540(2), 544(1), 544(2), 840(1), 840(2), 844(1), 844(2) are connected together by the respective vias 542(1), 542(2), 546(1), 546(2), 842(1), 842(2), 846(1), 846(2) that are generally elongated in shape in a horizontal direction (X-axis direction) forming the via bars such that when connected to respective metal interconnects 540(1), 540(2), 544(1), 544(2), 840(1), 840(2), 844(1), 844(2), the patch antennas 704(1), 704(2), 804(1), 804(2) are formed as generally planar structures in a plane in the X-axis and Z-axis directions in the vertical planes $P_2$, $P_3$, $P_4$, $P_5$ in the package substrate 802 that can behave as a patch antenna, and thus is considered a patch antenna. These patch antennas 704(1), 704(2), 804(1), 804(2) are via bars in the sense that they are longer in one horizontal direction (X-axis direction) and narrower in another horizontal direction (Y-axis direction) in its metallization layer 532(1)-532(6), 534(1)-534(6). The via bars of each patch antenna 704(1), 704(2), 804(1), 804(2) are formed in a via trench in a respective metallization layer 532(1)-532(6), 534(1)-534(6) that has a depth in the vertical direction (Z-axis direction) and is electrically coupled, by an intervening connected metal interconnect 540(1), 540(2), 544(1), 544(2), 840(1), 840(2), 844(1), 844(2), to a respective adjacent via 542(1), 542(2), 546(1), 546(2), 842(1), 842(2), 846(1), 846(2) in an adjacent metallization layer 532(1)-532(6), 534(1)-534(6) thereby forming a single, vertical, trench-like structure in the package substrate 802. Thus, the resulting vertically-integrated patch antennas 704(1), 704(2), 804(1), 804(2) may be considered "trench-shaped" patch antennas in the sense that they are planar-shaped patch antennas, but are integrated in a vertical direction (Z-axis direction) of the package substrate 802 in relation to horizontal metallization layers 502(1)-502(6), 504(1)-504(6) of the package substrate 802. The elongated vias 542(1), 542(2), 546(1), 546(2), 842(1), 842(2), 846(1), 846(2) each comprise a trench. The precise shape and the vertical planes $P_2$, $P_3$, $P_4$, $P_5$ of the patch antennas 704(1), 704(2), 804(1), 804(2) will depend on the length of the vias 542(1), 542(2), 546(1), 546(2), 842(1), 842(2), 846(1), 846(2) in the horizontal direction (Y-axis direction). The patch antennas 704(1), 704(2), 804(1), 804(2) are formed as generally rectangular planar-shaped structures in this example.

Note that in another exemplary aspect, the respective metal interconnects 540(1), 540(2) interconnected by the respective vias 542(1), 542(2) in the first metallization layers 506(1) do not have to be coupled to the respective metal interconnects 544(1), 544(2) interconnected by the respective vias 546(1), 546(2) in the second metallization layers 506(2). The metal posts 548(1), 548(2) that are shown in the core substrate 508 interconnecting the respective metal interconnects 540(1), 540(2) interconnected by the respective vias 542(1), 542(2) in the first metallization layers 506(1), to the respective metal interconnects 544(1), 544(2) interconnected by the respective vias 546(1), 546(2)

in the second metallization layers 506(2) do not have to be included. In this manner, in this alternative aspect, the respective metal interconnects 540(1), 540(2) interconnected by the respective vias 542(1), 542(2) in the first metallization layers 506(1) would form a first patch antenna in the package substrate 802, and the respective metal interconnects 544(1), 544(2) interconnected by the respective vias 546(1), 546(2) in the second metallization layers 506(2) would each form four (4) separate patch antennas in the package substrate 802.

Also note that in another exemplary aspect, the respective metal interconnects 840(1), 840(2) interconnected by the respective vias 842(1), 842(2) in the first metallization layers 506(1) do not have to be coupled to the respective metal interconnects 844(1), 844(2) interconnected by the respective vias 846(1), 846(2) in the second metallization layers 506(2). The metal posts 848(1), 848(2) that are shown in the core substrate 508 interconnecting the respective metal interconnects 840(1), 840(2) interconnected by the respective vias 842(1), 842(2) in the first metallization layers 506(1), to the respective metal interconnects 844(1), 844(2) interconnected by the respective vias 846(1), 846(2) in the second metallization layers 506(2) do not have to be included. In this manner, in this alternative aspect, the respective metal interconnects 840(1), 840(2) interconnected by the respective vias 842(1), 842(2) in the first metallization layers 506(1) would form a first patch antenna in the package substrate 802, and the respective metal interconnects 844(1), 844(2) interconnected by the respective vias 846(1), 846(2) in the second metallization layers 506(2) would each form four (4) separate patch antennas in the package substrate 802.

FIG. 9B is a side view of an alternative package substrate 802A similar to the package substrate 802 in FIG. 9A where the patch antennas 704A(1), 704A(2), and alternative patch antennas 804A(1), 804A(2) are vertically integrated in the vertical direction (Z-axis direction) only in the first metallization layers 506(1). Common elements between the package substrate 802 in FIG. 9A and the package substrate 802A in FIG. 9B are shown with common element numbers. Thus, the discussion of these common elements in FIG. 9A is also applicable to the package substrate 802A in FIG. 9B. The package substrate 802A in FIG. 9B is a cross-sectional side view along the $A_6$-$A_6'$ cross-section line in the package substrate 802 in FIG. 8.

As shown in FIG. 9B, the patch antennas 704A(1), 704A(2) are formed from a plurality of other respective metal interconnects 540(1), 540(2) (e.g., metal lines, metal traces, metal posts) in the respective separate metallization layers 532(1)-532(6) in the first metallization layers 506(1) that are aligned in the vertical direction (Z-axis direction) and share the respective common vertical planes $P_2$, $P_3$. The respective metal interconnects 540(1), 540(2) in adjacent metallization layers 532(1)-532(6) are coupled to each other by the respective vias 542(1), 542(2) disposed in the respective adjacent metallization layers 532(1)-532(6). The respective metal interconnects 540(1), 540(2) are disposed in parallel to each other in the horizontal direction (X-axis and Y-axis directions). In this manner, the respective metal interconnects 540(1), 540(2) connected by the respective vias 542(1), 542(2) form adjacent vertically-integrated planar-shaped metal structures in the first metallization layers 506(1) that form the patch antennas 704A(1), 704A(2) in this example.

In this manner, the respective metal interconnects 540(1), 540(2) interconnected by the respective vias 542(1), 542(2) in the first metallization layers 506(1) form the respective patch antennas 704A(1), 704A(2) in this example. Thus, the patch antennas 704A(1), 704A(2) do not extend into the core substrate 508 or the second metallization layers 506(2) of the package substrate 802A in this example in FIG. 9B. Like the package substrate 802 in FIG. 9A, the metal interconnects 550(1), 550(2) formed in the solder resist layer 552 disposed on the metallization layer 532(6) of the first metallization layers 506(1) can serve as respective antenna feed lines 554(1), 554(2) to the patch antennas 704A(1), 704A(2).

As also shown in FIG. 9B, the patch antennas 804A(1), 804A(2) are formed from a plurality of other respective metal interconnects 840(1), 840(2) (e.g., metal lines, metal traces, metal posts) in the respective separate metallization layers 532(1)-532(6) in the first metallization layers 506(1) that are aligned in the vertical direction (Z-axis direction) and share the respective common vertical planes $P_4$, $P_5$. The respective metal interconnects 840(1), 840(2) in adjacent metallization layers 532(1)-532(6) are coupled to each other by the respective vias 842(1), 842(2) disposed in the respective adjacent metallization layers 532(1)-532(6). The respective metal interconnects 840(1), 840(2) are disposed in parallel to each other in the horizontal direction (X-axis and Y-axis directions). In this manner, the respective metal interconnects 840(1), 840(2) connected by the respective vias 842(1), 842(2) form adjacent vertically-integrated planar-shaped metal structures in the first metallization layers 506(1) that form the patch antennas 804A(1), 804A(2) in this example.

In this manner, the respective metal interconnects 840(1), 840(2) interconnected by the respective vias 842(1), 842(2) in the first metallization layers 506(1) form the respective patch antennas 804A(1), 804A(2) in this example. Thus, the patch antennas 804A(1), 804A(2) do not extend into the core substrate 508 or the second metallization layers 506(2) of the package substrate 802A in this example in FIG. 9B. Like the package substrate 802 in FIG. 9A, the metal interconnects 850(1), 850(2) formed in the solder resist layer 552 disposed on the metallization layer 532(6) of the first metallization layers 506(1) can serve as respective antenna feed lines 854(1), 854(2) to the patch antennas 804A(1), 804A(2).

Also, as shown in FIG. 9B, the vertically-integrated patch antennas 704A(1), 704A(2), 804A(1), 804A(2) are formed as a generally planar-shaped structures, and in this example a rectangular-shaped structure, in the X-axis and Z-axis directions. As discussed above, the patch antennas 704A(1), 704A(2), 804A(1), 804A(2) are formed by connecting multiple metal interconnects 540(1), 540(2) 840(1), 840(2) each disposed in separate metallization layers 502(1)-502(6) of the package substrate 802A. In this example, the multiple metal interconnects 540(1), 540(2), 840(1), 840(2) are connected together by the respective vias 542(1), 542(2), 842(1), 842(2) that are generally elongated in shape in a horizontal direction (X-axis direction) forming the via bars such that when connected to respective metal interconnects 540(1), 540(2), 840(1), 840(2), the patch antennas 704A(1), 704A(2), 804A(1), 804A(2) are formed as generally planar structures in a plane in the X-axis and Z-axis directions in the vertical planes $P_2$, $P_3$, $P_4$, $P_5$ in the package substrate 802 that can behave as patch antennas, and thus are considered patch antennas. These patch antennas 704A(1), 704A(2), 804A(1), 804A(2) are via bars in the sense that they are longer in one horizontal direction (X-axis direction) and narrower in another horizontal direction (Y-axis direction) in its metallization layer 532(1)-532(6). The via bars of each patch antenna 704A(1), 704A(2), 804A(1), 804A(2) are formed in a via trench in a respective metallization layer 532(1)-532(6) that has a depth in the vertical direction (Z-axis direction) and are electrically coupled, by an intervening connected metal interconnect 540(1), 540(2), 840(1), 840(2), to a respective adjacent via 542(1), 542(2), 842(1), 842(2) in an adjacent metallization layer 532(1)-532(6), 534(1)-534(6) thereby forming a single, vertical, trench-like structure in the package substrate 802A. Thus, the resulting vertically-integrated patch antennas 704A(1), 704A(2), 804A(1), 804A(2) may be considered a "trench-shaped" patch antennas in the sense that it is a planar-shaped patch antenna, but integrated in a vertical direction (Z-axis direction) of the package substrate 802A in relation to horizontal metallization layers 532(1)-532(6) of the package substrate 802A. The elongated vias 542(1), 542(2), 842(1), 842(2) each comprise a trench. The precise shape and the vertical planes $P_2$, $P_3$, $P_4$, $P_5$ of the patch antennas 704A(1), 704A(2), 804A(1), 804A(2) will depend on the length of the vias 542(1), 542(2), 842(1), 842(2) in the horizontal direction (Y-axis direction). The patch antennas 704A(1), 704A(2), 804A(1), 804A(2) are formed as generally rectangular planar-shaped structures in this example.

Note that alternatively, the package substrate 802A in FIG. 9B could be provided such that the patch antennas are provided in the second metallization layers 506(2) and not in the first metallization layers 506(1). In this regard, like shown in the package substrate 802 in FIG. 9A, in this alternative aspect, patch antennas would be formed of the plurality of other respective metal interconnects 544(1), 544(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_2$, $P_3$. Also in this regard, like shown in the package substrate 802 in FIG. 9A, in this alternative aspect, patch antennas would be formed of the plurality of other respective metal interconnects 844(1), 844(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_4$, $P_5$.

In other exemplary aspects, a package substrate that includes a vertically-integrated patch antenna(s), including without limitation any of the package substrates 202, 502, 502A, 702, 802, 802A in FIGS. 2-9B, can include other patch antennas that are horizontally-integrated in the package substrate by being disposed horizontally in an X-axis and Y-axis directions in a metallization layer(s) of the package substrate. The antenna radiation patterns of such other horizontally-integrated patch antennas extend out from the bottom of the package substrate in the vertical direction orthogonal to the antenna radiation pattern of the patch antenna(s). In this manner, inclusion of vertically-integrated patch antenna(s) and such horizontally-integrated patch antenna(s) would provide multiple directions of antenna radiation coverage in the antenna module. For example, it may be important to provide additional antennas in the antenna module to support the multi-directionality RF reception and/or multiple input, multiple output (MIMO) communications, such as millimeter wave (mmWave) applications in the fifth generation (5G) new radio (NR) spectrum.

Figure 10C:
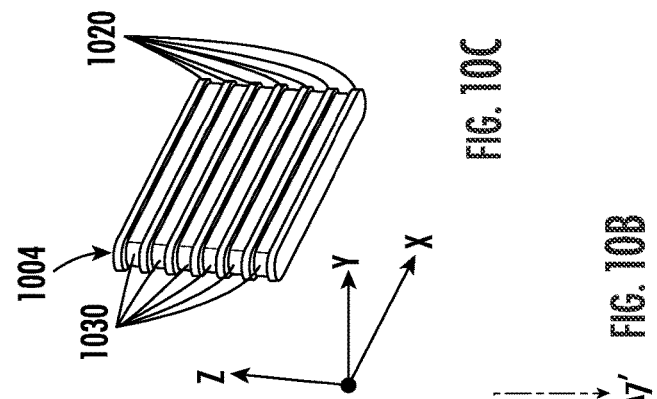
FIG. 10C is a side perspective view showing a break-out of a vertically-integrated patch antenna formed in the package substrate in FIGS. 10A and 10B.
Figure 10A:
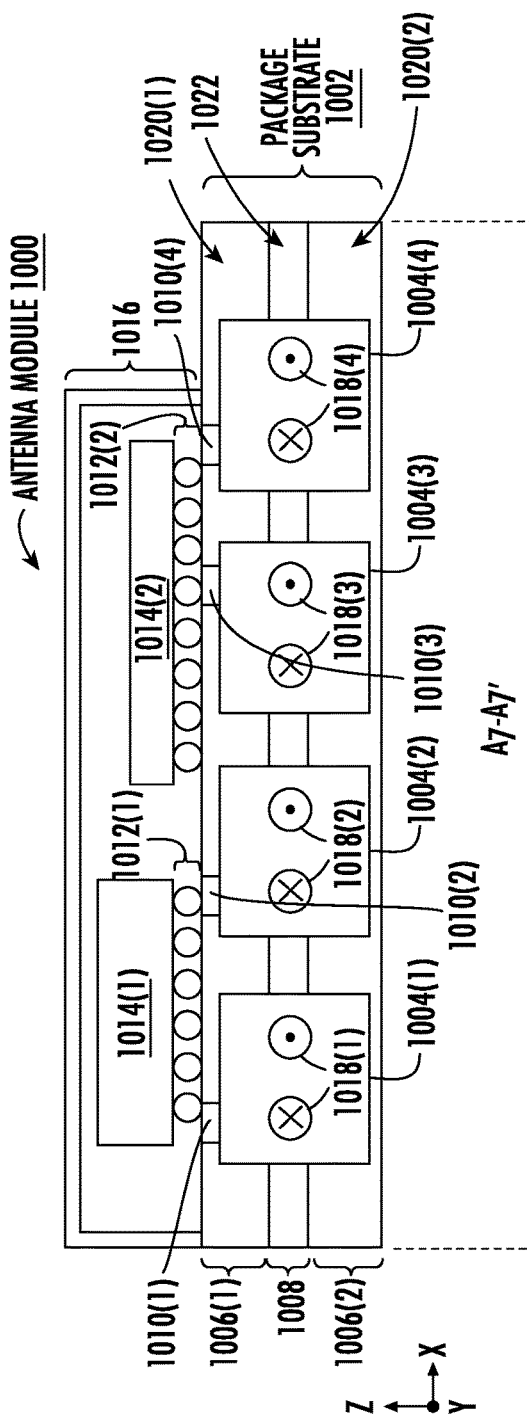
FIGS. 10A and 10B are respective side and bottom views of another exemplary antenna module that includes a package substrate with a patch antenna formed as two (2) vertically-integrated adjacent planar-shaped structures formed in adjacent metallization layers therein, and with horizontally-integrated patch antennas formed in the metallization layers of the package substrate.

In this regard, FIG. 10A is a respective side view of an exemplary antenna module 1000 that includes a package substrate 1002 that includes multiple patch antennas 1004 (1)-1004(4) similar to the package substrate 502 in FIG. 5A. FIG. 10A is a side view along the cross-section line $A_7$-$A_7'$ of the bottom view of the antenna module 1000 and package substrate 1002 in FIG. 10B. The patch antennas 1004(1)-1004(4) are planar structures in the X- and Z-axis directions that are vertically integrated in the vertical direction (Z-axis direction) in adjacent metallization layers in the package substrate 1002 for supporting RF communications. The patch antennas 1004(1)-1004(4) being planar structures behave as patch antennas. The patch antennas 1004(1)-1004 (4) are configured to radiate RF signals. As an example, the patch antennas 1004(1)-1004(4) may be designed for millimeter wave (mmWave) reception, including RF signals in the fifth generation (5G) new radio (NR) spectrum. Also, discussed in more detail below, and as shown in the bottom view of the package substrate 1002 in FIG. 10B, the package substrate 1002 in this example also includes eight (8) additional patch antennas 1005(1)(1)-1005(1)(4), 1005(2) (1)-1005(2)(4). The bottom view of the package substrate 1002 in FIG. 10B only illustrates the bottom patch antenna 1005(1)(1)-1005(1)(4). However, the side perspective view in FIG. 10C shows a break-out of a patch antenna 1004 in relation to two (2) adjacent patch antennas 1005(1), 1005(2), which can be any pair of respective patch antennas 1005(1) (1)-1005(1)(4), 1005(2)(1)-1005(2)(4). As discussed below, in this example, each patch antenna 1005(2)(1)-1005(2)(4) is configured to be EM coupled to a respective patch antenna 1005(1)(1)-1005(1)(4) to radiate RF signals. As also discussed in more detail below, the patch antennas 1005(1)(1)-1005(1)(4), 1005(2)(1)-1005(2)(4) are formed from metal lines or traces in a metallization layer in package substrate 502 as planar structures in the horizontal X-axis and Y-axis directions. Thus, the patch antennas 1005(1)(1)-1005(1)(4), 1005(2)(1)-1005(2)(4) provide additional radiation pattern coverage orthogonal to the radiation pattern of the patch antennas 1004(1)-1004(4) to provide for the antenna module 1000 to have multi-directional antenna pattern coverage.

In this example, the patch antennas 1004(1)-1004(4) are disposed vertically in the vertical direction (Z-axis direction) in and through first metallization layers 1006(1) in the package substrate 1002. The metallization layers 1006(1) are disposed in a horizontal direction in a horizontal plane in the X-axis and Y-axis directions in this example. In this example, the patch antennas 1004(1)-1004(4) are also disposed vertically in the vertical direction (Z-axis direction) in and through a core substrate 1008 and second metallization layers 1006(2) of the package substrate 1002 that are both are disposed in a horizontal direction in a horizontal plane in the X-axis and Y-axis directions as well. The patch antennas 1004(1)-1004(4) are coupled through respective antenna feed lines 1010(1)-1010(4) to die interconnects 1012(1), 1012(2) of one or more RFICs 1014(1), 1014(2) in an IC die layer 1016 that include RF transceiver circuitry to support RF communications. In this regard, the antenna module 1000 can also be thought of as a RFIC package. The radiation patterns of the patch antennas 1004(1)-1004(4) are in first and second horizontal directions 1019(1)-1019(4) in the Y-axis direction by the nature of their vertical orientation in the vertical direction (Z-axis direction) and their planar structure in the X-axis and Z-axis directions. Thus, the patch antennas 1004(1)-1004(4) can be formed in package substrate 202 to provide this antenna radiation pattern with or without other antennas to provide reception antenna coverage in the first and second horizontal directions 1019(1)-1019(4). Note that although four (4) patch antennas 1004 (1)-1004(4) are included in the antenna module 200 in this example, such is not limiting.

Figure 10B:
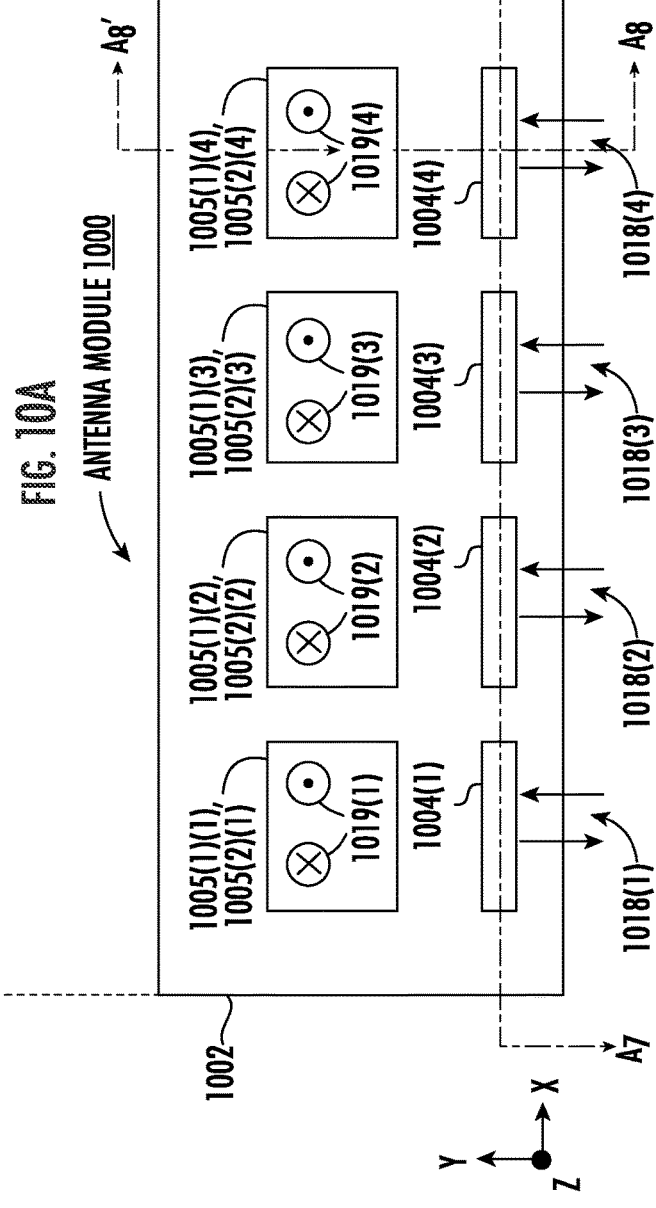

The patch antennas 1005(1)(1)-1005(1)(4), 1005(2)(1)-1005(2)(4) are disposed horizontally in the horizontal direction (X- and Y-axis direction) in a metallization layer in the first metallization layers 1006(1) in the package substrate 1002. The patch antennas 1005(2)(1)-1005(2)(4) are coupled through respective patch antenna feed lines to die interconnects 1012(1), 1012(2) of one or more RFICs 1014(1), 1014(2) in an IC die layer 1016 that include RF transceiver circuitry to support RF communications. In this example, the patch antennas 1005(1)(1)-1005(1)(4) are EM coupled to respective patch antennas 1005(2)(1)-1005(2)(4) when the patch antennas 1005(2)(1)-1005(2)(4) receive a RF signal. The radiation patterns of the patch antennas 1005(1)(1)-1005(1)(4) are in first and second vertical directions 1019(1)-1019(4) in the vertical direction (Z-axis direction) as shown in FIG. 10B by the nature of their horizontal orientation in the horizontal direction (X-axis and Y-axis directions) and their planar structure in the X-axis and Y-axis. Thus, the patch antennas 1005(1)(1)-1005(1)(4), 1005(2)(1)-1005(2)(4) can be formed in package substrate 1002 to provide this additional radiation pattern to provide reception antenna coverage in the first and second vertical directions 1019(1)-1019(4). Note that although four (4) pairs patch antennas 1005(1)(1)-1005(1)(4), 1005(2)(1)-1005(2)(4) are included in the antenna module 1000 in this example, such is not limiting. For example, patch antennas could be provided that do not have an EM coupled, paired patch antenna.

As will be discussed in more detail below, the first and second metallization layers 1006(1), 1006(2) in the antenna module 1000 in FIGS. 10A and 10B each include metal interconnects 1020(1), 1020(2) that are formed therein for the routing of signals between the RFICs 1014(1), 1014(2) and the package substrate 1002. As discussed in more detail below, in certain examples, the patch antenna 1004(1)-1004(4) are formed by adjacent interconnected vias and metal interconnects 1020(1), 1020(2) each disposed in separate metallization layers of in the first and second metallization layers 1006(1), 1006(2) connected together through metal posts 1018 in the core substrate 1008. In this manner, the patch antennas 1004(1)-1004(4) can be formed as vertically integrated structures in the package substrate 1002 using fabrication methods used for fabricating metal interconnects and vias (e.g., a micro via fabrication process) in package substrates. The performance of the patch antennas 1004(1)-1004(4) can be controlled by controlling the length and height of the vias and adjacent coupled metal interconnects in the first and/or second metallization layers 1006(1), 1006(2). The patch antennas 1004(1)-1004(4) can be flexibly disposed in the package substrate 1002, and in existing metallization layers in the first and/or second metallization layers 1006(1), 1006(2) of the package substrate 1002 without necessarily having to provide additional metallization layers dedicated to support additional antennas, such as in the antenna module 100 in FIGS. 1A and 1B.

As will be discussed in more detail below, the patch antennas 1005(1)(1)-1005(1)(4), 1005(2)(1)-1005(2)(4) are formed by metal interconnects (e.g., metal lines, metal traces) 1020(1), 1020(2) in metallization layers in the first metallization layers 1006(1). In this manner, the patch antennas 1004(1)-1004(4) can be formed as horizontally integrated structures in the package substrate 1002 using fabrication methods used for fabricating metal interconnects and vias (e.g., a micro via fabrication process) in package substrates. The patch antennas 1005(1)(1)-1005(1)(4), 1005(2)(1)-1005(2)(4) can be flexibly disposed in the package substrate 1002, and in existing metallization layers in the first and/or second metallization layers 1006(1), 1006(2) of the package substrate 1002 without necessarily having to provide additional metallization layers dedicated to support additional antennas, such as in the antenna module 100 in FIGS. 1A and 1B.

As shown in FIG. 10C and described in more detail below, in this example, a patch antenna 1004 among the patch antennas 1004(1)-1004(2) is shown. The patch antenna 1004 is formed by a plurality of vias bars 1030 formed in respective adjacent metallization layers in the package substrate 1002 and interconnected by metal interconnects 1020 in the respective metallization layers. In this manner, the patch antennas 1004(1)-1004(4) can be formed as a vertically integrated structure in the package substrate 1002 with fabrication methods used for fabricating the metal interconnects and vias (e.g., a micro via fabrication process) in package substrates.

Figure 10D:
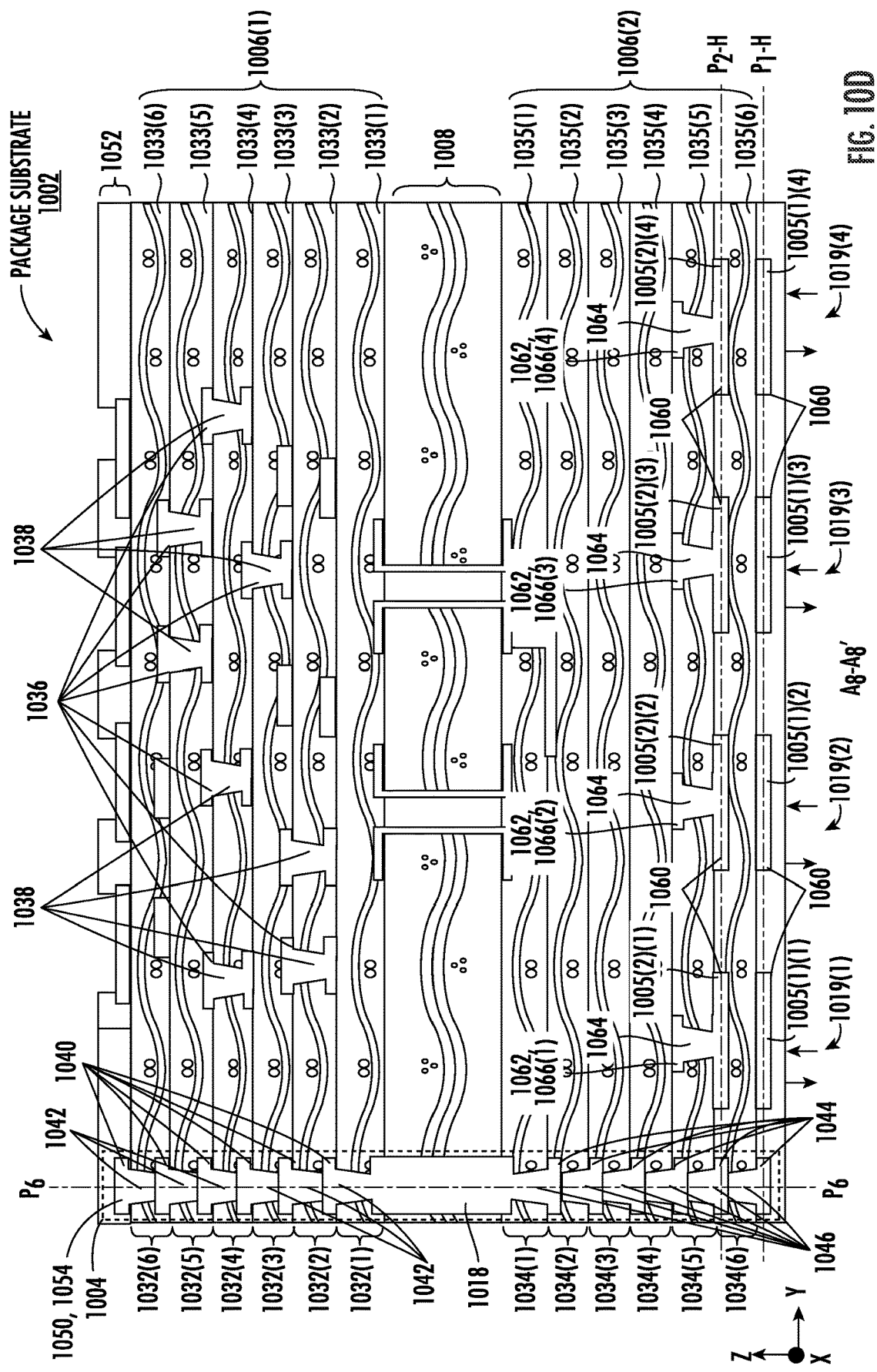
FIG. 10D is a side view of a package substrate that can be provided in the antenna module in FIGS. 10A and 10B illustrating the two (2) vertically-integrated planar-shaped structures extending fully in a vertical direction through the package substrate and the horizontally-integrated patch antennas formed in the metallization layers of the package substrate.

FIG. 10D is a side view of the package substrate 1002 in the antenna module 1000 in FIGS. 10A-10B to illustrate an example of the patch antennas 1004(1)-1004(4). The package substrate 1002 in FIG. 10D is a cross-sectional side view along the $A_8$-$A_8'$ cross-section line in the antenna module 1000 in FIG. 10B. Thus, only one (1) patch antenna 1004(1) among the patch antennas 1004(1)-1004(4) is shown from the side in the side view of the package substrate 1002 in FIG. 10D. As shown in FIG. 10D, the first metallization layers 1006(1) include plurality of metallization layers 1032(1)-1032(6) that are parallel to each other (e.g., stacked on each other) in a horizontal direction (X-axis and Y-axis directions) in respective horizontal planes. The second metallization layers 1006(2) also include plurality of metallization layers 1034(1)-1034(6) that are parallel to each other in a horizontal direction (X-axis and Y-axis directions) in respective horizontal planes. Metallization layers 1032(6), 1034(6) are outer metallization layers of the package substrate 1002. The first metallization layers 1006(1) are coupled to the core substrate 1008, with the metallization layer 1032(1) being directly coupled to the core substrate 1008. The second metallization layers 1006(2) are also coupled to the core substrate 1008, with the metallization layer 1034(1) being directly coupled to the core substrate 1008. In this regard, the core substrate 1008 is disposed between the first and second metallization layers 1006(1), 1006(2).

The metallization layers 1032(1)-1032(6) in the first metallization layers 1006(1) each include a dielectric layer 1033(1)-1033(6) made from a dielectric material and one or more metal interconnects 1036 (e.g., metal lines, metal traces, metal posts). The metal interconnects 1036 (e.g., metal lines, metal traces, metal posts) can be coupled to each other in adjacent metallization layers 1032(1)-1032(6) by metal vias 1038 ("vias 1038") to form signal routing paths in the first metallization layers 1006(1) to the die interconnects 1012(1), 1012(2) of a RFIC 1014(1), 1014(2) in FIG. 10A. The metallization layers 1034(1)-1034(6) in the second metallization layers 1006(2) each include a dielectric layer 1035(1)-1035(6) made from a dielectric material and one or more metal interconnects (e.g., metal lines, metal traces, metal posts). The metal interconnects can be coupled to each other in adjacent metallization layers 1034(1)-1034(6) by vias to form signal routing paths in the second metallization layers 1006(2).

The patch antenna 1004 is formed from a plurality of other metal interconnects 1040 (e.g., metal lines, metal traces, metal posts) in the respective separate metallization layers 1032(1)-1032(6) in the first metallization layers 1006(1) that are aligned in the vertical direction (Z-axis direction) and share a common vertical plane $P_6$ in the X-axis and Z-axis directions. The metal interconnects 1040 in adjacent metallization layers 1032(1)-1032(6) are coupled to each other by metal vias 1042 ("vias 1042") disposed in the respective adjacent metallization layers 1032(1)-1032(6). The metal interconnects 1040 are disposed in parallel to each other in the horizontal direction (X-axis and Y-axis directions). In this manner, the metal interconnects 1040 connected by the vias 1042 form a vertically integrated planar-shaped metal structure in the first metallization layers 1006(1) that forms part of the patch antenna 1004.

Also in this example, the patch antenna 1004 also includes a vertical planar-shaped structure that is formed from plurality of metal interconnects 1044 (e.g., metal lines, metal traces, metal posts) in the respective separate metallization layers 1034(1)-1034(6) in the second metallization layers 1006(2). The metallization layers 1034(1)-1034(6) each include a respective dielectric layer 1035(1)-1035(6) made from a dielectric material and one or more metal interconnects 1044 (e.g., metal lines, metal traces, metal posts). The metal interconnects 1044 are aligned in the vertical direction (Z-axis direction) and share the common vertical plane $P_6$. The metal interconnects 1044 in adjacent metallization layers 1034(1)-1034(6) are coupled to each other by metal vias 1046 ("vias 1046") disposed in the respective adjacent metallization layers 1034(1)-1034(6). The metal interconnects 1044 are disposed in parallel to each other in the horizontal direction (X-axis and Y-axis directions). In this manner, the metal interconnects 1044 connected by the vias 1046 form a vertically integrated planar-shaped metal structure in the second metallization layers 1006(2) that forms part of the patch antenna 1004. The core substrate 1008 includes a metal post 1018 that is coupled to the metal interconnect 1040 in the metallization layer 1032(1) in the first metallization layers 1006(1) and to the metal interconnect 1044 in the metallization layer 1034(1) in the second metallization layers 1006(2).

In this manner, the metal interconnects 1040 interconnected by the respective vias 1042 in the first metallization layers 1006(1), the metal interconnects 1044 interconnected by the respective vias 1046 in the second metallization layers 1006(2), and the metal post 1048 form the patch antenna 1004 in this example. The patch antenna 1004 extends all the way through all layers of the package substrate 1002 in this example in FIG. 10D. The patch antenna 1004 extends in the vertical direction (Z-axis direction) through each of the metallization layers 1032(1)-1032(6) in the first metallization layers 1006(1), through each of the metallization layers 1034(1)-1034(6) in the second metallization layers 1006(2), and also through the core substrate 1008 in this example. A metal interconnect 1050 formed in a solder resist layer 1052 (as another metallization layer) disposed on the metallization layer 1032(6) of the first metallization layers 1006(1) can serve as an antenna feed line 1054 to the patch antenna 1004. A die interconnect 1012(1), 1012(2) of an RFIC 1014(1), 1014(2) in the antenna module in FIG. 10A can be coupled to the metal interconnect 1050 as an antenna feed line 1054 to couple the RFIC 1014(1), 1014(2) to the patch antenna 1004.

Also, as shown in FIGS. 10C and 10D, the vertically-integrated patch antenna 1004 is formed as a generally planar-shaped structure, and in this example a rectangular-shaped structure, in the X-axis and Z-axis directions. As discussed above, the patch antenna 1004 is formed by connecting multiple metal interconnects 1040, 1044 each disposed in separate metallization layers 1032(1)-1032(6), 1034(1)-1034(6) of the package substrate 1002. In this example, the multiple metal interconnects 1040, 1044 are connected together by the respective vias 1042, 1046 that are generally elongated in shape in a horizontal direction (X-axis direction) forming the via bars 1030 such that when connected to respective metal interconnects 1040, 1044, the patch antenna 1004 is formed as a generally planar structure in a plane in the X-axis and Z-axis directions in the vertical plane $P_6$ in the package substrate 1002 and can behave as a patch antenna, and thus is considered a patch antenna. This patch antenna 1004 is a via bar in the sense that it is longer in one horizontal direction (Y-axis direction) and narrower in another horizontal direction (Z-axis direction) in its metallization layer 1032(1)-1032(6), 1034(1)-1034(6). The via bars 1030 of the patch antenna 1004 are formed in a via trench in a respective metallization layer 1032(1)-1032(6), 1034(1)-1034(6) that has a depth in the vertical direction (Z-axis direction) and electrically coupled, by an intervening connected metal interconnect 1040, 1044 to a respective adjacent via 1042, 1046 in an adjacent metallization layer 1032(1)-1032(6), 1034(1)-1034(6) thereby forming a single, vertical, trench-like structure in the package substrate 1002. Thus, the resulting vertically-integrated patch antenna 1004 may be considered "trench-shaped" patch antennas in the sense that they are planar-shaped patch antennas, but are integrated in a vertical direction (Z-axis direction) of the package substrate 1002 in relation to horizontal metallization layers 1032(1)-1032(6), 1034(1)-1034(6) of the package substrate 1002. The elongated vias 1042, 1046 each comprise a trench. The precise shape and the vertical plane $P_6$ of the patch antenna 1004 will depend on the length of the vias 1042, 1046 in the horizontal direction (X-axis direction). The patch antenna 1004 is formed as a generally rectangular planar-shaped structure in this example.

Note that in another exemplary aspect, the metal interconnects 1040 interconnected by the respective vias 1042 in the first metallization layers 1006(1) do not have to be coupled to the metal interconnects 1044 interconnected by the respective vias 1046 in the second metallization layers 1006(2). The metal post 1048 that is shown in the core substrate 1008 interconnecting the metal interconnects 1040 interconnected by the respective vias 1042 in the first metallization layers 1006(1), to the metal interconnects 1044 interconnected by the respective vias 1046 in the second metallization layers 1006(2) do not have to be included. In this manner, in this alternative aspect, the metal interconnects 1040 interconnected by the respective vias 1042 in the first metallization layers 1006(1) would form a first patch antenna in the package substrate 1002, and the metal interconnects 1044 interconnected by the respective vias 1046 in the second metallization layers 1006(2) would form a second, separate patch antenna in the package substrate 1002.

With continuing reference to FIG. 10D, the patch antennas 1005(1)(1)-1005(1)(4), 1005(2)(1)-1005(2)(4) are formed as metal interconnects 1060 (e.g., metal lines, metal traces, metal posts) in the respective separate metallization layers 1034(5), 1034(6) in the second metallization layers 1006(2) in this example. The metal interconnects 1060 are formed as metal patches in this example that are disposed in respective horizontal planes $P_{1-H}$, $P_{2-H}$ in an elongated in a horizontal direction (X-axis and Y-axis directions) orthogonal to the vertical direction (Z-axis direction) to form the patch antennas 1005(1)(1)-1005(1)(4), 1005(2)(1)-1005(2)(4). Thus, the radiation patterns of patch antennas 1005(1)(1)-1005(1)(4), 1005(2)(1)-1005(2)(4) are in the vertical (Z-axis direction) first and second horizontal directions 1019(1)-1019(4) as shown in FIGS. 10B and 10D. With reference to FIG. 10D, the patch antennas 1005(2)(1)-1005(2)(4) and their metal interconnects 1060 are coupled by metal vias 1064 ("vias 1064") formed in the metallization layer 1034(5) to other metal interconnects 1062 as respective antenna feed lines 1066(1)-1066(4) in the metallization layer 1034(4). The metal interconnects 1062 in the metallization layer 1034(4) can be coupled to metal interconnects in other metallization layers 1034(1)-1034(4) in the second metallization layers 1034(2), the core substrate 1008 and metal interconnects 1036 in the first metallization layers 1034(1) to be interconnected to the RFIC(s) 1014(1), 1014(2) (FIG. 10A). In this example, the patch antennas 1005(2)(1)-1005(2)(4) in metallization layer 1034(6) are configured to radiate RF signals received from their respective antenna feed lines 1066(1)-1066(4) towards the respective patch antennas 1005(1)(1)-1005(1)(4) in metallization layer 1034(6). The patch antennas 1005(1)(1)-1005(1)(4) in metallization layer 1034(6) are EM coupled to the respective patch antennas 1005(2)(1)-1005(2)(4) to receive the RF signals and to then radiate such RF signals away from the package substrate 1002. In this manner, as shown in FIGS. 10A and 10B, the patch antennas 1005(1)(1)-1005(1)(4) have a radiation pattern in the first and second directions 1019(1)-1019(4) in the vertical direction (Z-axis direction), and the patch antennas 1004(1)-1004(4) (FIG. 10B) have a radiation pattern in the first and second directions 1019(1)-1019(4) in the orthogonal, horizontal direction (Y-axis direction).

Note that although pairs of respective patch antennas 1005(1)(1)-1005(1)(4), 1005(2)(1)-1005(2)(4) are included in the package substrate 1002 in the example in FIGS. 10A-10D, wherein patch antennas 1005(1)(1)-1005(1)(4) are EM coupled to patch antennas 1005(2)(1)-1005(2)(4), such is not limiting. For example, only the patch antennas 1005(1)(1)-1005(1)(4) or patch antennas 1005(2)(1)-1005(2)(4) could be included in the package substrate 1002. Also, any desired number of patch antennas may be included on any given metallization layer 1034(5) and/or 1034(6). Patch antennas can also be included on any other metallization layer(s) 1034(1)-1034(4) in the second metallization layers 1006(2) or first metallization layers 1006(1) of the package substrate 1002.

Figure 11:
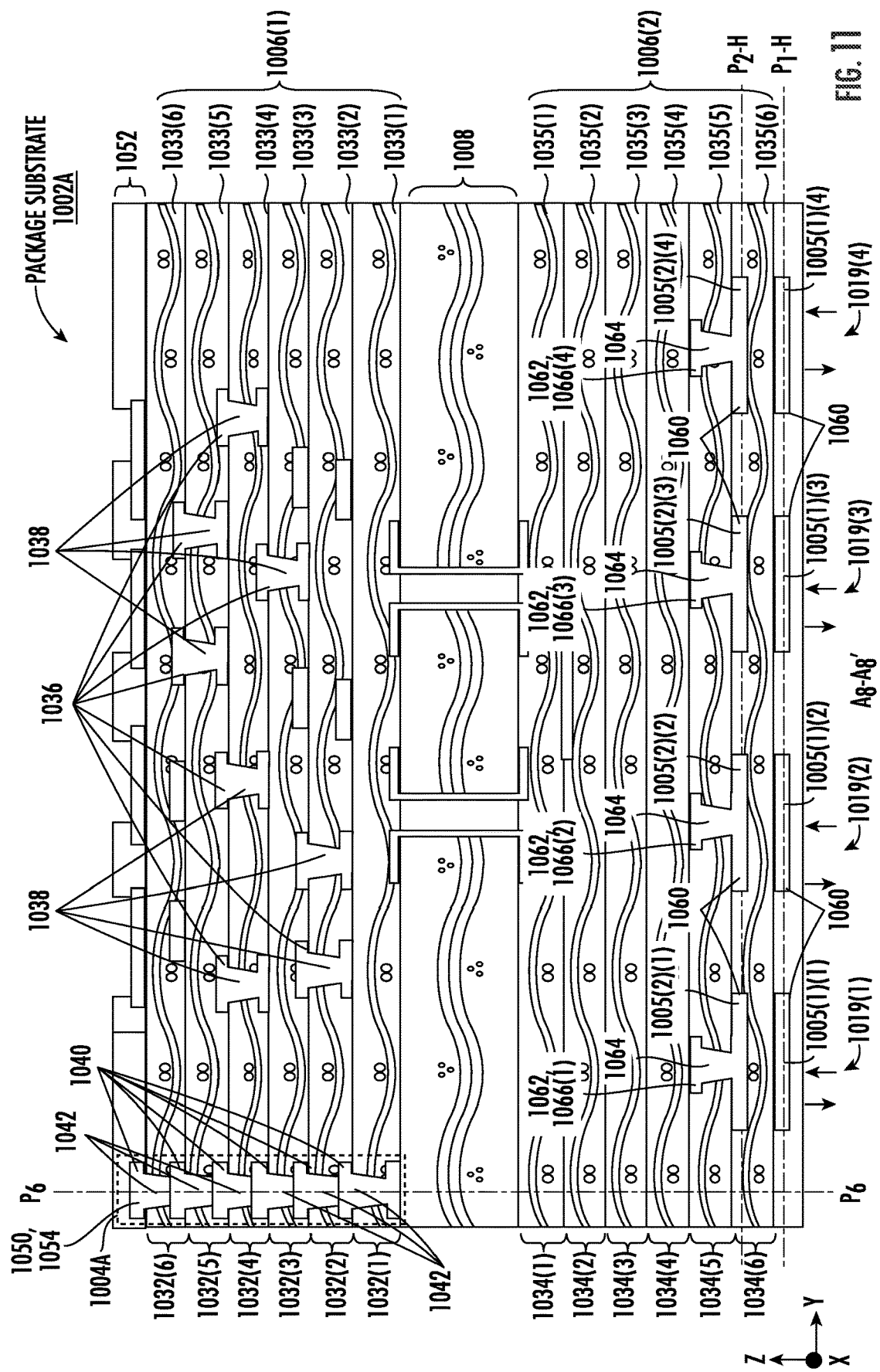
FIG. 11 is a side view of a package substrate that can be provided in the antenna module in FIGS. 10A and 10B illustrating the two (2) vertically-integrated planar-shaped structures extending partially in a vertical direction in the package substrate and horizontally-integrated patch antennas formed in the metallization layers of the package substrate.

FIG. 11 is a side view of an alternative package substrate 1002A that can be provided as the package substrate 1002 in the antenna module 1000 in FIGS. 10A-10B where an alternative patch antenna 1004A is vertically integrated in the vertical direction (Z-axis direction) only in the first metallization layers 1006(1). Common elements between the package substrate 1002 in FIG. 10D and the package substrate 1002A in FIG. 11 are shown with common element numbers. Thus, the discussion of these common elements in FIG. 10D is also applicable to the package substrate 1002A in FIG. 11. The package substrate 1002A in FIG. 11 is a cross-sectional side view along the $A_7$-$A_7$' cross-section line in the antenna module 1000 in FIG. 10B. Thus, only one patch antenna 1004A is shown from the side in the side view of the package substrate 1002A in FIG. 11.

As shown in FIG. 11, the first metallization layers 1006(1) includes the plurality of metallization layers 1032(1)-1032(6) that are parallel to each other (e.g., stacked on each other) in the horizontal direction (X-axis and Y-axis directions) in respective horizontal planes like the package substrate 1002 in FIG. 10D. Like provided in the package substrate 1002 in FIG. 10D, the metallization layers 1032(1)-1032(6) in the first metallization layers 1006(1) of the package substrate 1002A in FIG. 11 include the metal interconnects 1036 (e.g., metal lines, metal traces, metal posts) that are coupled to each other in adjacent metallization layers 1032(1)-1032(6) by vias 1038 to form signal routing paths in the first metallization layers 1006(1) to the die interconnects 1012(1), 1012(2) of a RFIC 1014(1), 1014(2) in FIG. 10A. The patch antenna 1004A is formed from a plurality of other metal interconnects 1040 (e.g., metal lines, metal traces, metal posts) in the respective separate metallization layers 1032(1)-1032(6) in the first metallization layers 1006(1) that are aligned in the vertical direction (Z-axis direction) and share a common vertical plane $P_6$. The metal interconnects 1040 in adjacent metallization layers 1032(1)-1032(6) are coupled to each other by vias 1042 disposed in the respective adjacent metallization layers 1032(1)-1032(6). The metal interconnects 1040 are disposed in parallel to each other in the horizontal direction (X-axis and Y-axis directions). In this manner, the metal interconnects 1110 connected by the metal vias 1112 ("vias 1112") form a vertically integrated planar-shaped metal structure in the first metallization layers 1006(1) that form the patch antenna 1004A in this example.

In this manner, the metal interconnects 1040 interconnected by the respective vias 1042 in the first metallization layers 1006(1) form the patch antenna 1004A in this example. Thus, the patch antenna 1004A does not extend into the core substrate 1008 or the second metallization layers 1006(2) of the package substrate 1002A in this example in FIG. 11. Like the package substrate 1002 in FIG. 10D, the metal interconnect 1050 formed in the solder resist layer 1052 disposed on the metallization layer 1032(6) of the first metallization layers 1006(1) can serve as an antenna feed line 1054 to the patch antenna 1004. A die interconnect 1012(1), 1012(2) of an RFIC 1014(1), 1014(2) in the antenna module 1000 in FIG. 10A can be coupled to the metal interconnect 1050 as the antenna feed line 1054 to couple the RFIC 1014(1), 1014(2) to the patch antenna 1004.

With continuing reference to FIG. 11, like the package substrate 1002 in FIGS. 10A-10D, package substrate 1002A can include the patch antennas 1005(1)(1)-1005(1)(4), 1005(2)(1)-1005(2)(4). Common elements between the package substrate 1002 in FIG. 10A-10D and the package substrate 1002A in FIG. 11 are shown with common element numbers and are not re-described. Note that although pairs of respective patch antennas 1005(1)(1)-1005(1)(4), 1005(2)(1)-1005(2)(4) are included in the package substrate 1002A in the example in FIG. 11, wherein patch antennas 1005(1)(1)-1005(1)(4) are EM coupled to patch antennas 1005(2)(1)-1005(2)(4), such is not limiting. For example, only the patch antennas 1005(1)(1)-1005(1)(4) or patch antennas 1005(2)(1)-1005(2)(4) could be included in the package substrate 1002. Also, any desired number of patch antennas may be included on any given metallization layer 1034(5) and/or 1034(6). Patch antennas can also be included on any other metallization layer(s) 1034(1)-1034(4) in the second metallization layers 1006(2) or first metallization layers 1006(1) of the package substrate 1002.

Also, as shown in FIG. 11, the vertically-integrated patch antenna 1004A is formed as a generally planar-shaped structure, and in this example a rectangular-shaped structure, in the X-axis and Z-axis directions. As discussed above, the patch antenna 1004A is formed by connecting multiple metal interconnects 1040 each disposed in separate metallization layers 1032(1)-1032(6) of the package substrate 1002. In this example, the multiple metal interconnects 1040 are connected together by the respective vias 1042 that are generally elongated in shape in a horizontal direction (X-axis direction) forming the via bars 1030 such that when connected to respective metal interconnects 1040, the patch antenna 1004A is formed as generally planar structure in a plane in the X-axis and Z-axis directions in the vertical plane $P_6$ in the package substrate 1002A that can behave as a patch antenna, and thus is considered a patch antenna. This patch antenna 1004A is a via bar in the sense that it is longer in one horizontal direction (Y-axis direction) and narrower in another horizontal direction (Z-axis direction) in its metallization layer 1032(1)-1032(6). The via bars 1030 of the patch antenna 1004A are formed in a via trench in a respective metallization layer 1032(1)-1032(6) that has a depth in the vertical direction (Z-axis direction) and electrically coupled, by an intervening connected metal interconnect 1040 to a respective adjacent via 1042 in an adjacent metallization layer 1032(1)-1032(6) thereby forming a single, vertical, trench-like structure in the package substrate 1002A. Thus, the resulting vertically-integrated patch antenna 1004A may be considered a "trench-shaped" patch antennas in the sense that it is a planar-shaped patch antenna, but integrated in a vertical direction (Z-axis direction) of the package substrate 1002A in relation to horizontal metallization layers 1032(1)-1032(6) of the package substrate 1002A. The elongated vias 1042 each comprise a trench. The precise shape and the vertical plane $P_6$ of the patch antenna 1004A will depend on the length of the vias 1042 in the horizontal direction (X-axis direction). The patch antenna 1004A is formed as generally rectangular planar-shaped structure in this example.

Note that alternatively, the package substrate 1002A in FIG. 11 could be provided such that the patch antenna is provided in the second metallization layers 1006(2) and not in the first metallization layers 1006(1). In this regard, like shown in the package substrate 1002 in FIG. 10D, in this alternative aspect, the patch antenna would be formed of the plurality of other metal interconnects 1044 (e.g., metal lines, metal traces, metal posts) in the respective separate metallization layers 1034(1)-1034(6) in the second metallization layers 1006(2) that are aligned in the vertical direction (Z-axis direction) and share a common vertical plane $P_6$.

In other exemplary aspects, the vertically-integrated patch antenna(s) is formed in the package substrate extending in a first, vertical plane in the package substrate such that its antenna radiation pattern is out from the side of the package substrate in a second, horizontal direction orthogonal to the vertical direction. In other exemplary aspects, multiple trench-shape patch antennas can be formed vertically adjacent to each other in the package substrate to provide an antenna. One of the trench-shape patch antennas can be electrically coupled through a coupled feed line to the RFIC package. An adjacent trench-shape patch antenna is configured to be electromagnetically (EM) coupled to the trench-shape patch antenna connected by a feed line to radiate RF signals transmitted by a RFIC in the RFIC package.

Figure 12:
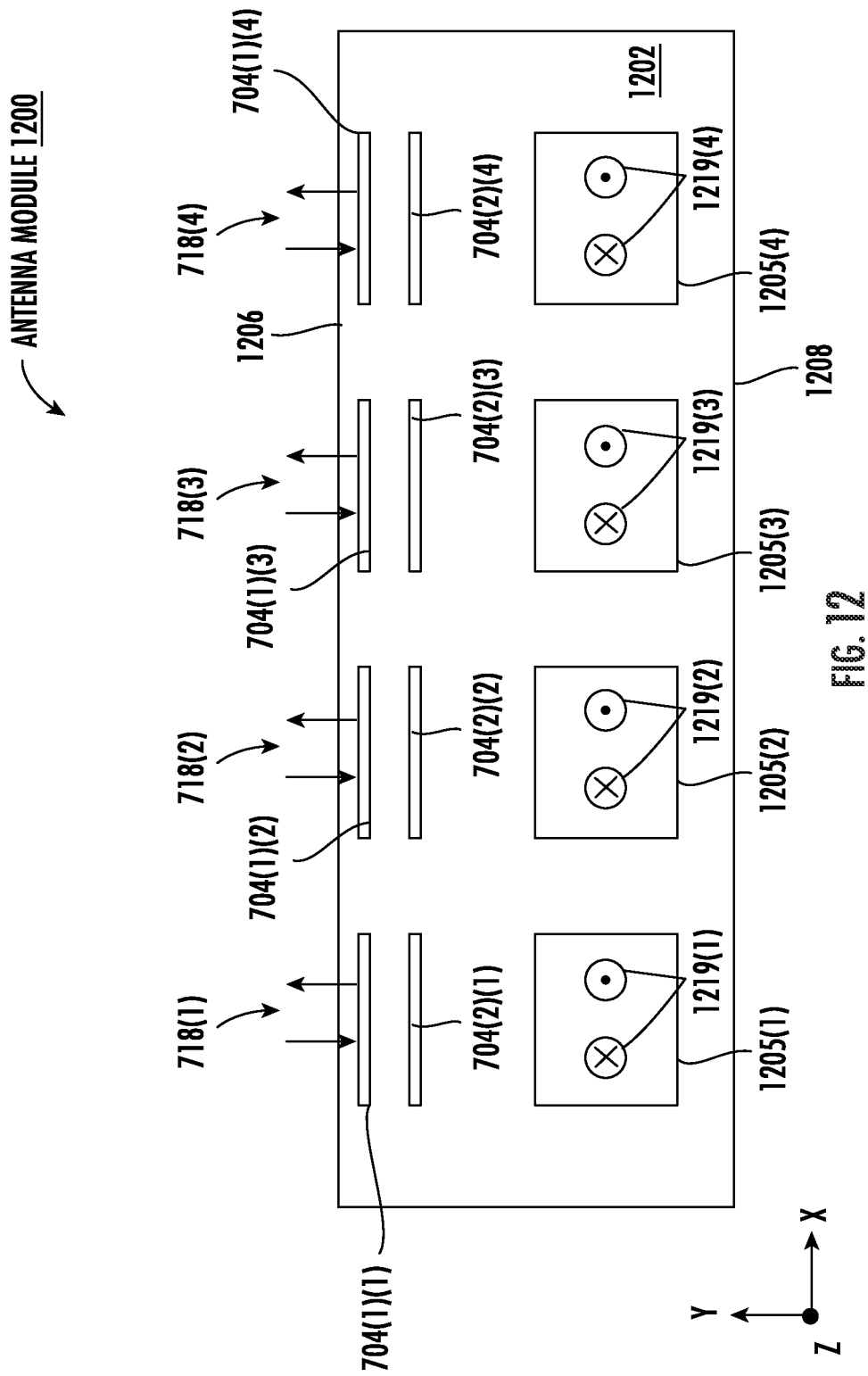
FIG. 12 is a bottom view of another package substrate that can be provided in an antenna module that includes a vertically-integrated patch antenna disposed on an opposite elongated side of the package substrate opposite from the package substrate in FIG. 10B.

FIG. 12 is a bottom view of another package substrate 1202 that can be provided in an antenna module and is similar to the antenna module 700 in FIG. 7, but also includes horizontally-integrated patch antennas like the patch antennas 1005(1)(1)-1005(1)(4), 1005(2)(1)-1005(2)(4) in the package substrates 1002, 1002A in FIGS. 10A-10D and 11. Common elements between the package substrates 502, 702 in FIGS. 5A-5D and FIG. 7 are shown with common element numbers in the package substrate 1202 in FIG. 12. The package substrate 1202 in FIG. 12 includes vertically-integrated patch antennas 704(1)(1)-704(1)(4), 704(2)(1)-704(2)(4) similar in shape to the patch antennas 504(1)(1)-504(1)(4), 504(2)(1)-504(2)(4) in the package substrate 502 in FIGS. 5A-5B. However, in the package substrate 1202 in FIG. 12, the vertically-integrated patch antennas 704(1)(1)-704(1)(4), 704(2)(1)-704(2)(4) are disposed adjacent to a second side 1206 of the package substrate 1202 that is elongated in the X-axis direction, opposite from a first side 1208 of the package substrate 1202 that is elongated in the X-axis direction. Like the patch antennas 504(1)(1)-504(1)(4), 504(2)(1)-504(2)(4) in the package substrate 502 in FIGS. 5A-5B, the patch antennas 704(2) (1)-704(2)(4) are configured to be EM coupled to the respective patch antennas 704(1)(1)-704(1)(4), which radiate coupled RF signals received through an antenna feed line by the patch antennas 704(2)(1)-704(2)(4). The radiation patterns of the patch antennas 704(1)(1)-704(1)(4) are shown in respective first and second horizontal directions 718(1)-718(4) in the Y-axis direction by the nature of the vertical orientation of the patch antennas 704(1)(1)-704(1) (4) in the vertical direction (Z-axis direction) and their planar structure in the X-axis and Z-axis directions. The more detailed exemplary illustrations of structures of the patch antennas 504(1)(1)-504(1)(4) in FIGS. 5D and 6 can also be employed for the patch antennas 704(1)(1)-704(1)(4) in FIG. 12.

The package substrate 1202 example in FIG. 12 also includes patch antennas 1205(1)-1205(4). The radiation patterns of the patch antennas 1205(1)-1205(4) are in first and second vertical directions 1219(1)-1219(4) in the vertical direction (Z-axis direction) as shown in FIG. 12 by the nature of their horizontal orientation in the horizontal direction (X-axis and Y-axis directions) and their planar structure in the X-axis and Z-axis directions. Thus, the patch antennas 1205(1)-1205(4) can be formed in package substrate 1202 to provide this additional radiation pattern to provide reception antenna coverage in the first and second vertical directions 1219(1)-1219(4). In this example, patch antennas 1205(1)-1205(4) are only provided in one metallization layer of the package substrate 1202 similar to the patch antennas 1005 (2)(1)-1005(2)(4) in the package substrates 1002, 1002A in FIGS. 10D and 11. However, such is not limiting, corresponding patch antennas, similar to the patch antennas 1005(1)(1)-1005(1)(4) in the package substrates 1002, 1002A in FIGS. 10D, could be formed in the package substrate 1200 in FIG. 12 and configured to be EM coupled to antenna feed line coupled to patch antennas 1205(1)-1205 (4). Also, note that any desired number of patch antennas may be included in the package substrate 1202.

Figure 13:
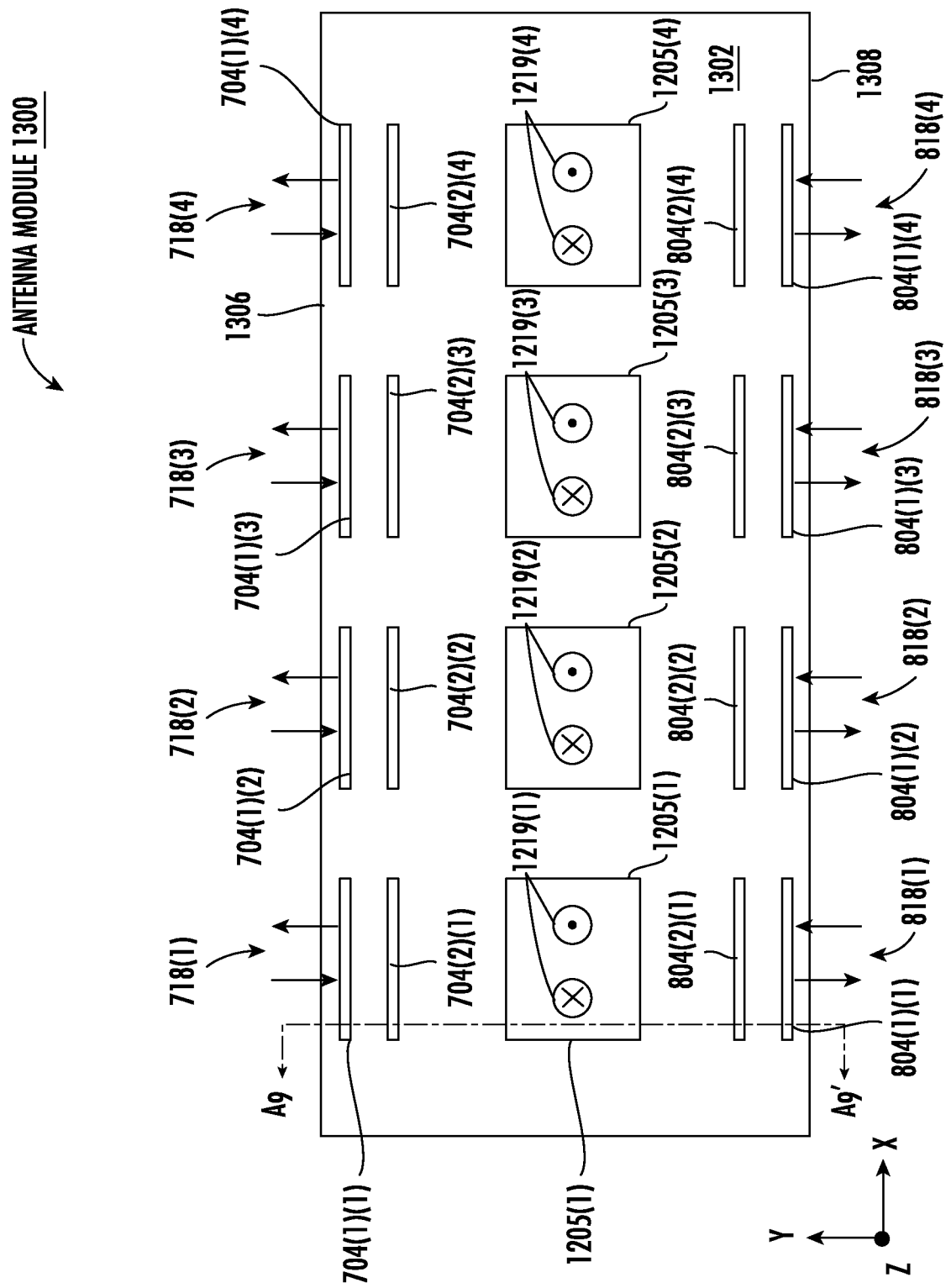
FIG. 13 is a bottom view of another package substrate that can be provided in the antenna module that includes patch antennas formed in metallization layers and vertically-integrated patch antennas disposed on each side of the patch antennas on both respective elongated sides of the package substrate.

FIG. 13 is a bottom view of another package substrate 1302 that can be provided in an antenna module 1300 that can be similar to the antenna module 800 in FIG. 8, but also include horizontally-integrated patch antennas like the patch antennas 1005(1)(1)-1005(1)(4), 1005(2)(1)-1005(2)(4) in the package substrates 1002, 1002A in FIGS. 10A-10D and 11. Common elements between the package substrates 502, 702, 802 in FIGS. 5A-5D, 7, and 8 are shown with common element numbers in the package substrate 1302 in FIG. 13. In this regard, the package substrate 1302 in FIG. 13 includes the vertically-integrated patch antennas 704(1)(1)-704(1)(4), 704(2)(1)-704(2)(4) disposed adjacent to a second side 1306 of the package substrate 1302 that is elongated in the X-axis direction, opposite from a first side 1308 of the package substrate 1302 that is elongated in the X-axis direction. The patch antennas 704(2)(1)-704(2)(4) are configured to be EM coupled to the respective patch antennas 704(1)(1)-704(1)(4), which radiate coupled RF signals received through an antenna feed line by the patch antennas 704(2)(1)-704(2)(4). The radiation patterns of the patch antennas 704(1)(1)-704(1)(4) are shown in respective first and second horizontal directions 718(1)-718(4) in the Y-axis direction by the nature of the vertical orientation of the patch antennas 704(1)(1)-704(1)(4) in the vertical direction (Z-axis direction) and their planar structure in the X-axis and Z-axis directions.

The package substrate 1302 in FIG. 13 additionally includes vertically-integrated patch antennas 804(1)(1)-804(1)(4), 804(2)(1)-804(2)(4) like in the package substrate 802 in FIG. 8 that are disposed adjacent to a first side 1308 of the package substrate 1302. The patch antennas 804(2)(1)-804(2)(4) are configured to be EM coupled to the respective patch antennas 804(1)(1)-804(1)(4), which radiate coupled RF signals received through an antenna feed line by the patch antennas 804(2)(1)-804(2)(4). The radiation patterns of the patch antennas 804(1)(1)-804(1)(4) are shown in respective first and second horizontal directions 818(1)-818(4) in the Y-axis direction by the nature of the vertical orientation of the patch antennas 804(1)(1)-804(1)(4) in the vertical direction (Z-axis direction) and their planar structure in the X-axis and Z-axis directions.

The package substrate 1302 of the antenna module 1300 in FIG. 13 also includes the patch antennas 1205(1)-1205(4) that are provided in the package substrate 1200 in FIG. 12. The description of these patch antennas 1205(1)-1205(4) with regard to FIG. 12 is also applicable to the package substrate 1302 in FIG. 13. The radiation patterns of the patch antennas 1205(1)-1205(4) are in first and second vertical directions 1219(1)-1219(4) in the vertical direction (Z-axis direction) as shown in FIG. 12 by the nature of their horizontal orientation in the horizontal direction (X-axis and Y-axis directions) and their planar structure in the X-axis and Z-axis directions. Thus, the patch antennas 1205(1)-1205(4) can be formed in package substrate 1302 to provide this additional radiation pattern to provide reception antenna coverage in the first and second vertical directions 1219(1)-1219(4). In this example, patch antennas 1205(1)-1205(4) are only provided in one metallization layer of the package substrate 1202 similar to the patch antennas 1005(2)(1)-1005(2)(4) in the package substrates 1002, 1002A in FIGS. 10D and 11. However, such is not limiting. Corresponding patch antennas, similar to the patch antennas 1005(1)(1)-1005(1)(4) in the package substrates 1002, 1002A in FIGS. 10D, could be formed in the package substrate 1302 in FIG. 13 and configured to be EM coupled to antenna feed line coupled to the patch antennas 1205(1)-1205(4). Also, note that any desired number of patch antennas may be included in the package substrate 1302.

Figure 14A:
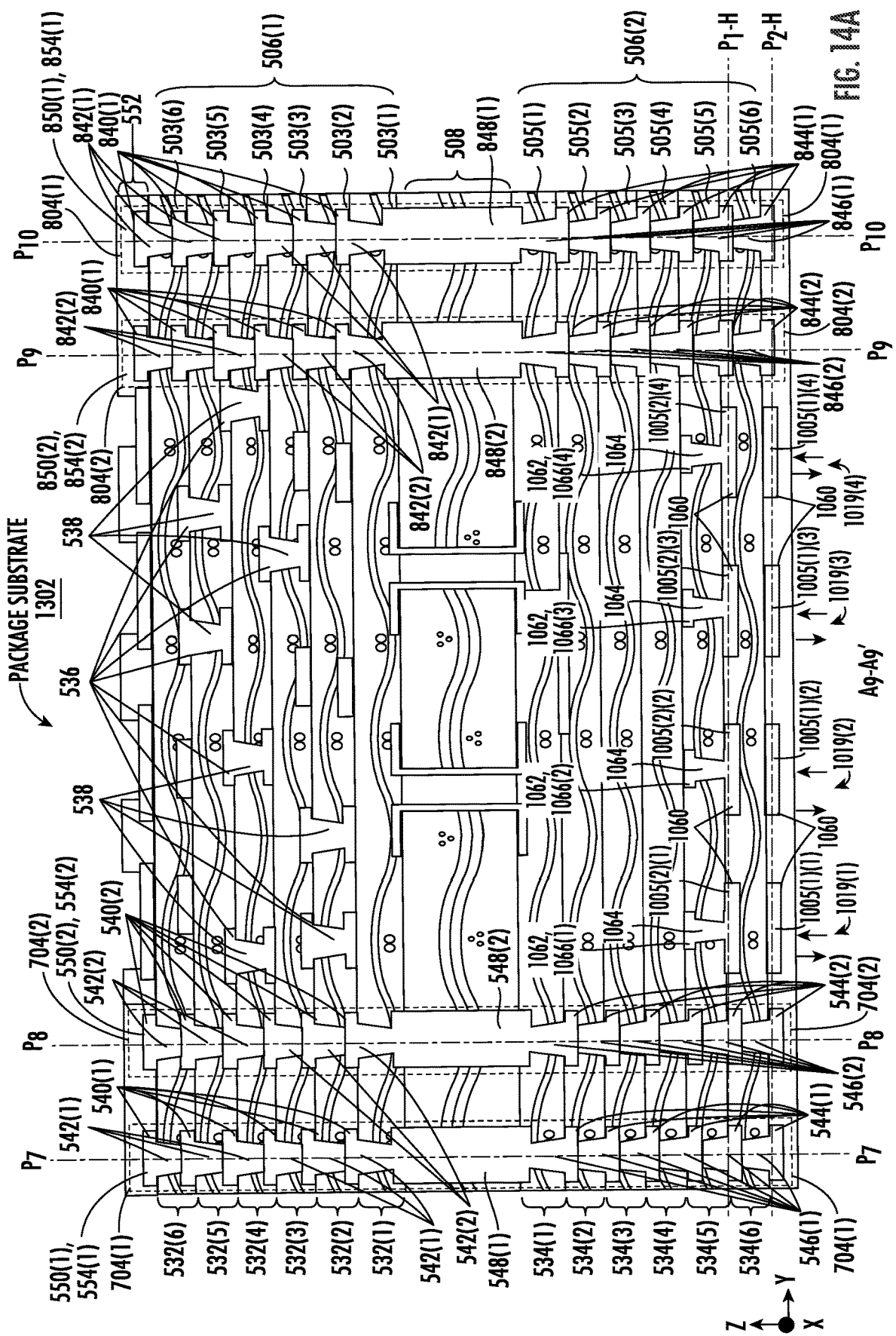
FIG. 14A is a side view of a package substrate that can be provided in the antenna module in FIG. 13 illustrating the two (2) vertically-integrated patch antennas extending fully in a vertical direction through the package substrate and the horizontally-integrated patch antennas formed in the metallization layers of the package substrate.

FIG. 14A is a side view of the package substrate 1302 in the antenna module 1300 in FIG. 13 to illustrate an example of the patch antennas 704(1)(1)-704(1)(4), 704(2)(1)-704(2)(4), 804(1)(1)-804(1)(4), 804(2)(1)-804(2)(4). The package substrate 1302 in FIG. 14A is a cross-sectional side view along the $A_9$-$A_9'$ cross-section line in the antenna module 1300 in FIG. 13. Thus, only four (4) patch antennas are shown from the side in the side view of the package substrate 1302 in FIG. 9A. In this example, patch antennas 704(1), 704(2) are shown that can be any of the respective pairs of patch antennas 704(1)(1)-704(1)(4), 704(2)(1)-704(2)(4) in the package substrate 1302 in FIG. 13. In this example, the patch antennas 704(1), 704(2) can be structured like the patch antennas 504(1), 504(2) in FIG. 5D, which is shown with common element numbers in FIG. 14A. The description of the patch antennas 504(1), 504(2) in FIG. 5D is applicable to the patch antennas 504(1), 504(2) in the package substrate 1302 in this example and thus will not be re-described.

As shown in FIG. 14A, the package substrate 1302 includes the first metallization layers 506(1) that include the plurality of metallization layers 532(1)-532(6) that are parallel to each other (e.g., stacked on each other) in a horizontal direction (X-axis and Y-axis directions) in respective horizontal planes as provided in package substrate 502 in FIG. 5D. The second metallization layers 506(2) also include plurality of metallization layers 534(1)-534(6) that are parallel to each other in a horizontal direction (X-axis and Y-axis directions) in respective horizontal planes. The first metallization layers 506(1) are coupled to the core substrate 508, with the metallization layer 532(1) being directly coupled to the core substrate 508. The second metallization layers 506(2) are also coupled to the core substrate 508, with the metallization layer 534(1) being directly coupled to the core substrate 508. In this regard, the core substrate 508 is disposed between the first and second metallization layers 506(1), 506(2). The metallization layers 532(1)-532(6) in the first metallization layers 506(1) include respective metal interconnects 536 (e.g., metal lines, metal traces, metal posts) that are coupled to each other in adjacent metallization layers 532(1)-532(6) by vias 538 to form signal routing paths in the first metallization layers 506(1).

In this example, the patch antennas 804(1), 804(2) are shown that can be any of the respective pairs of patch antennas 804(1)(1)-804(1)(4), 804(2)(1)-804(2)(4) in the package substrate 1302 in FIG. 13. The patch antennas 804(1), 804(2) can be structured like the patch antennas 804(1)(1)-804(1)(4), 804(2)(1)-804(2)(4) in the package substrate 1302 in FIG. 13, which is shown with common element numbers in FIG. 14A. The description of the patch antennas 804(1)(1)-804(1)(4), 804(2)(1)-804(2)(4) in FIG. 13 is applicable to the patch antennas 804(1), 804(2) in the package substrate 1302. The patch antenna 804(1), 804(2) are formed from a plurality of other metal interconnects 840(1), 840(2) (e.g., metal lines, metal traces, metal posts) in the respective separate metallization layers 532(1)-532(6) in the first metallization layers 506(1) that are aligned in the vertical direction (Z-axis direction) and share respective common vertical planes $P_7$, $P_8$ in the X-axis and Z-axis directions. The respective metal interconnects 840(1), 840(2) in adjacent metallization layers 532(1)-532(6) are coupled to each other by respective vias 842(1), 842(2) disposed in the respective adjacent metallization layers 532(1)-532(6). The respective metal interconnects 840(1), 840(2) are disposed in parallel to each other in the horizontal direction (X-axis and Y-axis directions). In this manner, the metal interconnects 840(1), 840(2) connected by the respective vias 842(1), 842(2) form a vertically integrated planar metal structures in the first metallization layers 506(1) that forms part of the respective patch antennas 804(1), 804(2).

Also in this example, the patch antennas 804(1), 804(2) also include a respective vertical planar-shaped structure that is formed from plurality of metal interconnects 844(1), 844(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_7$, $P_8$. The respective metal interconnects 844(1), 844(2) in adjacent metallization layers 534(1)-534(6) are coupled to each other by the respective vias 846(1), 846(2) disposed in the respective adjacent metallization layers 534(1)-534(6). The respective metal interconnects 844(1), 844(2) are disposed in parallel to each other in the horizontal direction (X-axis and Y-axis directions). In this manner, the respective metal interconnects 844(1), 844(2) connected by the respective vias 846(1), 846(2) form respective vertically-integrated planar-shaped metal structures in the second metallization layers 506(2) that forms part of the patch antennas 804(1), 804(2). The core substrate 508 includes respective metal posts 848(1), 848(2) that are coupled to the respective metal interconnects 840(1), 840(2) in the metallization layer 532(1) in the first metallization layers 506(1) and to the respective metal interconnects 844(1), 844(2) in the metallization layer 534(1) in the second metallization layers 506(2).

In this manner, the respective metal interconnects 840(1), 840(2) interconnected by the respective vias 842(1), 842(2) in the first metallization layers 506(1), the respective metal interconnects 844(1), 844(2) interconnected by the respective vias 846(1), 846(2) in the second metallization layers 506(2), and the respective metal posts 848(1), 848(2) form the respective patch antennas 504(1), 504(2) in this example. The patch antennas 804(1), 804(2) each extend all the way through all layers of the package substrate 802 in this example in FIG. 8. The patch antennas 804(1), 804(2) extend in the vertical direction (Z-axis direction) through each of the metallization layers 532(1)-532(6) in the first metallization layers 506(1), through each of the metallization layers 534(1)-534(6) in the second metallization layers 506(2), and also through the core substrate 508 in this example. Metal interconnects 850(1), 850(2) formed in the solder resist layer 552 disposed on the metallization layer 532(6) of the first metallization layers 506(1) can serve as respective antenna feed lines 854(1), 854(2) to the respective patch antennas 804(1), 804(2). Note that in another exemplary aspect, the respective metal interconnects 540(1), 540(2) interconnected by the respective vias 542(1), 542(2) in the first metallization layers 506(1) of the package substrate 1302 in FIG. 14A do not have to be coupled to the respective metal interconnects 544(1), 544(2) interconnected by the respective vias 546(1), 546(2) in the second metallization layers 506(2). The metal posts 548(1), 548(2) that are shown in the core substrate 508 interconnecting the respective metal interconnects 540(1), 540(2) interconnected by the respective vias 542(1), 542(2) in the first metallization layers 506(1), to the respective metal interconnects 544(1), 544(2) interconnected by the respective vias 546(1), 546(2) in the second metallization layers 506(2) do not have to be included. In this manner, in this alternative aspect, the respective metal interconnects 540(1), 540(2) interconnected by the respective vias 542(1), 542(2) in the first metallization layers 506(1) would form a first patch antenna in the package substrate 502, and the respective metal interconnects 544(1), 544(2) interconnected by the respective vias 546(1), 546(2) in the second metallization layers 506(2) would each form four (4) separate patch antennas in the package substrate 502.

With continuing reference to FIG. 14A, like the package substrate 1002 in FIGS. 10A-10D, the package substrate 1302 in FIG. 14A can also include the patch antennas like patch antennas 1005(1)(1)-1005(1)(4), 1005(2)(1)-1005(2)(4) in the package substrate 1002 in FIGS. 10A-10D. The patch antennas 1005(1)(1)-1005(1)(4), 1005(2)(1)-1005(2)(4) are included in respective metallization layers 534(5), 534(6) in the package substrate 1302 in FIG. 14A in this example. Common elements related to the patch antennas 1005(1)(1)-1005(1)(4), 1005(2)(1)-1005(2)(4) between the package substrate 1002 in FIG. 10A-10D and the package substrate 1302 in FIG. 14A are shown with common element numbers and are not re-described. Note that although pairs of respective patch antennas 1005(1)(1)-1005(1)(4), 1005(2)(1)-1005(2)(4) are included in the package substrate 1302 in the example in FIG. 14A, wherein patch antennas 1005(1)(1)-1005(1)(4) are EM coupled to patch antennas 1005(2)(1)-1005(2)(4), such is not limiting. For example, only the patch antennas 1005(1)(1)-1005(1)(4) or patch antennas 1005(2)(1)-1005(2)(4) could be included in the package substrate 1302 in FIG. 14A. Also, any desired number of patch antennas may be included on any given metallization layer 534(5) and/or 534(6) in the package substrate 1302 in FIG. 14A. Patch antennas can also be included on any other metallization layer(s) 534(1)-534(4) in the second metallization layers 506(2) or first metallization layers 506(1) of the package substrate 1302 in FIG. 14A.

Also note that in another exemplary aspect, the respective metal interconnects 840(1), 840(2) interconnected by the respective vias 842(1), 842(2) in the first metallization layers 506(1) of the package substrate 1302 in FIG. 14A do not have to be coupled to the respective metal interconnects 844(1), 844(2) interconnected by the respective vias 846(1), 846(2) in the second metallization layers 506(2). The metal posts 848(1), 848(2) that are shown in the core substrate 508 interconnecting the respective metal interconnects 840(1), 840(2) interconnected by the respective vias 842(1), 842(2) in the first metallization layers 506(1), to the respective metal interconnects 844(1), 844(2) interconnected by the respective vias 846(1), 846(2) in the second metallization layers 506(2) do not have to be included. In this manner, in this alternative aspect, the respective metal interconnects 840(1), 840(2) interconnected by the respective vias 842(1), 842(2) in the first metallization layers 506(1) would form a first patch antenna in the package substrate 502, and the respective metal interconnects 844(1), 844(2) interconnected by the respective vias 846(1), 846(2) in the second metallization layers 506(2) would each form four (4) separate vertically-integrated patch antennas in the package substrate 802.

FIG. 14B is a side view of an alternative package substrate 1302A similar to the package substrate 1302 in FIG. 14A where alternative vertically-integrated patch antennas 704A(1), 704A(2), 804A(1), 804A(2) are vertically integrated in the vertical direction (Z-axis direction) only in the first metallization layers 506(1). Common elements between the package substrate 1302 in FIG. 14A, the package substrate 1302A in FIG. 14B, and the package substrate 802A in FIG. 9B are shown with common element numbers. Thus, the discussion of these common elements is also applicable to the package substrate 1302A in FIG. 14B. The package substrate 1302A in FIG. 14B is a cross-sectional side view along the $A_9$-$A_9'$ cross-section line in the package substrate 1302 in FIG. 13.

As shown in FIG. 14B, patch antennas 704A(1), 704A(2) are formed from a plurality of other respective metal interconnects 540(1), 540(2) (e.g., metal lines, metal traces, metal posts) in the respective separate metallization layers 532(1)-532(6) in the first metallization layers 506(1) that are aligned in the vertical direction (Z-axis direction) and share the respective common vertical planes $P_7$, $P_8$. The respective metal interconnects 540(1), 540(2) in adjacent metallization layers 532(1)-532(6) are coupled to each other by the respective vias 542(1), 542(2) disposed in the respective adjacent metallization layers 532(1)-532(6). The respective metal interconnects 540(1), 540(2) are disposed in parallel to each other in the horizontal direction (X-axis and Y-axis directions). In this manner, the respective metal interconnects 540(1), 540(2) connected by the respective vias 542(1), 542(2) form adjacent vertically-integrated planar-shaped metal structures in the first metallization layers 506(1) that form the patch antennas 504A(1), 504A(2) in this example.

In this manner, the respective metal interconnects 540(1), 540(2) interconnected by the respective vias 542(1), 542(2) in the first metallization layers 506(1) form the respective patch antennas 704A(1), 704A(2) in this example. Thus, the patch antennas 704A(1), 704A(2) do not extend into the core substrate 508 or the second metallization layers 506(2) of the package substrate 1302A in this example in FIG. 14B. Like the package substrate 1302 in FIG. 14A, the metal interconnects 550(1), 550(2) formed in the solder resist layer 552 disposed on the metallization layer 532(6) of the first metallization layers 506(1) can serve as respective antenna feed lines 554(1), 554(2) to the patch antennas 504A(1), 504A(2).

As also shown in FIG. 14B, the patch antennas 804A(1), 804A(2) are formed from a plurality of other respective metal interconnects 840(1), 840(2) (e.g., metal lines, metal traces, metal posts) in the respective separate metallization layers 532(1)-532(6) in the first metallization layers 506(1) that are aligned in the vertical direction (Z-axis direction) and share the respective common vertical planes $P_9$, $P_{10}$ in the X-axis and Z-axis directions. The respective metal interconnects 840(1), 840(2) in adjacent metallization layers 532(1)-532(6) are coupled to each other by the respective vias 842(1), 842(2) disposed in the respective adjacent metallization layers 532(1)-532(6). The respective metal interconnects 840(1), 840(2) are disposed in parallel to each other in the horizontal direction (X-axis and Y-axis directions). In this manner, the respective metal interconnects 840(1), 840(2) connected by the respective vias 842(1), 842(2) form adjacent vertically-integrated planar-shaped metal structures in the first metallization layers 506(1) that form the patch antennas 804A(1), 804A(2) in this example.

In this manner, the respective metal interconnects 840(1), 840(2) interconnected by the respective vias 842(1), 842(2) in the first metallization layers 506(1) of the package substrate 1302A in FIG. 14B form the respective patch antennas 804A(1), 804A(2) in this example. Thus, the patch antennas 804A(1), 804A(2) do not extend into the core substrate 508 or the second metallization layers 506(2) of the package substrate 1302A in this example in FIG. 14B. Like the package substrate 1302 in FIG. 14A, the metal interconnects 850(1), 850(2) formed in the solder resist layer 552 disposed on the metallization layer 532(6) of the first metallization layers 506(1) can serve as respective antenna feed lines 854(1), 854(2) to the patch antennas 804A(1), 804A(2).

With continuing reference to FIG. 14B, like the package substrate 1002 in FIGS. 10A-10D, the package substrate 1302A in FIG. 14B can also include the patch antennas like patch antennas 1005(1)(1)-1005(1)(4), 1005(2)(1)-1005(2)(4) in the package substrate 1002 in FIGS. 10A-10D. The patch antennas 1005(1)(1)-1005(1)(4), 1005(2)(1)-1005(2)(4) are included in respective metallization layers 534(5), 534(6) in the package substrate 1302A in FIG. 14B in this example. Common elements related to the patch antennas 1005(1)(1)-1005(1)(4), 1005(2)(1)-1005(2)(4) between the package substrate 1002 in FIG. 10A-10D and the package substrate 1302A in FIG. 14B are shown with common element numbers and are not re-described. Note that although pairs of respective patch antennas 1005(1)(1)-1005(1)(4), 1005(2)(1)-1005(2)(4) are included in the package substrate 1302A in the example in FIG. 14B, wherein patch antennas 1005(1)(1)-1005(1)(4) are EM coupled to patch antennas 1005(2)(1)-1005(2)(4), such is not limiting. For example, only the patch antennas 1005(1)(1)-1005(1)(4) or patch antennas 1005(2)(1)-1005(2)(4) could be included in the package substrate 1302 in FIG. 14A. Also, any desired number of patch antennas may be included on any given metallization layer 534(5) and/or 534(6) in the package substrate 1302A in FIG. 14B. Patch antennas can also be included on any other metallization layer(s) 534(1)-534(4) in the second metallization layers 506(2) or first metallization layers 506(1) of the package substrate 1302A in FIG. 14B.

Note that alternatively, the package substrate 1302A in FIG. 14B could be provided such that the patch antennas are provided in the second metallization layers 506(2) and not in the first metallization layers 506(1). In this regard, like shown in the package substrate 1302 in FIG. 14A, in this alternative aspect, patch antennas would be formed of the plurality of other respective metal interconnects 544(1), 544(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_6$, $P_7$. Also in this regard, like shown in the package substrate 1302 in FIG. 14A, in this alternative aspect, patch antennas would be formed of the plurality of other respective metal interconnects 844(1), 844(2) (e.g., metal lines, metal traces, metal posts) in the respective separate metallization layers 534(1)-534(6) in the second metallization layers 506(2) that are aligned in the vertical direction (Z-axis direction) and share the respective common vertical planes $P_4$, $P_5$.

Figure 15:
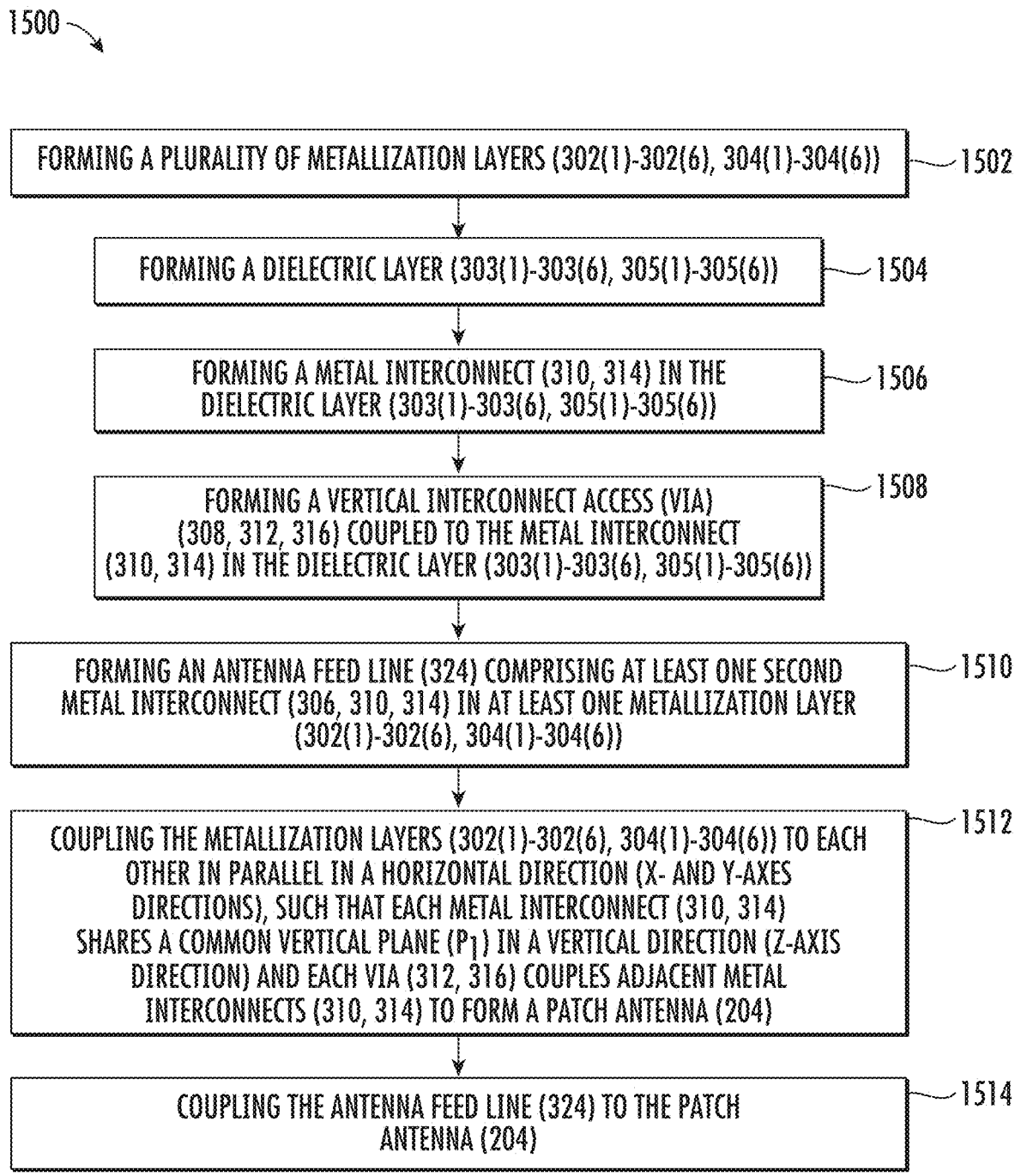
FIG. 15 is a flowchart illustrating an exemplary fabrication process for fabricating a package substrate that includes a vertically-integrated patch antenna(s), including the vertically-integrated patch antennas in the package substrates in FIGS. 2-14B.

There are various manners in which a package substrate that includes vertically-integrated patch antennas, such as the package substrates 202, 502, 502A, 702, 802, 802A, 1002, 1202, 1302, 1302A in FIGS. 2-14B can be formed and fabricated. FIG. 15 is a flowchart illustrating an exemplary fabrication process 1500 for fabricating a package substrate that includes vertically-integrated patch antennas. The fabrication process 1500 in FIG. 15 is discussed with regard to the package substrate 202 in FIGS. 2-3D as an example.

In this regard, the fabrication process 1500 includes forming a plurality of metallization layers 302(1)-302(6), 304(1)-304(6) (block 1502 in FIG. 15). Forming the plurality of metallization layers 302(1)-302(6), 304(1)-304(6) each includes forming dielectric layers 303(1)-303(6), 305(1)-305(6) for the respective metallization layer 302(1)-302(6), 304(1)-304(6) (block 1504 in FIG. 15), forming a metal interconnect 310, 314 in the respective dielectric layer (303(1)-303(6), 305(1)-305(6) (block 1506 in FIG. 15), and forming a via 308, 312, 316 coupled to a respective metal interconnect 310, 314 in the respective dielectric layer (303(1)-303(6), 305(1)-305(6)) (block 1508 in FIG. 15). The fabrication process 1500 also includes forming an antenna feed line 324 comprising at least one second metal interconnect(s) 306, 310, 314 in at least one metallization layer(s) 302(1)-302(6), 304(1)-304(6) among the plurality of metallization layers 302(1)-302(6), 304(1)-304(6) (block 1510 in FIG. 15). The fabrication process 1500 also includes coupling the plurality of metallization layers 302(1)-302(6), 304(1)-304(6) to each other in parallel (e.g., stacked on each other) in a horizontal direction (X-axis and Y-axis directions) in respective horizontal planes, such that each metal interconnect 310, 314 in the plurality of metallization layers 302(1)-302(6), 304(1)-304(6) shares a common vertical plane $P_1$ and each via 312, 316 in the plurality of metallization layers 302(1)-302(6), 304(1)-304(6) couples adjacent metal interconnects 310, 314 in adjacent metallization layers 302(1)-302(6), 304(1)-304(6) among the plurality of metallization layers 302(1)-302(6), 304(1)-304(6) (block 1512 in FIG. 15). The metal interconnects 310, 314 in the plurality of metallization layers 302(1)-302(6), 304(1)-304(6) are coupled by the vias 312, 316 in the plurality of metallization layers 302(1)-302(6), 304(1)-304(6) to form the patch antenna 204. The fabrication process 1500 also includes coupling the antenna feed line 324 to the patch antenna 204(block 1514 in FIG. 15).

Other fabrication methods are also possible. For example, FIGS. 16A and 16B illustrate another exemplary fabrication process 1600 of fabricating a package substrate that includes a vertically-integrated patch antenna(s) without including other horizontally-integrated patch antennas, including but not limited to, the package substrates 202, 502, 502A, 702, 802, 802A in FIGS. 2-9B. FIGS. 17A-17D illustrate exemplary fabrication stages 1700A-1700D, respectively, during fabrication of a package substrate includes a patch antenna according to the exemplary fabrication process 1600 in FIGS. 16A and 16B. The exemplary fabrication process 1600 in FIGS. 16A and 16B will now be discussed in regard to the exemplary fabrication stages 1700A-1700D in FIGS. 17A-17D using the package substrate 202 in FIGS. 2-3D as an example. However, note that the fabrication process 1600 in FIGS. 16A and 16B can be employed to fabricate other package substrates that include a patch antenna(s).

In this regard, as shown in the exemplary fabrication stage 1700A in FIG. 17A, a first exemplary step in the fabrication process 1600 in FIG. 16A is to form the core substrate 208 (block 1602 in FIG. 16A). The core substrate 208 can be formed of a strong dielectric material 1702 in a dielectric layer 1704 that has a desired stiffness to resist bending or warpage. Metal posts 222 are formed in the dielectric layer 1704 to support metal interconnects with other substrates that are disposed in contact with the core substrate 208.

As shown in the exemplary fabrication stage 1700B in FIG. 17B, a next exemplary step in the fabrication process 1600 in FIG. 16A is to form metallization layer 302(1) and metallization layer 304(1) coupled to the core substrate 208 (block 1604 in FIG. 16A). Metal interconnects 310, 314 are formed in the respective dielectric layers 303(1), 305(1) of the metallization layer 302(1) and metallization layer 304(1) that will be used to form a patch antenna. Vias 312, 316 formed in contact with the metal interconnects 310, 314 in the metallization layers 302(1), 304(1) are formed to couple adjacent metal interconnects 310, 314 together to form the patch antenna. The metal post 318 is formed in the core substrate 208 and coupled to the metal interconnects 310, 314. For example, the metal interconnects 310, 314 formed in the metallization layers 302(1), 304(1) may be drilled to form openings that are filled in with metal material to form the vias 312, 316 and metal post 318. In this example, the metal interconnects 310, 314 are formed to be aligned with each other in a vertical direction (Z-axis direction) such that the metal interconnects 310, 314 share the common vertical plane $P_1$. Other metal interconnects 306 can be formed in the metallization layer 302(1) and metallization layer 304(1) for signal routing, such as shown in the metallization layer 304(1) in the fabrication stage 1700B in FIG. 17B.

As shown in the exemplary fabrication stage 1700C in FIG. 17C, additional metallization layers 302(2)-302(4) as part of the first metallization layers 206(1) and metallization layers 304(2)-304(4) as part of the second metallization layers 206(2) are formed on respective prior formed metallization layers 302(1), 304(1) on the core substrate 208 (block 1606 in FIG. 16B). Metal interconnects 310, 314 are formed in the respective dielectric layers 303(2)-303(4), 305(2)-305(4) of the metallization layers 302(2)-302(4) and metallization layers 304(2)-304(4) that will be used to form a patch antenna. Vias 312, 316 are formed in contact with the adjacent metal interconnects 310, 314 in the metallization layers 302(2)-302(4), 304(2)-304(4) to couple adjacent metal interconnects 310, 314 together to form the patch antenna 204. In this example, the metal interconnects 310, 314 are formed to be aligned with each other in a vertical direction (Z-axis direction) such that the metal interconnects 310, 314 share the common vertical plane $P_1$.

As shown in the exemplary fabrication stage 1700D in FIG. 17D, additional metallization layers 302(5)-302(6) as part of the first metallization layers 206(1) and metallization layers 304(5)-304(6) as part of the second metallization layers 206(2) are formed on prior formed metallization layers 302(4), 304(4) on the core substrate 208 (block 1608 in FIG. 16B). Metal interconnects 310, 314 are formed in the respective dielectric layers 303(5)-303(6), 305(5)-305(6) of the metallization layers 302(5)-302(6) and metallization layers 304(5)-304(6) to form the patch antenna 204 in the package substrate 202. Vias 312, 316 are formed in contact with the adjacent metal interconnects 310, 314 in the metallization layers 302(2)-302(4), 304(2)-304(4) to couple adjacent metal interconnects 310, 314 together to form the patch antenna 204.

FIGS. 18A-18C is a flowchart illustrating another exemplary fabrication process 1800 that can be used to fabricate a package substrate that includes a vertically-integrated patch antenna(s) and also includes a horizontally-integrated patch antenna(s), including but not limited to, the package substrates 1002, 1202, 1302, 1302A in FIGS. 10A-14B. FIGS. 19A-19D illustrate exemplary fabrication stages 1900A-1900D, respectively, during fabrication of a package substrate that includes a vertically-integrated patch antenna(s) and a horizontally-integrated patch antenna(s) according to the exemplary fabrication process 1800 in FIGS. 18A-18C. The exemplary fabrication process 1800 in FIGS. 18A-18C will now be discussed in regard to the exemplary fabrication stages 1900A-1900D in FIGS. 19A-19E. The fabrication stages 1900A-1900D in FIGS. 19A-19D illustrate fabrication stages 1900A-1900D of the fabrication of the package substrate 1002 in FIG. 10D. The previous discussion of the package substrate 1002 in FIG. 10D above is also applicable to the fabrication stages 1900A-1900D in FIGS. 19A-19D. However, note that the fabrication process 1800 in FIGS. 18A-18C can be employed to fabricate other package substrates that include a vertically-integrated patch antenna(s) and a horizontally-integrated patch antenna(s), including but not limited to the package substrates 1202, 1302, 1302A in FIGS. 12A-14B.

In this regard, as shown in the exemplary fabrication stage 1900A in FIG. 19A, a first exemplary step in the fabrication process 1800 in FIG. 18A is to form the core substrate 1008 (block 1802 in FIG. 18A). The core substrate 208 can be formed of a strong dielectric material 1902 in a dielectric layer 1904 that has a desired stiffness to resist bending or warpage. Metal posts 1906 are formed in the dielectric layer 1904 to support metal interconnects with other substrates that are disposed in contact with the core substrate 208.

As shown in the exemplary fabrication stage 1900B in FIG. 19B, a next exemplary step in the fabrication process 1800 in FIG. 18A is to form metallization layer 1032(1) and metallization layer 1034(1) coupled to the core substrate 1008 (block 1804 in FIG. 18A). Metal interconnects 1040, 1044 are formed in the respective dielectric layers 1003(1), 1005(1) of the metallization layer 1032(1) and metallization layer 1034(1) that will be used to form a vertically-integrated patch antenna. Vias 1042, 1046 are formed in contact with the respective metal interconnects 1040, 1044 in the metallization layers 1032(1), 1034(1) to couple adjacent respective metal interconnects 1040, 1044 together to form a patch antenna. The metal post 1018 is formed in the core substrate 1008 and coupled to the respective metal interconnects 1040, 1044. For example, the metal interconnects 1040, 1044 formed in the metallization layers 1032(1), 1034(1) may be drilled to form openings that are filled in with metal material to form the vias 1042, 1046 and the metal post 1018. In this example, the metal interconnects 1040, 1044 are formed to be aligned with each other in a vertical direction (Z-axis direction) such that the metal interconnects 1040, 1044 share the common vertical plane $P_6$. Other metal interconnects 1036 can be formed in the metallization layer 1032(1) and metallization layer 1034(1) for signal routing, such as shown in the metallization layer 1034(1) in the fabrication stage 1900B in FIG. 19B.

As shown in the exemplary fabrication stage 1900C in FIG. 19C, additional metallization layers 1032(2)-1032(4) as part of the first metallization layers 1006(1) and metallization layers 1034(2)-1034(4) as part of the second metallization layers 1006(2) are formed on prior formed metallization layers 1032(1), 1034(1) on the core substrate 1008 (block 1806 in FIG. 18B). Metal interconnects 1040, 1044 are formed in the respective dielectric layers 1003(2)-1003(4), 1005(2)-1005(4) of the metallization layers 1032(2)-1032(4) and metallization layers 1034(2)-1034(4) that will be used to form a patch antenna. Vias 1042, 1046 are formed in contact with the respective adjacent metal interconnects 1040, 1044 in the respective metallization layers 1032(2)-1032(4), 1034(2)-1034(4) to couple adjacent metal interconnects 1040, 1044 together to form a patch antenna 1004. In this example, the respective metal interconnects 1040, 1044 are formed to be aligned with each other in a vertical direction (Z-axis direction) such that the metal interconnects 1040, 1044 share the common vertical plane $P_6$.

As shown in the exemplary fabrication stage 1900D in FIG. 19D, additional metallization layers 1032(5)-1032(6) as part of the first metallization layers 1006(1) and metallization layers 1034(5)-1034(6) as part of the second metallization layers 1006(2) are formed on respective prior formed metallization layers 1032(4), 1034(4) on the core substrate 1008 (block 1808 in FIG. 18C). Metal interconnects 1040, 1044 are formed in the respective dielectric layers 1003(5)-1003(6), 1005(5)-1005(6) of the metallization layers 1032(5)-1032(6) and metallization layers 1034(5)-1034(6) to form the patch antenna 1004 in the package substrate 1002. Vias 1042, 1046 are formed in contact with the adjacent metal interconnects 1040, 1044 in the metallization layers 1032(2)-1032(4), 1034(2)-1034(4) to couple adjacent metal interconnects 1040, 1044 together to form the patch antenna 1004. The patch antennas 1005(1)(1)-1005(1)(4), 1005(2)(1)-1005(2)(4) are also formed as metal interconnects 1060 (e.g., metal lines, metal traces, metal posts) in the respective separate metallization layers 1034(5), 1034(6) in the second metallization layers 1006(2) in this example. The metal interconnects 1060 are formed as metal patches in this example that are disposed in respective horizontal planes $P_{1-H}$, $P_{2-H}$ in an elongated in a horizontal direction (X-axis and Y-axis directions) orthogonal to the vertical direction (Z-axis direction) to form the patch antennas 1005(1)(1)-1005(1)(4), 1005(2)(1)-1005(2)(4). Thus, the radiation patterns of patch antennas 1005(1)(1)-1005(1)(4), 1005(2)(1)-1005(2)(4) are in the vertical (Z-axis direction) first and second horizontal directions 1019(1)-1019(4) as shown in FIGS. 19D and 10D.

Note that in the discussion of examples of package substrates of above, the use of the terms "vertical" and "horizontal" in the description of such examples are relative terms to each other. A vertical direction can be in an axis of direction that is orthogonal to a horizontal direction. A vertical plane can be in two axes of direction (e.g., X-axis and Z-axis directions) that is orthogonal to a horizontal plane in two other axes of direction (e.g., X- and Y-axis directions).

Package substrates that include one or more vertically-integrated patch antennas, including, but not limited to, the package substrates in FIGS. 2-14B, 17A-17D, and 19A-19D, and according to any of the fabrication processes in FIGS. 15-16B and 18A-18B, may be provided in or integrated into any wireless communication device and/or processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 20:
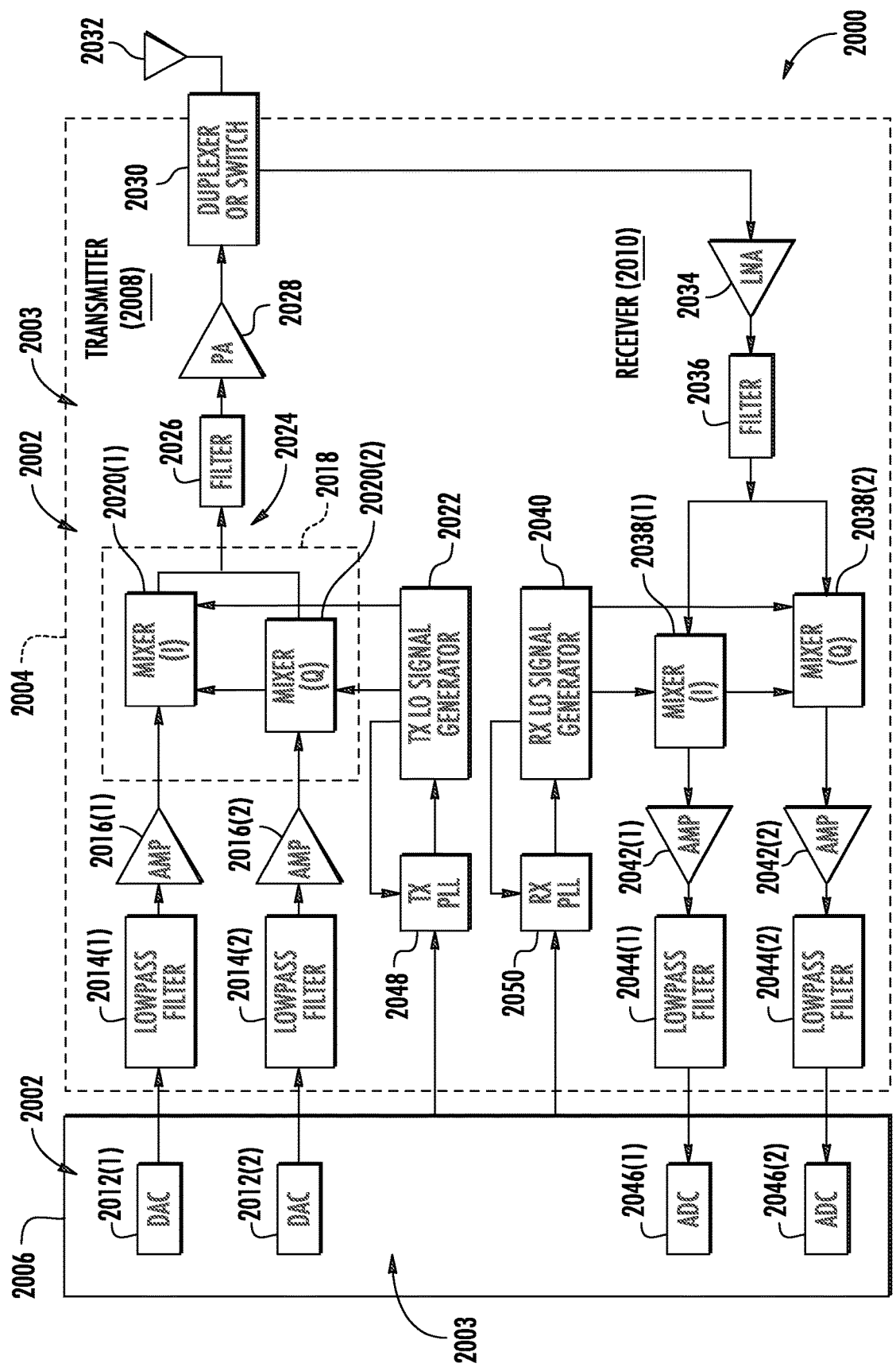
FIG. 20 is a block diagram of an exemplary wireless communications device that includes RF components provided in one or more RFIC packages employing a package substrate that includes one or more vertically-integrated patch antennas, including, but not limited to, the package substrates in FIGS. 2-14B, 17A-17D, and 19A-19D, and according to any of the fabrication processes in FIGS. 15-16B and 18A-18C.

FIG. 20 illustrates an exemplary wireless communications device 2000 that includes RF components formed from one or more ICs 2002, wherein any of the ICs 2002 can be included in an RFIC package 2003 employing a package substrate that includes one or more vertically-integrated patch antennas, including, but not limited to, the package substrates in FIGS. 2-14B, 17A-17D, and 19A-19D, and according to any of the fabrication processes in FIGS. 15-16B and 18A-18B. The wireless communications device 2000 may include or be provided in any of the above-referenced devices, as examples. As shown in FIG. 20, the wireless communications device 2000 includes a transceiver 2004 and a data processor 2006. The data processor 2006 may include a memory to store data and program codes. The transceiver 2004 includes a transmitter 2008 and a receiver 2010 that support bi-directional communications. In general, the wireless communications device 2000 may include any number of transmitters 2008 and/or receivers 2010 for any number of communication systems and frequency bands. All or a portion of the transceiver 2004 may be implemented on one or more analog ICs, RFICs, mixed-signal ICs, etc.

The transmitter 2008 or the receiver 2010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 2010. In the direct-conversion architecture, a signal is frequency-converted between RF and baseband in one stage. The super-heterodyne and direct-conversion architectures may use different circuit blocks and/or have different requirements. In the wireless communications device 2000 in FIG. 20, the transmitter 2008 and the receiver 2010 are implemented with the direct-conversion architecture.

In the transmit path, the data processor 2006 processes data to be transmitted and provides I and Q analog output signals to the transmitter 2008. In the exemplary wireless communications device 2000, the data processor 2006 includes digital-to-analog converters (DACs) 2012(1), 2012(2) for converting digital signals generated by the data processor 2006 into the I and Q analog output signals, e.g., I and Q output currents, for further processing.

Within the transmitter 2008, lowpass filters 2014(1), 2014(2) filter the I and Q analog output signals, respectively, to remove undesired signals caused by the prior digital-to-analog conversion. Amplifiers (AMPs) 2016(1), 2016(2) amplify the signals from the lowpass filters 2014(1), 2014(2), respectively, and provide I and Q baseband signals. An upconverter 2018 upconverts the I and Q baseband signals with I and Q transmit (TX) local oscillator (LO) signals through mixers 2020(1), 2020(2) from a TX LO signal generator 2022 to provide an upconverted signal 2024. A filter 2026 filters the upconverted signal 2024 to remove undesired signals caused by the frequency upconversion as well as noise in a receive frequency band. A power amplifier (PA) 2028 amplifies the upconverted signal 2024 from the filter 2026 to obtain the desired output power level and provides a transmit RF signal. The transmit RF signal is routed through a duplexer or switch 2030 and transmitted via an antenna 2032.

In the receive path, the antenna 2032 receives signals transmitted by base stations and provides a received RF signal, which is routed through the duplexer or switch 2030 and provided to a low noise amplifier (LNA) 2034. The duplexer or switch 2030 is designed to operate with a specific receive (RX)-to-TX duplexer frequency separation, such that RX signals are isolated from TX signals. The received RF signal is amplified by the LNA 2034 and filtered by a filter 2036 to obtain a desired RF input signal. Down-conversion mixers 2038(1), 2038(2) mix the output of the filter 2036 with I and Q RX LO signals (i.e., LO_I and LO_Q) from an RX LO signal generator 2040 to generate I and Q baseband signals. The I and Q baseband signals are amplified by AMPs 2042(1), 2042(2) and further filtered by lowpass filters 2044(1), 2044(2) to obtain I and Q analog input signals, which are provided to the data processor 2006. In this example, the data processor 2006 includes analog-to-digital converters (ADCs) 2046(1), 2046(2) for converting the analog input signals into digital signals to be further processed by the data processor 2006.

In the wireless communications device 2000 of FIG. 20, the TX LO signal generator 2022 generates the I and Q TX LO signals used for frequency upconversion, while the RX LO signal generator 2040 generates the I and Q RX LO signals used for frequency downconversion. Each LO signal is a periodic signal with a particular fundamental frequency. A TX phase-locked loop (PLL) circuit 2048 receives timing information from the data processor 2006 and generates a control signal used to adjust the frequency and/or phase of the TX LO signals from the TX LO signal generator 2022. Similarly, an RX PLL circuit 2050 receives timing information from the data processor 2006 and generates a control signal used to adjust the frequency and/or phase of the RX LO signals from the RX LO signal generator 2040.

Figure 21:
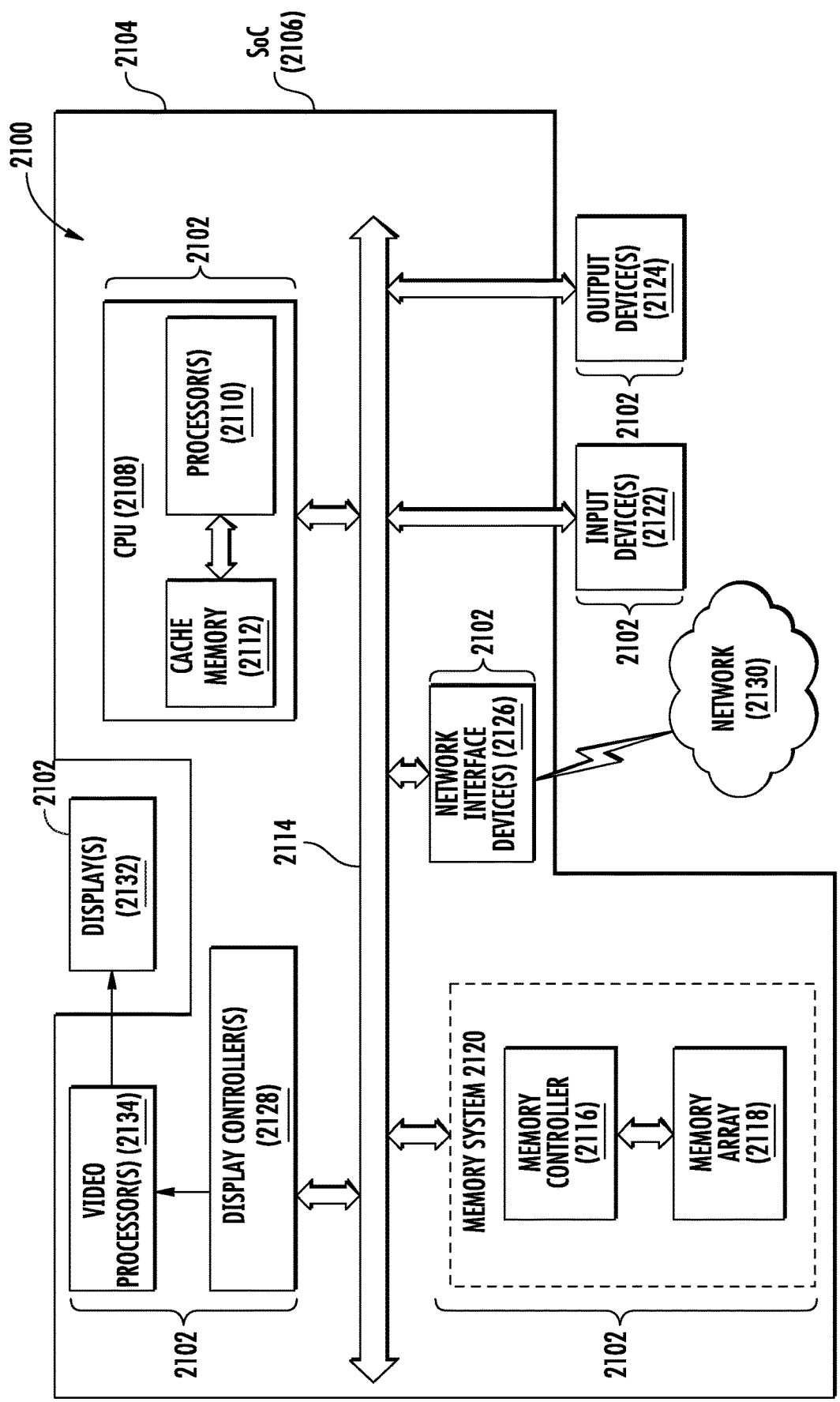
FIG. 21 is a block diagram of an exemplary processor-based system that includes RF components provided in one or more RFIC packages employing a package substrate that includes one or more vertically-integrated patch antennas, including, but not limited to, the package substrates in FIGS. 2-14B, 17A-17D, and 19A-19D, and according to any of the fabrication processes in FIGS. 15-16B and 18A-18C.

FIG. 21 illustrates an example of a processor-based system 2100. The components of the processor-based system 2100 are ICs 2102. Some or all of the ICs 2102 in the processor-based system 2100 can be provided as an IC package 2104 employing a package substrate that includes one or more vertically-integrated patch antennas, including, but not limited to, the package substrates in FIGS. 2-14B, 17A-17D, and 19A-19D, and according to any of the fabrication processes in FIGS. 15-16B and 18A-18B, and according to any aspects disclosed herein. In this example, the processor-based system 2100 may be formed as an IC package 2104 as a system-on-a-chip (SoC) 2106. The processor-based system 2100 includes a CPU 2108 that includes one or more processors 2110, which may also be referred to as CPU cores or processor cores. The CPU 2108 may have cache memory 2112 coupled to the CPU 2108 for rapid access to temporarily stored data. The CPU 2108 is coupled to a system bus 2114 and can intercouple master and slave devices included in the processor-based system 2100. As is well known, the CPU 2108 communicates with these other devices by exchanging address, control, and data information over the system bus 2114. For example, the CPU 2108 can communicate bus transaction requests to a memory controller 2116 as an example of a slave device. Although not illustrated in FIG. 21, multiple system buses 2114 could be provided, wherein each system bus 2114 constitutes a different fabric.

Other master and slave devices can be connected to the system bus 2114. As illustrated in FIG. 21, these devices can include a memory system 2120 that includes the memory controller 2116 and a memory array(s) 2118, one or more input devices 2122, one or more output devices 2124, one or more network interface devices 2126, and one or more display controllers 2128, as examples. Each of the memory system 2120, the one or more input devices 2122, the one or more output devices 2124, the one or more network interface devices 2126, and the one or more display controllers 2128 can be provided in the same or different IC packages. The input device(s) 2122 can include any type of input device, including, but not limited to, input keys, switches, voice processors, etc. The output device(s) 2124 can include any type of output device, including, but not limited to, audio, video, other visual indicators, etc. The network interface device(s) 2126 can be any device configured to allow exchange of data to and from a network 2130. The network 2130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 2126 can be configured to support any type of communications protocol desired.

The CPU 2108 may also be configured to access the display controller(s) 2128 over the system bus 2114 to control information sent to one or more displays 2132. The display controller(s) 2128 sends information to the display(s) 2132 to be displayed via one or more video processors 2134, which processes the information to be displayed into a format suitable for the display(s) 2132. The display controller(s) 2128 and video processor(s) 2134 can be included as IC package 2104 and the same or different IC packages, and in the same or different IC packages containing the CPU 2108 as an example. The display(s) 2132 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A package substrate, comprising:
   a plurality of first metallization layers parallel to each other in a first direction;
   a first patch antenna, comprising:
      a plurality of first metal interconnects each disposed in a separate first metallization layer among the plurality of first metallization layers;
         each of the plurality of first metal interconnects sharing a first common plane in a second direction orthogonal to the first direction; and
      a plurality of first vias each disposed in the separate first metallization layer among the plurality of first metallization layers, and each coupling adjacent first metal interconnects among the plurality of first metal interconnects in adjacent first metallization layers among the plurality of first metallization layers; and
   a first antenna feed line coupled to the first patch antenna.

2. The package substrate of clause 1, wherein each of the plurality of first metal interconnects are disposed parallel to each other in the first direction.

3. The package substrate of clause 1 or 2, wherein the plurality of first vias comprise a plurality of first elongated vias each elongated in the first direction and each coupling the adjacent first metal interconnects among the plurality of first metal interconnects in the adjacent first metallization layers among the plurality of first metallization layers to form a planar-shaped structure in the first common plane.

4. The package substrate of clause 3, wherein the planar-shaped structure has a trench shape.

5. The package substrate of clause 3 or 4, wherein the plurality of first elongated vias each comprise a trench.

6. The package substrate of any of clauses 1 to 5, wherein the first patch antenna is rectangular-shaped.

7. The package substrate of any of clauses 1 to 6, wherein the first patch antenna is configured to radiate a radio-frequency (RF) signal received from the first antenna feed line.

8. The package substrate of any of clauses 1 to 7, further comprising a plurality of second metallization layers parallel to the plurality of first metallization layers in the first direction, wherein:
   the first patch antenna is not disposed in the plurality of second metallization layers.

9. The package substrate of clause 8, further comprising a core substrate disposed between the plurality of first metallization layers and the plurality of second metallization layers, wherein:
   the first patch antenna is further not disposed in the core substrate.

10. The package substrate of clause 8 or 9, further comprising:
    a second patch antenna, comprising:
       a plurality of third metal interconnects each disposed in a separate second metallization layer among the plurality of second metallization layers;
          each of the plurality of third metal interconnects sharing a third second common plane in the second direction; and
       a plurality of second vias each disposed in the separate second metallization layer among the plurality of second metallization layers, and each coupling adjacent third metal interconnects among the plurality of third metal interconnects in adjacent second metallization layers among the plurality of second metallization layers; and
    a second antenna feed line coupled to the second patch antenna.

11. The package substrate of any of clauses 1 to 7, wherein:
the plurality of first metallization layers comprises a first outer metallization layer and a second outer metallization layer; and
the plurality of first metal interconnects each are disposed in each of the plurality of first metallization layers.

12. The package substrate of any of clauses 1 to 7 and 11, further comprising:
a plurality of second metallization layers parallel to the plurality of first metallization layers in the first direction; and
a core substrate disposed between the plurality of first metallization layers and the plurality of second metallization layers;
wherein:
the first patch antenna further comprises:
a plurality of third metal interconnects each disposed in a separate second metallization layer among the plurality of second metallization layers;
each of the plurality of third metal interconnects sharing a second common plane in the second direction;
a plurality of second vias each disposed in the separate second metallization layer among the plurality of second metallization layers, and each coupling adjacent third metal interconnects among the plurality of third metal interconnects in adjacent second metallization layers among the plurality of second metallization layers; and
a metal post disposed in the core substrate electrically coupling the plurality of first metal interconnects to the plurality of third metal interconnects.

13. The package substrate of any of clauses 1 to 7, 11, and 12, further comprising a second patch antenna, comprising:
at least one third metal interconnect disposed in a second plane in the first direction in a first metallization layer among the plurality of first metallization layers; and
a second antenna feed line coupled to the first patch antenna.

14. The package substrate of clause 13, wherein the first patch antenna is rectangular-shaped.

15. The package substrate of clause 13 or 14, wherein:
the first patch antenna has a first antenna radiation pattern extending in the first direction; and
the second patch antenna has a second antenna radiation pattern extending in the second direction orthogonal to the first direction.

16. The package substrate of any of clauses 13 to 15, further comprising a third patch antenna, comprising at least one fifth metal interconnect disposed in a third plane in the first direction in a second metallization layer among the plurality of second metallization layers.

17. The package substrate of clause 16, wherein the second patch antenna is configured to be electro-magnetically (EM) coupled to the second patch antenna in response to the first patch antenna radiating a radio-frequency (RF) signal received from the second antenna feed line.

18. The package substrate of clause 17, wherein:
the first patch antenna has a first antenna radiation pattern extending in the first direction; and
the third patch antenna has a second antenna radiation pattern extending in the second direction orthogonal to the first direction.

19. The package substrate of any of clauses 1 to 7, further comprising a second patch antenna, comprising:
a plurality of third metal interconnects each disposed in the separate first metallization layer among the plurality of first metallization layers;
each of the plurality of third metal interconnects sharing a second common plane in the second direction, the second common plane parallel to the first common plane; and
a plurality of second vias each disposed in the separate first metallization layer among the plurality of first metallization layers, and each coupling adjacent third metal interconnects among the plurality of third metal interconnects in adjacent first metallization layers among the plurality of first metallization layers.

20. The package substrate of clause 19, wherein the first patch antenna is configured to be electro-magnetically (EM) coupled to the second patch antenna in response to the first patch antenna radiating a radio-frequency (RF) signal received from the first antenna feed line.

21. The package substrate of clause 19 or 20, further comprising a plurality of second metallization layers parallel to the plurality of first metallization layers in the first direction, wherein:
the first patch antenna is not disposed in the plurality of second metallization layers; and
the second patch antenna is not disposed in the plurality of second metallization layers.

22. The package substrate of clause 21, further comprising a core substrate disposed between the plurality of first metallization layers and the plurality of second metallization layers, wherein:
the first patch antenna is further not disposed in the core substrate; and
the second patch antenna is further not disposed in the core substrate.

23. The package substrate of clause 22, further comprising:
a third patch antenna, comprising:
a plurality of fourth metal interconnects each disposed in a separate second metallization layer among the plurality of second metallization layers;
each of the plurality of fourth metal interconnects sharing a common third plane in the second direction; and
a plurality of third vias each disposed in the separate second metallization layer among the plurality of second metallization layers, and each coupling adjacent fourth metal interconnects among the plurality of fourth metal interconnects in adjacent second metallization layers among the plurality of second metallization layers;
a second antenna feed line coupled to the third patch antenna; and
a fourth patch antenna, comprising:
a plurality of sixth metal interconnects each disposed in the separate second metallization layer among the plurality of second metallization layers;
each of the plurality of sixth metal interconnects sharing a common fourth plane in the second direction; and
a plurality of fourth vias each disposed in the separate second metallization layer among the plurality of second metallization layers, and each coupling adjacent sixth metal interconnects among the plurality of sixth metal interconnects in adjacent second metallization layers among the plurality of second metallization layers.

24 The package substrate of clause 23, wherein the third patch antenna is configured to be electro-magnetically (EM)

coupled to the fourth patch antenna in response to the third patch antenna radiating a radio-frequency (RF) signal received from the second antenna feed line.

25. The package substrate of clause 19 or 20, further comprising a plurality of second metallization layers parallel to the plurality of first metallization layers in the first direction, wherein:
   the plurality of first metallization layers comprises a first outer metallization layer;
   the plurality of second metallization layers comprises a second outer metallization layer;
   the plurality of first metal interconnects each are disposed in each of the plurality of first metallization layers and the plurality of second metallization layers; and
   the plurality of third metal interconnects each are disposed in each of the plurality of first metallization layers and the plurality of second metallization layers.

26. The package substrate of clause 19, further comprising:
   a plurality of second metallization layers parallel to the plurality of first metallization layers in the first direction; and
   a core substrate disposed between the plurality of first metallization layers and the plurality of second metallization layers;
   wherein:
      the first patch antenna further comprises:
         a plurality of fourth metal interconnects each disposed in a separate second metallization layer among the plurality of second metallization layers;
         each of the plurality of fourth metal interconnects sharing a common third plane in the second direction;
         a plurality of third vias each disposed in the separate second metallization layer among the plurality of second metallization layers, and each coupling adjacent fourth metal interconnects among the plurality of fourth metal interconnects in adjacent second metallization layers among the plurality of second metallization layers; and
         a metal post disposed in the core substrate electrically coupling the plurality of fourth metal interconnects to the plurality of first metal interconnects; and
      the second patch antenna further comprises:
         a plurality of fifth metal interconnects each disposed in the separate second metallization layer among the plurality of second metallization layers;
         each of the plurality of fifth metal interconnects sharing a common fourth plane in the second direction;
         a plurality of fourth vias each disposed in the separate second metallization layer among the plurality of second metallization layers, and each coupling adjacent fifth metal interconnects among the plurality of fifth metal interconnects in adjacent second metallization layers among the plurality of second metallization layers; and
         a second metal post disposed in the core substrate electrically coupling the plurality of fifth metal interconnects to the plurality of third metal interconnects.

27. The package substrate of any of clauses 1 to 7, further comprising:
   a first side in the first direction; and
   a second side opposite the first side in the first direction;
   wherein the first patch antenna is adjacent to the first side of the package substrate; and
   further comprising:
      a second patch antenna adjacent to the second side of the package substrate, the second patch antenna comprising, comprising:
         a plurality of third metal interconnects each disposed in the separate first metallization layer among the plurality of first metallization layers;
            each of the plurality of third metal interconnects sharing a second common plane in the second direction, the second common plane parallel to the first common plane; and
            a plurality of second vias each disposed in the separate first metallization layer among the plurality of first metallization layers, and each coupling adjacent third metal interconnects among the plurality of third metal interconnects in adjacent first metallization layers among the plurality of first metallization layers; and
         a second antenna feed line coupled to the second patch antenna.

28 The package substrate of clause 27, wherein:
   the first patch antenna has first antenna radiation pattern extending a first horizontal direction away from the package substrate; and
   the second patch antenna has second antenna radiation pattern extending in a second horizontal direction opposite the first horizontal direction away from the package substrate.

29. The package substrate of clause 27 or 28, further comprising a third patch antenna, comprising:
   at least one fifth metal interconnect disposed in a third plane in the first direction in a first metallization layer among the plurality of first metallization layers; and
   a third antenna feed line coupled to the third patch antenna.

30. The package substrate of clause 29, wherein the third patch antenna is rectangular-shaped.

31 The package substrate of clause 29 or 30, wherein:
   the first patch antenna has first antenna radiation pattern extending in a first horizontal direction away from the package substrate;
   the second patch antenna has second antenna radiation pattern extending in a second horizontal direction opposite the first horizontal direction away from the package substrate; and
   the third patch antenna has a third antenna radiation pattern extending in the second direction orthogonal to the first horizontal direction and the second horizontal direction.

32. The package substrate of any of clauses 1 to 31, wherein the first patch antenna has fifth generation (5G) frequency bandwidth.

33. The package substrate of any of clauses 1 to 32 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

34. A method of fabricating a package substrate, comprising:
forming a plurality of first metallization layers, wherein forming each first metallization layer among the plurality of first metallization layers comprises:
forming a first dielectric layer;
forming a first metal interconnect in the first dielectric layer; and
forming a first via coupled to the first metal interconnect in the first dielectric layer;
forming a first antenna feed line;
coupling the plurality of first metallization layers to each other in parallel in a first direction, such that each first metal interconnect in the plurality of first metallization layers shares a first common plane in a second direction orthogonal to the first direction and each first via in the plurality of first metallization layers couples adjacent metal first interconnects in adjacent first metallization layers among the plurality of first metallization layers, wherein the first metal interconnect in each of the plurality of first metallization layers coupled by the first vias in the plurality of first metallization layers form a first patch antenna; and
coupling the first antenna feed line to the first patch antenna.

35. The method of clause 34, further comprising:
forming a plurality of second metallization layers, wherein forming each second metallization layer among the plurality of second metallization layers comprises:
forming a second dielectric layer;
forming a third metal interconnect in the second dielectric layer; and
forming a second via coupled to the third metal interconnect in the second dielectric layer; and
coupling the plurality of second metallization layers in parallel to the plurality of first metallization layers in the first direction.

36. The method of clause 35, further comprising disposing a core substrate between the plurality of first metallization layers and the plurality of second metallization layers.

37. The method of clause 35 or 36, further comprising:
forming a second antenna feed line;
coupling the plurality of second metallization layers to each other in parallel in the first direction, such that each second metal interconnect in the plurality of second metallization layers shares a second common plane in the second direction and each second via in the plurality of second metallization layers couples adjacent third metal interconnects among the third metal interconnects in adjacent second metallization layers among the plurality of second metallization layers, wherein the third metal interconnects in the plurality of second metallization layers coupled by the second vias form a second patch antenna; and
coupling the second antenna feed line to the second patch antenna.

38. The method of clause 34, wherein forming the plurality of first metallization layers comprises:
forming a first outer metallization layer comprising the first dielectric layer, the first metal interconnect in the first dielectric layer, and the first via coupled to the first metal interconnect in the first dielectric layer; and
forming a second outer metallization layer comprising:
forming a second dielectric layer;
forming a second metal interconnect in the second dielectric layer; and
forming a second via coupled to the second metal interconnect in the second dielectric layer;
wherein coupling the plurality of first metallization layers to each other comprises coupling the first outer metallization layer and the second outer metallization layer to each other in parallel in the first direction, such that the first metal interconnect in the first outer metallization layer and the second metal interconnect in the second outer metallization layer share the first common plane in the second direction and the first via in the first outer metallization layer is coupled to the second via in the second outer metallization layer,
wherein the first patch antenna is further formed by the first metal interconnects in each of the plurality of first metallization layers coupled by the first vias in each of the plurality of first metallization layers, and the second metal interconnect in the second outer metallization layer coupled by the second via in the second outer metallization layer form the first patch antenna.

39. The method of any of clauses 34 to 36, further comprising:
forming a second patch antenna comprising disposing at least one third metal interconnect in a second plane in the first direction in a first metallization layer among the plurality of first metallization layers;
forming a second antenna feed line; and
coupling the second antenna feed line to the second patch antenna.

40. The method of clause 34, further comprising forming a third patch antenna, comprising:
forming a plurality of third metal interconnects each disposed in the separate first metallization layer among the plurality of first metallization layers;
each of the plurality of third metal interconnects sharing a second common plane in the second direction, the second common plane parallel to the first common plane;
forming a plurality of second vias each disposed in the separate first metallization layer among the plurality of first metallization layers; and
coupling each second via among the plurality of second vias to adjacent third metal interconnects among the plurality of third metal interconnects in adjacent first metallization layers among the plurality of first metallization layers.

41. The method of clause 34, further comprising:
forming a first side in the package substrate in the first direction; and
forming a second side in the package substrate opposite the first side in the first direction;
disposing the first patch antenna adjacent to the first side of the package substrate; and
further comprising:
forming a second patch antenna adjacent to the second side of the package substrate, comprising:
forming a plurality of third metal interconnects each disposed in the separate first metallization layer among the plurality of first metallization layers;
each of the plurality of third metal interconnects sharing a second common plane in the second direction, the second common plane parallel to the first common plane;

forming a plurality of second vias each disposed in the separate first metallization layer among the plurality of first metallization layers; and coupling each second via among the plurality of second vias to adjacent third metal interconnects among the plurality of third metal interconnects in adjacent first metallization layers among the plurality of first metallization layers;

forming a second antenna feed line; and coupling the second antenna feed line to the second patch antenna.

42. The method of clause 41, further comprising:

forming a third patch antenna, comprising:

disposing at least one fifth metal interconnect in a third plane in the first direction in a first metallization layer among the plurality of first metallization layers; and forming a third antenna feed line; and coupling the third antenna feed line coupled to the third patch antenna.

What is claimed is:

1. A package substrate, comprising:
 a plurality of first metallization layers parallel to each other in a first direction;
 a plurality of second metallization layers parallel to the plurality of first metallization layers in the first direction;
 a core substrate disposed between the plurality of first metallization layers and the plurality of second metallization layers;
 a first patch antenna, comprising:
  a plurality of first metal interconnects each disposed in a separate first metallization layer among the plurality of first metallization layers;
   each of the plurality of first metal interconnects sharing a first common plane in a second direction orthogonal to the first direction; and
  a plurality of first vias each disposed in the separate first metallization layer among the plurality of first metallization layers, and each configured to couple adjacent first metal interconnects among the plurality of first metal interconnects in adjacent first metallization layers among the plurality of first metallization layers;
 a plurality of second metal interconnects each disposed in a separate second metallization layer among the plurality of second metallization layers;
   each of the plurality of second metal interconnects sharing a second common plane in the second direction;
 a plurality of second vias each disposed in the separate second metallization layer among the plurality of second metallization layers, and each configured to electrically couple adjacent second metal interconnects among the plurality of second metal interconnects in adjacent second metallization layers among the plurality of second metallization layers; and
 a metal post disposed in the core substrate configured to electrically couple a first metal interconnect of the plurality of first metal interconnects to a second metal interconnect of the plurality of second metal interconnects; and
 a first antenna feed line coupled to the first patch antenna.

2. The package substrate of claim 1, wherein each of the plurality of first metal interconnects are disposed parallel to each other in the first direction.

3. The package substrate of claim 1, wherein the plurality of first vias comprise a plurality of first elongated vias each elongated in the first direction and each configured to couple the adjacent first metal interconnects among the plurality of first metal interconnects in the adjacent first metallization layers among the plurality of first metallization layers to form a planar-shaped structure in the first common plane.

4. The package substrate of claim 3, wherein the planar-shaped structure has a trench shape.

5. The package substrate of claim 3, wherein the plurality of first elongated vias each comprise a trench.

6. The package substrate of claim 1, wherein the first patch antenna is rectangular-shaped.

7. The package substrate of claim 1, wherein the first patch antenna is configured to radiate a radio-frequency (RF) signal received from the first antenna feed line.

8. The package substrate of claim 1, further comprising a second patch antenna, comprising:
 at least one third metal interconnect disposed in a second plane in the first direction in a first metallization layer among the plurality of first metallization layers; and
 a second antenna feed line coupled to the first patch antenna.

9. The package substrate of claim 8, wherein the first patch antenna is rectangular-shaped.

10. The package substrate of claim 8, wherein:
 the first patch antenna has a first antenna radiation pattern extending in the first direction; and
 the second patch antenna has a second antenna radiation pattern extending in the second direction orthogonal to the first direction.

11. The package substrate of claim 8, further comprising a third patch antenna, comprising at least one fifth metal interconnect disposed in a third plane in the first direction in a second metallization layer among the plurality of second metallization layers.

12. The package substrate of claim 11, wherein the third patch antenna is configured to be electro-magnetically (EM) coupled to the second patch antenna in response to the first patch antenna radiating a radio-frequency (RF) signal received from the second antenna feed line.

13. The package substrate of claim 12, wherein:
 the first patch antenna has a first antenna radiation pattern extending in the first direction; and
 the third patch antenna has a third antenna radiation pattern extending in the second direction orthogonal to the first direction.

14. The package substrate of claim 8, further comprising a third patch antenna, comprising:
 at least one fifth metal interconnect disposed in a third plane in the first direction in a first metallization layer among the plurality of first metallization layers; and
 a third antenna feed line coupled to the third patch antenna.

15. The package substrate of claim 14, wherein the third patch antenna is rectangular-shaped.

16. The package substrate of claim 15, wherein:
 the first patch antenna has first antenna radiation pattern extending in a first horizontal direction away from the package substrate;
 the second patch antenna has second antenna radiation pattern extending in a second horizontal direction opposite the first horizontal direction away from the package substrate; and the third patch antenna has a third antenna radiation pattern extending in the second direction orthogonal to the first horizontal direction and the second horizontal direction.

17. The package substrate of claim 1, further comprising a second patch antenna, comprising:
   a plurality of fourth metal interconnects each disposed in the separate first metallization layer among the plurality of first metallization layers;
      each of the plurality of fourth metal interconnects sharing a fourth common plane in the second direction, the fourth common plane parallel to the first common plane; and
   a plurality of third vias each disposed in the separate first metallization layer among the plurality of first metallization layers, and each configured to couple adjacent fourth metal interconnects among the plurality of fourth metal interconnects in adjacent first metallization layers among the plurality of first metallization layers.

18. The package substrate of claim 17, wherein the first patch antenna is configured to be electro-magnetically (EM) coupled to the second patch antenna in response to the first patch antenna radiating a radio-frequency (RF) signal received from the first antenna feed line.

19. The package substrate of claim 1, wherein the first patch antenna has fifth generation (5G) frequency bandwidth.

20. The package substrate of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

21. A method of fabricating a package substrate, comprising:
   forming a plurality of first metallization layers, wherein forming each first metallization layer among the plurality of first metallization layers comprises:
      forming a first metal interconnect; and
      forming a first via coupled to the first metal interconnect;
   forming a core substrate adjacent to the plurality of first metallization layers;
   forming a plurality of second metallization layers parallel to the plurality of first metallization layers and adjacent to the core substrate, such that the core substrate is between the plurality of first metallization layers and the plurality of second metallization layers, wherein forming each second metallization layer among the plurality of second metallization layers comprises:
      forming a second metal interconnect; and
      forming a second via coupled to the second metal interconnect;
   forming a first antenna feed line;
   coupling the plurality of first metallization layers to each other in parallel in a first direction, such that each first metal interconnect in the plurality of first metallization layers shares a first common plane in a second direction orthogonal to the first direction and each first via in the plurality of first metallization layers couples adjacent first metal interconnects in adjacent first metallization layers among the plurality of first metallization layers;
   coupling the plurality of second metallization layers to each other in parallel in the first direction, such that each second metal interconnect in the plurality of second metallization layers shares a second common plane in the second direction, and each second via in the plurality of second metallization layers couples adjacent second metal interconnects in adjacent second metallization layers among the plurality of second metallization layers;
   forming a metal post disposed in the core substrate electrically coupling a first metal interconnect in the plurality of first metallization layers to a second metal interconnect in the plurality of second metallization layers;
      wherein the first metal interconnect in each of the plurality of first metallization layers coupled by the first vias in the plurality of first metallization layers, the metal post, and the second metal interconnect in each of the plurality of second metallization layers coupled by the second vias in the plurality of second metallization layers form a first patch antenna; and
   coupling the first antenna feed line to the first patch antenna.

22. The method of claim 21, further comprising:
   forming a second patch antenna comprising disposing at least one third metal interconnect in a second plane in the first direction in a first metallization layer among the plurality of first metallization layers;
   forming a second antenna feed line; and
   coupling the second antenna feed line to the second patch antenna.

23. The method of claim 21, further comprising forming a second patch antenna, comprising:
   forming a plurality of third metal interconnects each disposed in a separate first metallization layer among the plurality of first metallization layers;
      each of the plurality of third metal interconnects sharing a third common plane in the second direction, the third common plane parallel to the first common plane;
   forming a plurality of second vias each disposed in the separate first metallization layer among the plurality of first metallization layers; and
   coupling each second via among the plurality of second vias to adjacent third metal interconnects among the plurality of third metal interconnects in adjacent first metallization layers among the plurality of first metallization layers.

24. A package substrate, comprising:
   a plurality of first metallization layers parallel to each other in a first direction,
      the plurality of first metallization layers comprising a first outer metallization layer and a second outer metallization layer on an opposite side of the first outer metallization layer in a second direction orthogonal to the first direction;
   a first patch antenna, comprising:
      a plurality of first metal interconnects disposed in each of the plurality of first metallization layers, each first metal interconnect of the plurality of first metal interconnects disposed in a separate first metallization layer among the plurality of first metallization layers;
each of the plurality of first metal interconnects sharing a first common plane in the second direction; and
a plurality of first vias each disposed in the separate first metallization layer of the plurality of first metallization layers, and each configured to couple adjacent first metal interconnects among the plurality of first metal interconnects in adjacent first metallization layers among the plurality of first metallization layers; and
a first antenna feed line coupled to the first patch antenna;
a second patch antenna, comprising:
a plurality of second metal interconnects disposed in each of the plurality of first metallization layers, each second metal interconnect of the plurality of second metal interconnects disposed in the separate first metallization layer among the plurality of first metallization layers;
each of the plurality of second metal interconnects sharing a second common plane in the second direction, the second common plane parallel to the first common plane; and
a plurality of second vias each disposed in the separate first metallization layer of the plurality of first metallization layers, and each configured to couple adjacent second metal interconnects among the plurality of second metal interconnects in adjacent first metallization layers among the plurality of first metallization layers.

25. The package substrate of claim 24, wherein the second patch antenna further comprises:
at least one third metal interconnect disposed in a second plane in the first direction in a first metallization layer among the plurality of first metallization layers; and
a second antenna feed line coupled to the first patch antenna.

26. The package substrate of claim 25, wherein:
the first patch antenna has a first antenna radiation pattern extending in the first direction; and
the second patch antenna has a second antenna radiation pattern extending in the second direction.

27. The package substrate of claim 25, wherein the second patch antenna is configured to be electro-magnetically (EM) coupled to the first patch antenna in response to the first patch antenna radiating a radio-frequency (RF) signal received from the second antenna feed line.

28. The package substrate of claim 25, further comprising a third patch antenna, comprising at least one fifth metal interconnect disposed in a third plane in the first direction in a first metallization layer among the plurality of first metallization layers.

29. The package substrate of claim 28, wherein:
the first patch antenna has a first antenna radiation pattern extending in the first direction; and
the third patch antenna has a third antenna radiation pattern extending in the second direction.

30. A package substrate, comprising:
a first side in a first direction;
a second side opposite the first side in the first direction;
a plurality of first metallization layers parallel to each other in the first direction;
a first patch antenna adjacent to the first side of the package substrate, the first patch antenna comprising:
a plurality of first metal interconnects each disposed in a separate first metallization layer among the plurality of first metallization layers;
each of the plurality of first metal interconnects sharing a first common plane in a second direction orthogonal to the first direction; and
a plurality of first vias each disposed in the separate first metallization layer among the plurality of first metallization layers, and each configured to couple adjacent first metal interconnects among the plurality of first metal interconnects in adjacent first metallization layers among the plurality of first metallization layers; and
a first antenna feed line coupled to the first patch antenna;
a second patch antenna adjacent to the second side of the package substrate, the second patch antenna comprising:
a plurality of second metal interconnects each disposed in the separate first metallization layer among the plurality of first metallization layers;
each of the plurality of second metal interconnects sharing a second common plane in the second direction, the second common plane parallel to the first common plane; and
a plurality of second vias each disposed in the separate first metallization layer among the plurality of first metallization layers, and each configured to couple adjacent second metal interconnects among the plurality of second metal interconnects in adjacent first metallization layers among the plurality of first metallization layers; and
a second antenna feed line coupled to the second patch antenna.

31. The package substrate of claim 30, wherein:
the first patch antenna has first antenna radiation pattern extending in a first horizontal direction away from the package substrate; and
the second patch antenna has second antenna radiation pattern extending in a second horizontal direction opposite the first horizontal direction away from the package substrate.

32. The package substrate of claim 30, further comprising a third patch antenna, comprising:
at least one fifth metal interconnect disposed in a third plane in the first direction in a first metallization layer among the plurality of first metallization layers; and
a third antenna feed line coupled to the third patch antenna.

33. The package substrate of claim 30, wherein:
the first patch antenna has first antenna radiation pattern extending in a first horizontal direction away from the package substrate;
the second patch antenna has second antenna radiation pattern extending in a second horizontal direction opposite the first horizontal direction away from the package substrate; and
the third patch antenna has a third antenna radiation pattern extending in the second direction orthogonal to the first horizontal direction and the second horizontal direction.

* * * * *